United States Patent [19]

Yamauchi

[11] Patent Number: 5,696,722
[45] Date of Patent: *Dec. 9, 1997

[54] LEVEL-SHIFTER, SEMICONDUCTOR INTEGRATED CIRCUIT, AND CONTROL METHODS THEREOF

[75] Inventor: Hiroyuki Yamauchi, Osaka, Japan

[73] Assignee: Matsushita Electric Industrial Co., Ltd., Osaka, Japan

[*] Notice: The term of this patent shall not extend beyond the expiration date of Pat. No. 5,581,506.

[21] Appl. No.: 700,940

[22] Filed: Aug. 21, 1996

Related U.S. Application Data

[63] Continuation of Ser. No. 382,530, Feb. 2, 1995, Pat. No. 5,581,506.

[30] Foreign Application Priority Data

Jun. 3, 1994 [JP] Japan .................................. 6-122620

[51] Int. Cl.$^6$ .................................................. G11C 7/00
[52] U.S. Cl. .......................... 365/189.11; 365/203; 326/62
[58] Field of Search ........................ 365/189.11, 230.06, 365/203; 326/62, 63, 80

[56] References Cited

U.S. PATENT DOCUMENTS 4,878,201  10/1989  Nakaizumi ........................ 365/203
5,317,206  5/1994  Hanibuchi et al. ............... 326/62 X
5,581,506  12/1996  Yamauchi ........................ 365/189.11

*Primary Examiner*—Joseph A. Popek
*Attorney, Agent, or Firm*—McDermott, Will & Emery

[57] ABSTRACT

During a period corresponding to the former half of one cycle of a clock signal, a capacitor is charged to an intermediate potential between the respective precharged potentials of two level-shifters. Subsequently, during a period corresponding to the latter half of one cycle of the clock signal, the capacitor is connected to that one of the output nodes which shifts to a lower potential in the level-shifter on the upper stage, while a power source line is connected to the other output node which shifts to a higher potential. On the other hand, the capacitor is also connected to that one of the output nodes which shifts to the higher potential in the level-shifter on the lower stage, while the ground line is connected to the other output node which shifts to the lower potential. Consequently, there can be provided a semiconductor integrated circuit free from power dissipation that might have been caused by an internal power-source circuit. The semiconductor integrated circuit enables data transfer with a small amplitude and consumes an extremely small amount of current even when multi-bit data lines operate in parallel.

22 Claims, 55 Drawing Sheets

$$V_M : \frac{1}{2}(V_{CC} - V_{SS})$$

$$V_M : \frac{1}{2}(V_{CC} - V_{SS})$$

$$V_U : \frac{3}{4}(V_{cc} - V_{ss})$$

$$V_c : \frac{2}{4}(V_{cc} - V_{ss})$$

$$V_L : \frac{1}{4}(V_{cc} - V_{ss})$$

$$V_M : \frac{1}{2}(V_H - V_L)$$

$I_1 = I_2 = I_3$ $R_c$ : CIRCUIT RESISTANCE IN ON-STAGE OF THE CIRCUIT

| EQ | IDi | XIDi | Di | XDi |
|---|---|---|---|---|
| ON | 0 | 0 | Di = XDi  H, L : Open | |
| OFF | 1 | 0 | H | L |
| | 0 | 1 | L | H |

$V_U : \frac{3}{4}(V_{CC} - V_{SS})$ $V_C : \frac{2}{4}(V_{CC} - V_{SS})$ $V_L : \frac{1}{4}(V_{CC} - V_{SS})$

LEVEL-SHIFTER, SEMICONDUCTOR INTEGRATED CIRCUIT, AND CONTROL METHODS THEREOF

This is a continuation of application Ser. No. 08/382,530, filed Feb. 2, 1995, now U.S. Pat. No. 5,581,506.

BACKGROUND OF THE INVENTION

The present invention relates to an improved level-shifter for use in a memory circuit in which a large number of data lines operate in parallel in synchronization with a clock signal on a semiconductor chip, such as an image memory, a synchronous dynamic random-access memory (SDRAM), or a static random-access memory (SRAM) or in a microprocessor for performing parallel data processing, to a semiconductor integrated circuit using the improved level-shifter, and to control methods thereof.

A conventional level-shifter for shifting the amplitude level of an input signal so as to produce an output signal of a different amplitude level is disclosed in Japanese Laid-Open Patent Publication No. 4-211515 (by Nakagome et al. of Hitachi Ltd.). Below, a description will be given to the above prior art with reference to FIGS. 27 and 28.

FIG. 27(a) shows a clock-synchronization-type level-shifter and FIG. 27(b) illustrates the operation thereof. In FIG. 27(a) are shown: synchronizing signals CLK(3) and XCLK(2) (clock signals); an input signal Vin(11) prior to level shifting; a High level power source VH(90) after level shifting; a Low level power source VL(91) after level shifting; and a precharge power source VM(9) having an intermediate power-source potential between the above High level potential VH and Low level potential VL.

Next, the operation of the level-shifter will be described with reference to FIG. 27(b). When a PMOSFET(5) and an NMOSFET(6) are turned ON controlled by the clock signals CLK and XCLK, inverting operation is enabled so that the input Vin(11) is inverted and fetched. For example, if the Vin (11) is on the level of the power-source potential Vcc, the output has a Low level value represented by VL(91). Subsequently, when the above clock signals CLK and XCLK are inverted, the above PMOSFET(5) and NMOSFET(6) are turned OFF, while a PMOSFET(12) and an NMOSFET(9) are turned ON, so that the output is connected to the above precharge power source VM(9) and precharged to the intermediate potential. If the foregoing operation, forming one cycle, is repeatedly performed afterwards, the above input Vin(11) is inverted in every cycle and the output is also inverted. In the foregoing operation, variations in output level become (VH-VM) and (VM-VL), which are smaller than a variation in input level of (Vcc-Vss). Briefly, the amount of charge required for charging or discharging the parasitic capacitance CD(10) of the output node Vout is satisfactorily reduced. Since the amount of charge is determined by the product of a variation in the potential of the capacitance and the capacitance value, if the ratio of the amplitude level of an input to that of the output becomes 1/10, e.g., due to the level-shifter, the amount of charge required for charging and discharging the above output node also becomes 1/10. Compared with the case where level shifting is not performed, a reduction in power consumption by one order of magnitude can be achieved.

Next, a generator of the above power sources VH(90) and VL(91) which have been shifted in level is shown in FIG. 28. The generator is disposed on the same chip as the PMOSFET(6) and the like are disposed. As shown in the drawing, the generator has typically adopted a system for controlling the output transistor of a power-source circuit by a current-mirror-type output in which the potential obtained through resistance division by means of resistors R1, R2, and R3 is used as a reference potential. The voltage levels of the power sources VH(90) and VL(91) can arbitrarily be determined by adjusting the ratio among the above resistances R1, R2, and R3.

In the above internal power-source circuit shown in FIG. 28, however, it is necessary to supply a power-source current at low resistance to a driver for driving a line with a large capacitance. Accordingly, the above current mirror and output transistor increase in size so that the resistors R1, R2, R3, and R4 for generating the reference potential cannot be composed of resistors with high resistance values. As a result, the total sum of through currents IDC1 and IDC2 is increased to the order of several milliamperes, so that the disadvantage of uselessly increased power consumption is caused.

If the above conventional disadvantage is considered in terms of power consumption, the power consumption of the level-shifter in FIG. 27 becomes Ptoal=P1+P2. Here, the P2 is determined by the product of the current consumed in driving the wiring capacitance with an amplitude after level shifting and an amplitude voltage after level shifting. On the other hand, the above P1 represents the power consumed uselessly by the internal power-source circuit when it reduces voltage in generating the internal voltages VH and VL. The power consumption P1 is determined by the product of the current consumed in driving the wiring capacitance with the amplitude after level shifting and the amount of voltage (Vcc−VH+VL) reduced by the above internal power-source circuit. If the amount of the reduced voltage is large, i.e., if the output amplitude value is to be set smaller, the useless power consumption P2 is further increased.

Moreover, since 64-bit data lines, 128-bit data lines, or 256-bit data lines operate in parallel on the same chip in an image memory or the like, power consumption amounts to the value obtained by multiplying the above-mentioned power consumption by the number of bits, which is considerably large as a whole.

In the level-shifter shown in FIG. 27(a), the delay time between the change in the input Vin(11) caused in synchronization with the clock signal and the production of the output is represented by td1 shown in FIG. 27(b). The delay time td1 is primarily determined by the time required by the input to become lower and higher than the above power-source potentials VH(90) and VL(91) by the threshold voltages of the above PMOSFET(4) and NMOSFET(7), respectively. The power-source potentials VH(90) and VL(91) are the source potentials of the above PMOSFET(4) and NMOSFET(7) serving as the input gates. However, if the value of the power-source potential VH(90) is further reduced and the value of the power-source potential VL(91) is further increased in order to further reduce the output amplitude, the above PMOSFET(4) and NMOSFET(7) are turned ON only when the input approaches the lower potential Vss or the higher potential Vcc furthermore. Consequently, the delay time td1 is disadvantageously increased.

To prevent power dissipation due to the above internal power-source circuit, Japanese Laid-Open Patent Publication No. 4-302463 (by Takashima et el. of Toshiba Corporation) discloses a technique as illustrated in FIG. 29(a). With the technique, circuits 500 each showing an identical power-source current varying characteristic with respect to elapsed time, i.e., circuits 500 each having the same resistance in the ON state are connected in series between the power source Vcc and the ground line Vss so that the terminal voltage placed effectively on each of the circuits becomes half the power-source voltage Vcc. In other words, by connecting in series the circuits having equal power-source currents at each point of elapsed time as shown in FIGS. 29(a) and 29(b), i.e., by connecting in series the circuits having equal internal resistances in the ON state, each of the circuits 500 causes a voltage drop, while performing its intrinsic circuit operation, thereby performing the same function as performed by the above first conventional internal power-source circuit.

However, the above prior art of FIG. 29 is disadvantageous in that, if the power-source currents for the respective circuits are not equal at each point of elapsed time, the voltage determined by resistive division varies, so that the effective terminal voltages of the respective circuits vary. Moreover, since the power-source current for each of the circuits should be supplied by the ground current of its one-stage upper circuit, the current cannot be reused if the condition as shown in FIG. 29(b) is not satisfied, i.e., if the power-source currents I1 and I2 and ground currents I1X and I2X of the respective circuits 500 are not equal at each point of elapsed time. If a consideration is given to the sense amplifying operation of simultaneously restoring the potentials of individual bit lines which consume a large current in a DRAM, e.g., transistors with different functions are generally varied in size and in wiring resistance so that a time difference is automatically produced between charging operation accompanied by the flow of the power-source current and discharging operation accompanied by the flow of the ground current, thus preventing through currents from the power sources of the respective circuits to the ground. Therefore, it is impossible to equalize the charging currents and discharging currents of the respective circuits at each point of elapsed time without increasing the through currents. To cause the upper-stage and lower-stage circuits 500 to operate identically, it is necessary to supply a current from an additional circuit to the lower-stage circuit 500. Hence, it can be concluded that the prior art is still disadvantageous in that it uselessly consumes more current than is needed to drive the wiring capacitance.

SUMMARY OF THE INVENTION

An object of the present invention is to implement the higher-speed operation of level-shifters with lower power consumption, irrespective of the number of the level-shifters to be operated simultaneously. The level-shifter consumes only the current required to drive the wiring capacitance on the output side thereof at a high speed so that, unlike the prior art, useless power consumption is eliminated.

To attain the above object, the present invention has adopted a structure in which a charge is accumulated by means of a capacitor or the like so that the accumulated charge is reused for a potential change at the output nodes of the level-shifter, thereby eliminating useless consumption of power as consumed conventionally.

In a specific structure, the level-shifter of the present invention receives an input signal switching between two different values, while operating in synchronization with a clock signal, and shifts the amplitude value of the above input signal to another amplitude value so that the resulting signal is outputted from a single output node, the above level-shifter comprising: a first charge supplying means to be precharged to a first potential; a second charge supplying means to be precharged to a second potential which is different from the above first potential; and a discharging means for selecting either one of the above charge supplying means in accordance with the above input signal and releasing the charge accumulated in the selected charge supplying means to the above output node.

In another specific structure, the level-shifter of the present invention receives an input signal switching between two different values, while operating in synchronization with a clock signal, and shifts the amplitude value of the above input signal to another amplitude value so that the resulting signal is outputted from a pair of output nodes, the above level-shifter comprising: a first charge supplying means to be precharged to a first potential; a second charge supplying means to be precharged to a second potential which is different from the above first potential; and a discharging means for releasing, in accordance with the above input signal, the charge accumulated in the above first charge supplying means to either one of the above pair of output nodes, while releasing the charge accumulated in the above second charge supplying means to the other output node.

Furthermore, the present invention is constituted so that the above charge supplying means is specified, the charge supplying means is composed of a capacitor, and the capacitance value of the above capacitor is determined so that the ratio of the capacitance value to the parasitic capacitance value of the output node becomes equal to the ratio of the difference between a desired potential at the output node and the second potential, which is the precharged potential at the above output node, to the difference between the first potential, which is the precharged potential in the above capacitor, and the above potential at the output node.

Additionally, in a specific structure, a semiconductor integrated circuit of the present invention has a plurality of level-shifters each of which receives an input signal switching between two different values, while operating in synchronization with a clock signal, and shifts the amplitude value of the above input signal to another amplitude value so that the resulting signal is outputted from an output node, the above semiconductor integrated circuit comprising: a charge variation equalizing means for causing any two of the above level-shifters to present charge variations in which charges move in the opposite directions at the output nodes and the charges have equal absolute values with respect to elapsed time; and a charge redistributing means for causing the charges to move between the above two level-shifters which present equal charge variations.

The present invention is also constituted so that the charge variation equalizing means consists of a precharging means for precharging two output nodes having substantially equal parasitic capacitance values to equal potentials, a charge accumulating means for accumulating a charge, and a charging means for charging the above charge accumulating means to a potential different from the above specified potential.

Furthermore, a method of controlling a semiconductor integrated circuit of the present invention comprises the steps of: during a first period of one cycle of the clock signal, precharging the two output nodes in each of the level-shifters to equal potentials; during a second period of one cycle of the above clock signal, charging each of the respective charge accumulating means for the two level-shifters between which the charge is redistributed to a specified potential between the two precharged potentials of the above two level-shifters between which the charge is redistributed and during a third period after the above first and second periods of one cycle of the above clock signal, subsequently connecting one of the respective charge accumulating means of the above two level-shifters between which the charge is redistributed to that one of the output nodes which shifts to the higher potential in one of the above two level-shifters between which the charge is redistributed, while connecting the other charge accumulating means to that one of the output nodes which shifts to the lower potential in the other level-shifter.

With the above structures, in the level-shifter of the present invention, a charge is accumulated in the charge supplying means so that the accumulated charge is released to the output node, thereby varying the potential at the output node.

In this case, if the capacitance value of the charge supplying means (capacitor) equals to 1/10 of the parasitic capacitance value of the output node in the level-shifter, the output amplitude value at the output node is shifted in level to 1/10 of the input amplitude value.

Since the operation of the level-shifter is performed by discharging the charge supplying means, it is no more necessary to provide an internal power-source circuit as in a conventional embodiment, so that the current consumed uselessly by a through current is not increased.

Moreover, in the two level-shifters connected in series of the present invention, the charge released by the output node which shifts to the lower potential in one level-shifter is reused to raise the potential at the output node which shifts to the higher potential in the other level-shifter, so that a further reduction in power consumption can be achieved accordingly.

Furthermore, according to the present invention, the charge released by that one of the output nodes which shifts to the lower potential is accumulated in the charge accumulating means, so that the accumulated charge is reused to raise the potential of that one of the output nodes which shifts to the higher potential.

The above objects and novel features of the present invention will be more apparent from the reading of the following description in conjunction with the accompanying drawings.

BRIEF DESCRIPTION OF THE DRAWINGS

The accompanying drawings illustrate the preferred embodiments of the present invention.

In the drawings.

DETAILED DESCRIPTION OF THE PREFERRED EMBODIMENTS

Below, the preferred embodiments of the present invention will be described with reference to the accompanying drawings.

(First Embodiment)

Figure 1:
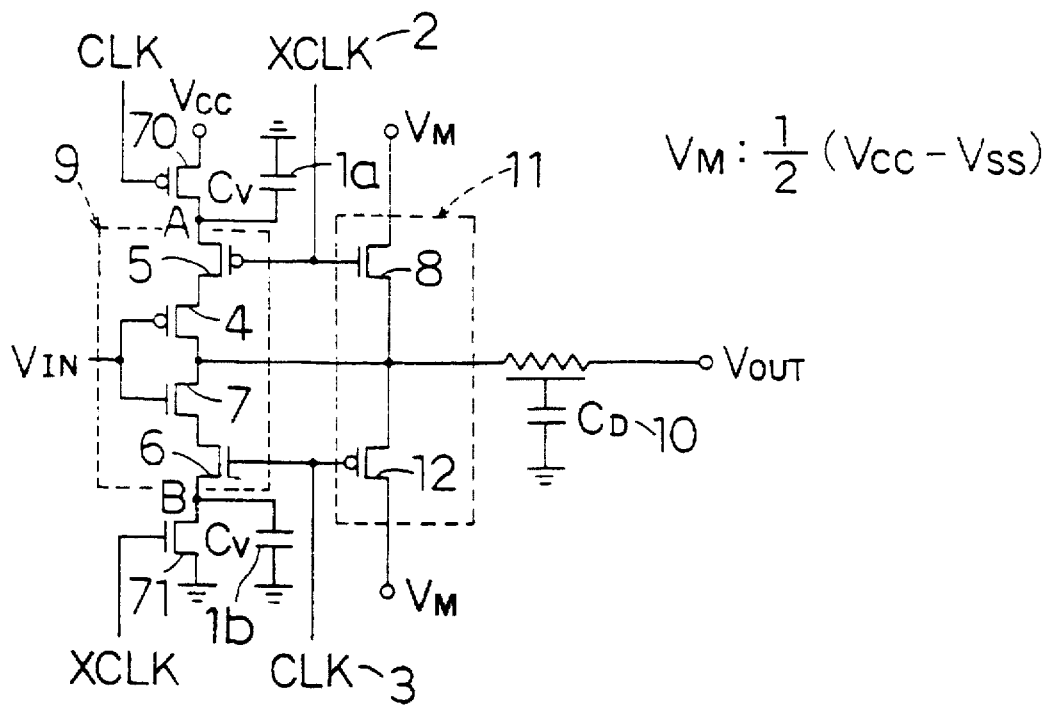
FIG. 1 is a view showing a level-shifter of a first embodiment.

FIG. 1 is a schematic view of a circuit according to a first embodiment of the present embodiment. FIG. 1 shows an inverter-type level-shifter which operates in synchronization with a clock signal. In the drawing, Vin represents an input, Vout represents an output node, reference numerals 2 and 3 designate a complementary pair of clock signals CLK and KCLK, respectively, Vcc represents an external power-source line on the higher potential side, Vss represents a power-source line on the lower potential side composed of an earth line, VM represents a power-source line of an intermediate potential ((Vcc-Vss)/2) between the above higher potential Vcc and lower potential Vss.

A reference numeral 1a designates a first capacitor which functions as a first charge supplying means for releasing the accumulated charge and a reference numeral 1b designates a second capacitor which functions as a second charge supplying means for releasing the accumulated charge, similarly to the first capacitor 1a.

A reference numeral 9 designates a discharging means consisting of two PMOSFETs 4 and 5 and two NMOSFETs 6 and 7. A reference numeral 11 designates a precharge circuit composed of one NMOSFET 8 and one PMOSFET 12. Reference numerals 70 and 71 designate a PMOSFET and an NMOSFET, respectively, which connect the power-source lines Vcc and Vss to the corresponding capacitors 1a and 1b in the ON state so that they are charged.

The capacitance values CV of the above two capacitors 1a and 1b are equal to each other. The ratio of the capacitance value CV to the parasitic capacitance value of the output node Vout is set equal to the ratio of the difference between a desired potential at the output node Vout and the pre-charged potential (Vcc/2) at the above output node Vout to the difference between the first potentials (Vcc (e.g., 3.0 V) and Vss (0 V)), which are the precharged potentials in the above capacitors 1a and 1b, and the above desired potential at the output node Vout. For example, if the parasitic capacitance of the output is 3 pF, the capacitance value CV of the capacitor is 0.3 pF.

Next, a description will be given to a control method of the above level-shifter of FIG. 1 with reference to FIG. 2.

Figure 2:
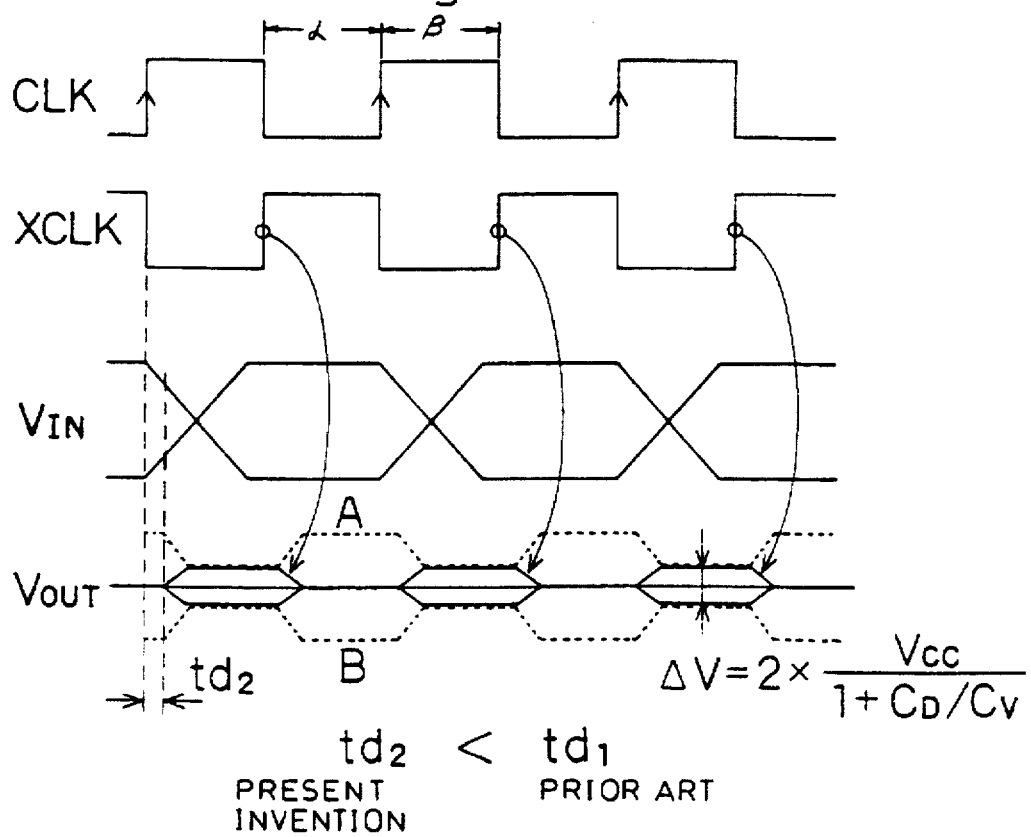
FIG. 2 is a view illustrating the operation of the level-shifter of the first embodiment.

The input Vin is a signal switched between different two values as shown in FIG. 2. The PMOSFET 4 and NMOSFET 7 are controlled by the input Vin. The other PMOSFETs 5, 12, and 70 are controlled by the clock signal CLK(3) shown in FIG. 2, while the other NMOSFETs 6, 8, and 71 are controlled by the inverted clock signal XCLK(2) shown in FIG. 2.

That is, as shown in FIG. 2, during a period α (first period) corresponding to a half of one cycle of the clock signal CLK(3), the power-source line VM of the intermediate potential is connected by the two MOSFETs 8 and 12 of the precharge circuit 11 to the output node Vout so that the output node Vout is precharged to the intermediate potential. During the period 5, furthermore, the PMOSFET 5 and NMOSFET 6 of the discharging means 9 are turned OFF, while the PMOSFET 70 and NMOSFET 71 are turned ON, thereby connecting the external power-source line Vcc on the higher potential side to the first capacitor 1a so that it is charged to the higher potential and connecting the external power-source line Vss on the lower potential side to the second capacitor 1b so that it is charged to the lower potential. The charging of the capacitors 1a and 1b is conducted during the above period α (coincident with the first period), but it may also be conducted during a period (second period) different from the period during which the above output node is precharged, provided that it is conducted at a stage before the charges accumulated therein are outputted to the output nodes Vout and XVout.

Subsequently, during a period β (third period) corresponding to the other half of one cycle of the above clock signal CLK(3) after the period a, the precharging operation by the precharge circuit 11 is halted, while the above PMOSFET 70 and NMOSFET 71 are turned OFF, thereby halting the charging of the capacitors 1a and 1b. At the same time, the PMOSFET 5 and NMOSFET 6 of the above discharge circuit 9 are turned ON. In the discharge circuit 9, either of the PMOSFET 5 and NMOSFET 6 is turned ON in accordance with the input Vin, so that the charge accumulated in either of the capacitors 1a and 1b is released to the output node Vout via the discharge circuit 9.

Thus, in the present embodiment, the voltage level at the output node Vout is reduced to have a small amplitude by redistributing the charge from the capacitors 1a and 1b with no power dissipation. Consequently, it is no more necessary to provide a low power-source voltage inside the chip, which has been necessary in a conventional embodiment, so that an increase in consumed current due to a through current in the case where an internal power-source circuit is added and consumption of extra power due to a voltage drop in the internal power-source circuit can be prevented.

Moreover, since the above capacitors 1a and 1b maintain the source voltages of the input MOSFETs 4 and 7 at a high value in the vicinity of the power-source voltage Vcc on the High side and at a low value in the vicinity of the ground voltage Vss on the Low side in the early period of operation, the above input MOSFETs 4 and 7 are effectively turned ON with ease. Consequently, the delay time td1 in the case of obtaining the output of small amplitude is no more increased as in the conventional embodiment, so that it can be concluded that the present embodiment has the effect of reducing the delay time td2.

(Second Embodiment)

Next, a second embodiment of the present invention will be described with reference to FIG. 3.

The present embodiment shows an application of the level-shifter which receives a complementary pair of inputs and produces a complementary pair of outputs. In FIG. 3, Vin and XVin represent the complementary pair of inputs and Vout and XVout represent the complementary pair of output nodes. A reference numeral 9' designates a discharging means consisting of two NMOSFETs 13 disposed on the input side and two PMOSFETs 14. A reference numeral 11' designates a precharging means composed of a PMOSFET 17 disposed on the output side. A reference numeral 11' designates a precharging means composed of a PMOSFET 17 disposed on the output side. Reference numerals 1a and 1b designate capacitors serving as charge supplying means, similarly to the above first embodiment. Reference numerals 19 and 20 designate an NMOSFET and a PMOSFET, respectively, while Vc represents a power-source line of a specified potential and Vs represents a power-source line of another specified potential lower than that of the above power-source line Vc. The power-source line Vs is composed of an earth line. The above capacitor 1a is charged to the potential of the power-source line Vc. The capacitor 1b is charged to the potential of the power-source line Vs.

The two NMOSFETs 13 of the above discharging means 9' are capable of releasing the charge in the capacitor 1a to the complementary pair of output nodes Vout and XVout. The above two PMOSFET 14 are capable of releasing the charge in the capacitor 1b to the complementary pair of output nodes Vout and XVout. The PMOSFET 17 of the above precharging means 11' precharges the complementary pair of output nodes Vout and XVout to the same potential by short-circuiting them.

The above capacitors 1a and 1b have the same capacitance value CV. The capacitance value CV is set by equalizing the parasitic capacitance values of the above respective output nodes Vout and XVout so that the ratio of the capacitance value CV to the parasitic capacitance value of each of the above output nodes Vout and XVout becomes equal to the ratio of the desired output amplitude value of each of the output nodes Vout and XVout to the difference between each of the potentials for charging the above capacitors 1a and 1b and the precharged potential at the output nodes Vout and XVout.

Next, a description will be given to a control method of the level-shifter of FIG. 3. Either one of the two NMOSFETs 13 on the input side of the discharge circuit 9' and either one of the two PMOSFETs 14 are controlled by either one of the complementary pair of inputs Vin and XVin, while the other NMOSFET 13 and the other PMOSFET 14 are controlled by the other of the complementary pair of inputs Vin and XVin. The PMOSFET 17 of the precharge circuit 11' and the PMOSFET 20 are controlled by the clock signal CLK, while the NMOSFET 19 is controlled by the inverted clock signal XCLK. The above complementary pair of clock signals CLK and KCLK and the complementary pair of inputs Vin and XVin are shown in FIG. 5.

Subsequently, a description will be given to the operation of the above level-shifter of FIG. 3 with reference to FIG. 5.

Figure 5:
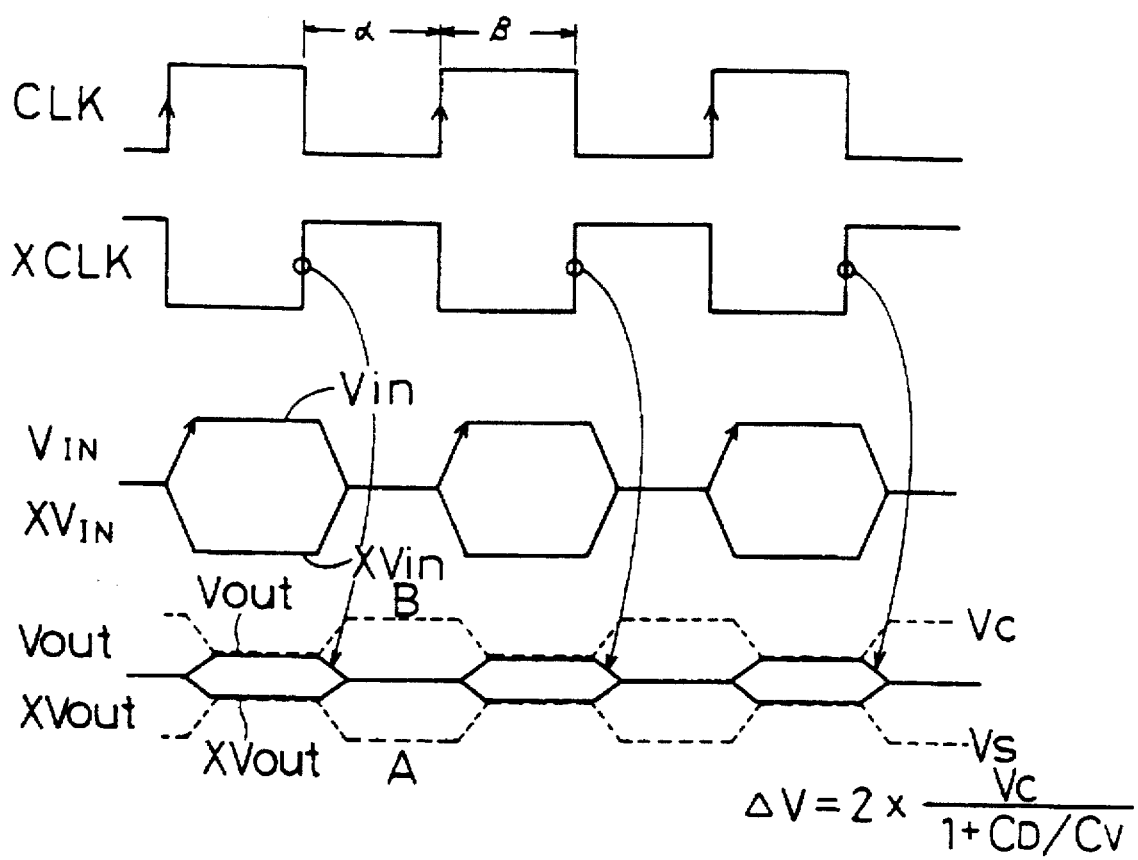
FIG. 5 is a view illustrating the operation of the level-shifter of the second embodiment.

In FIG. 5, during the period α corresponding to the former half of one cycle of the clock signal, i.e., during the period during which the complementary pair of inputs Vin and XVin have equal values, the PMOSFET 17 of the precharge circuit 11' is turned ON so that the complementary pair of output nodes Vout and XVout are short-circuited and precharged to equal potentials. During the period α, furthermore, the four MOSFETs 13 and 14 of the discharge circuit 9' are turned OFF, while the NMOSFET 19 and PMOSFET 20 are turned ON, so that the capacitor 1a is charged to the lower potential of the power-source line Vs on the lower potential side and the capacitor 1b is charged to the higher potential of the power-source line Vc on the higher potential side.

Next, during the period β corresponding to the latter half of one cycle of the clock signal, i.e., during the period during which a specified potential difference appears between the complementary pair of inputs Vin and XVin, the PMOSFET 17 of the precharge circuit 11', the NMOSFET 19, and the PMOSFET 20 are turned OFF, while the upper NMOSFET 13 and lower PMOSFET 14 of the discharge circuit 9' are turned ON, so that the charge in the capacitor 1a charged to the lower potential is released to the output node Vout and the charge in the capacitor 1b charged to the higher potential is released to the output node XVout. As a result, the outputs with the following potential difference (amplitude value) ΔV therebetween are observed at the complementary pair of output nodes Vout and XVout:

$$\Delta V = 2 \times V_{cc} \; (1 + CD/CV)$$

where CD represents the parasitic capacitance value of each of the complementary pair of output nodes Vout and XVout.

Thus, in the present embodiment also, the voltage level of the complementary pair of output nodes Vout and XVout is reduced to have a small amplitude by redistributing the charge from the capacitors 1a and 1b with no power dissipation, similarly to the above first embodiment. Consequently, an increase in consumed current due to a through current in the conventional case where the low power-source voltage is provided inside the chip or consumption of extra power due to a voltage drop in the internal power-source circuit can be prevented.

(First Variation of Second Embodiment)

Figure 3:
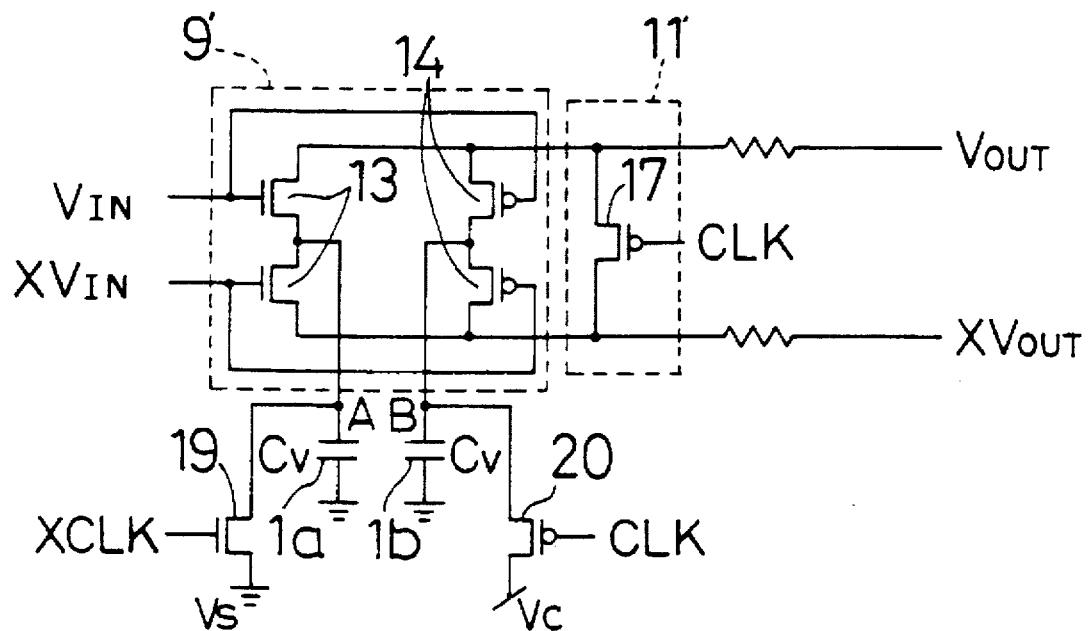
FIG. 3 is a view showing a level-shifter of a second embodiment.
Figure 4:
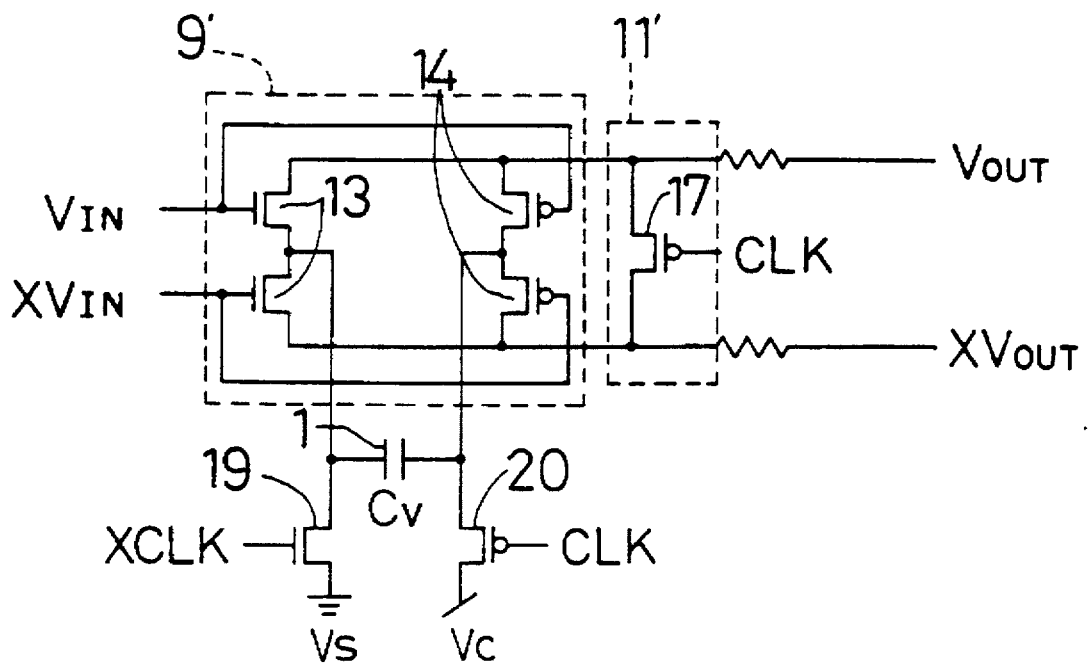
FIG. 4 is a view showing a variation of the level-shifter of the second embodiment.

FIG. 4 shows a level-shifter which is a variation of the level-shifter of FIG. 3. The level-shifter of FIG. 4 is different from the level-shifter of FIG. 3 in that a single capacitor 1 is provided, instead of the capacitor 1a charged to the lower potential and the capacitor 1b charged to the higher potential.

In the capacitor 1, one of a pair of plate electrodes is charged to the higher potential of the power-source line Vc, while the other plate electrode is charged to the lower potential of the power-source line Vs, so that, during the period β during which the specified potential difference appears between the above complementary pair of inputs Vin and XVin, the pair of plate electrodes are connected to the complementary pair of output nodes Vout and XVout, respectively.

Compared with the above second embodiment, the number of capacitors used in the present variation can be reduced from two to one, so that the effect of halving the layout area occupied by the capacitor can be achieved.

(Second Variation of Second Embodiment)

Figure 6:
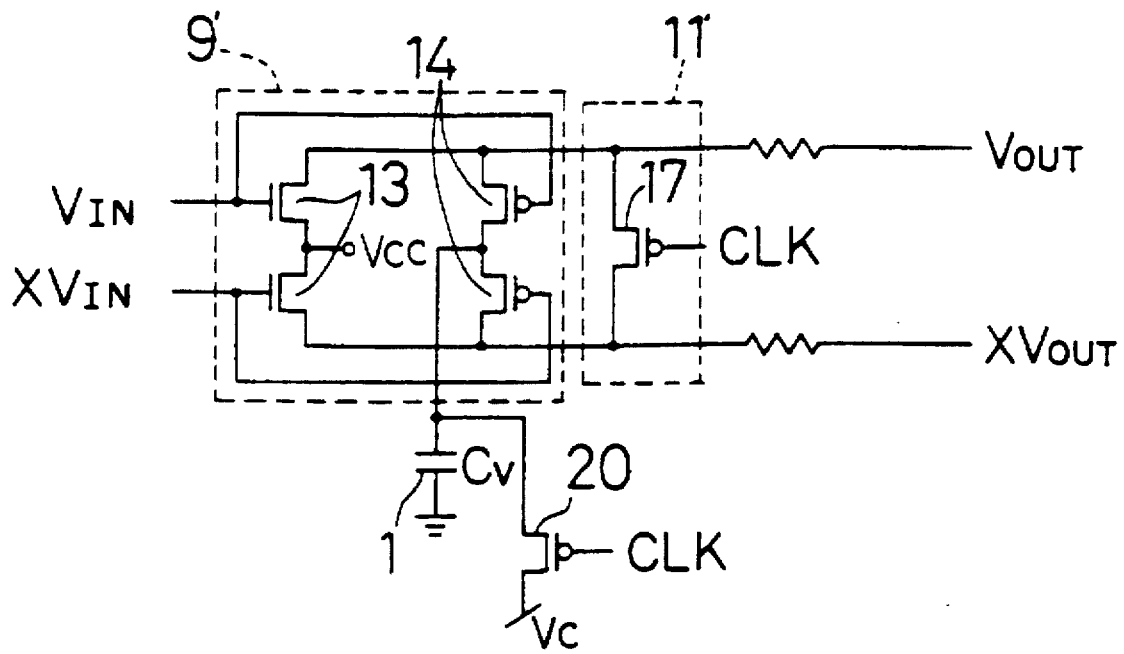
FIG. 6(a) shows another variation of the level-shifter of the second embodiment, in which another charge supplying means is composed of a power-source line of a higher potential.
FIG. 6(b) shows still another variation of the level-shifter of the second embodiment, in which another charge supplying means is composed of a power-source line of a lower potential.
Figure 6:
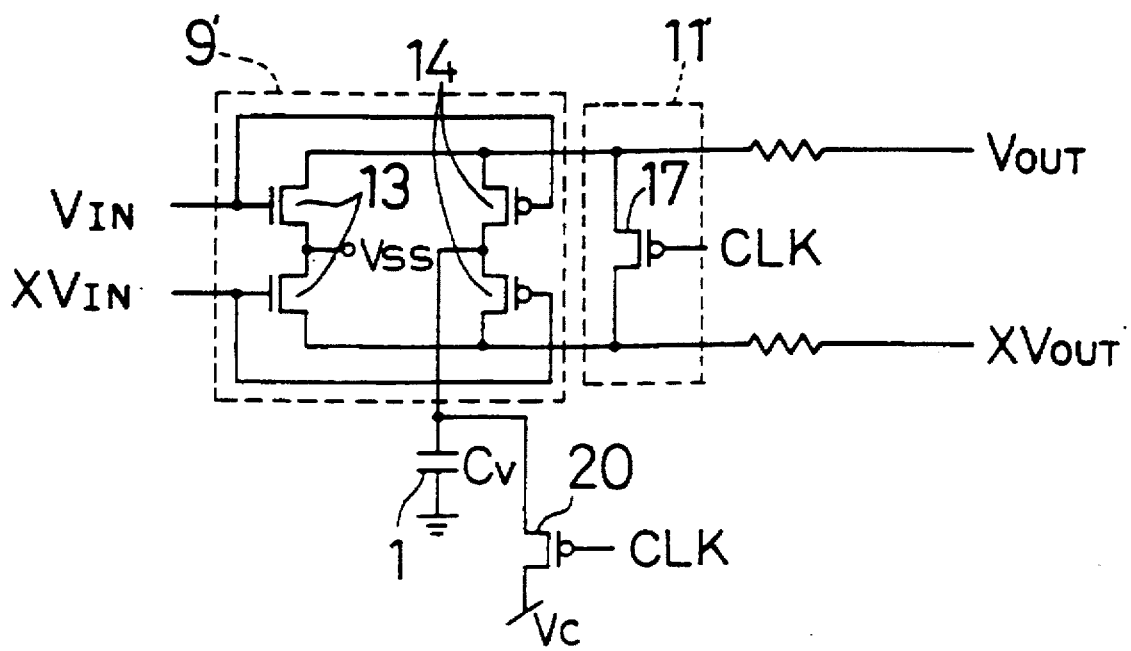

FIGS. 6(a) and 6(b) show a second variation of the above level-shifter of FIG. 3. The level-shifter of FIGS. 6(a) and 6(b) is different from the above level-shifter of FIG. 3 in that a single capacitor 1 (charge supplying means) is provided, instead of the two capacitors 1a and 1b as charge supplying means. Another charge supplying means is composed of the power-source line Vcc of the higher potential in FIG. 6(a), though it is composed of the power-source line Vss of the lower potential in FIG. 6(b). The level-shifter in the present variation is constituted so that, if either one of the two NMOSFETs 13 of the discharging means 9' is turned ON in response to the input Vin or XVin, the charge on the above power-source line Vcc of the higher potential and the charge on the above power-source line Vss of the lower potential are released individually to the complementary pair of outputs Vout and XVout via the above NMOSFET 13 that has been turned ON. As for the other structure, it is the same as that of the level-shifter of FIG. 3, so that the description thereof will be omitted.

(Third Embodiment)

Figure 7:
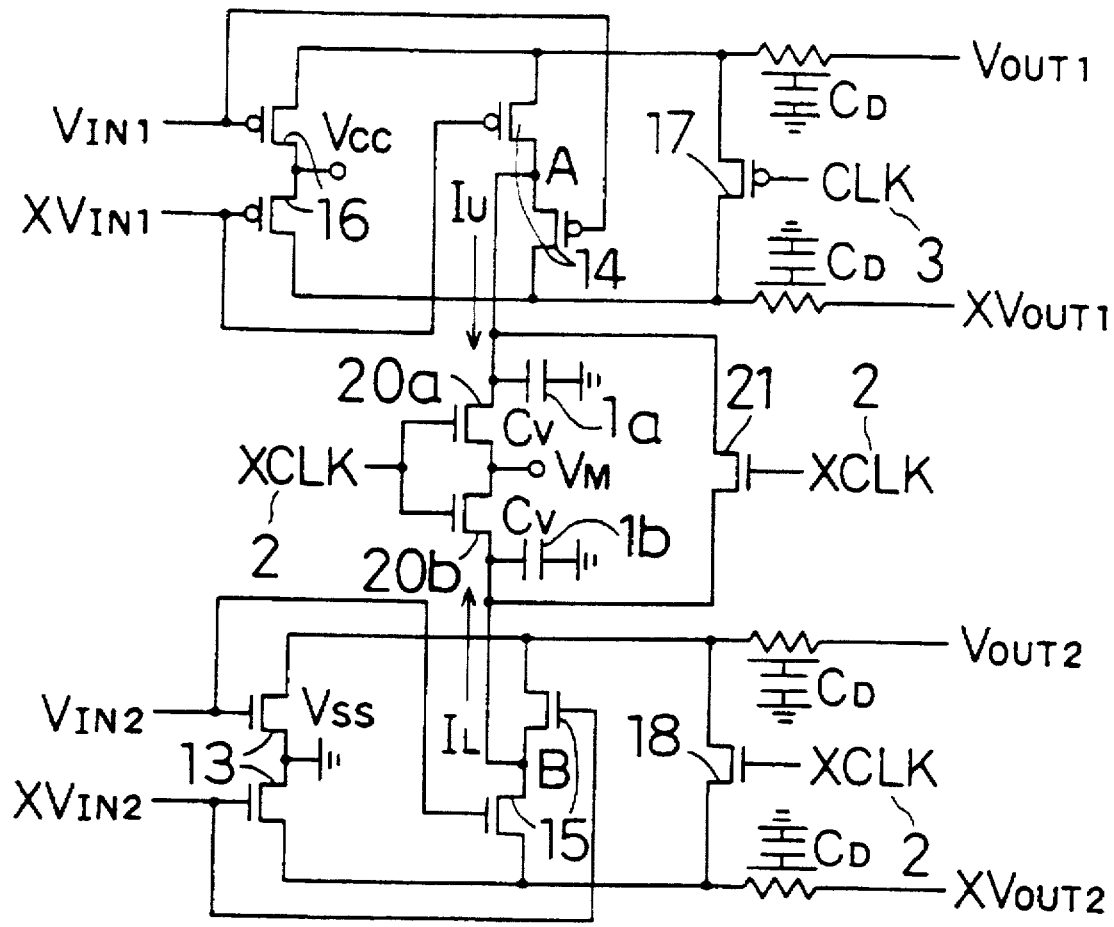
FIG. 7 is a view showing a semiconductor integrated circuit of a third embodiment.

FIG. 7 shows a semiconductor integrated circuit according to a third embodiment of the present invention, in which the above complementary-type level-shifter of FIG. 6(a) is placed on the upper stage and the complementary-type level-shifter of FIG. 6(b) is placed on the lower stage. In the above level-shifter on the upper stage, two input gate MOSFETs 16 consist of PMOSFETs. In the above level-shifter on the lower stage, two MOSFETs 15 consist of NMOSFETs. The MOSFET 18 constituting the precharge circuit is composed of an NMOSFET.

The capacitors 1a and 1b are connected to the power-source line VM of the intermediate potential via the NMOSFETs 20a and 20b, respectively. The intermediate potential on the power-source line VM is between the higher potential on the power-source line Vcc and the lower potential on the power-source line Vss (VM=(Vcc−Vss)/2). The above two NMOSFETs 20a and 20b are controlled by the inverted clock signal KCLK. In the drawing, a reference numeral 21 designates an NMOSFET for equalizing the potentials of the two capacitors 1a and 1b, which is also controlled by the inverted clock signal XCLK.

As for the other structure, it is the same as that of the structures shown in FIG. 6(a) and 6(b), so that the description thereof will be omitted by providing like reference numerals.

Next, a description will be given to a control method of the above semiconductor integrated circuit.

Figure 8:
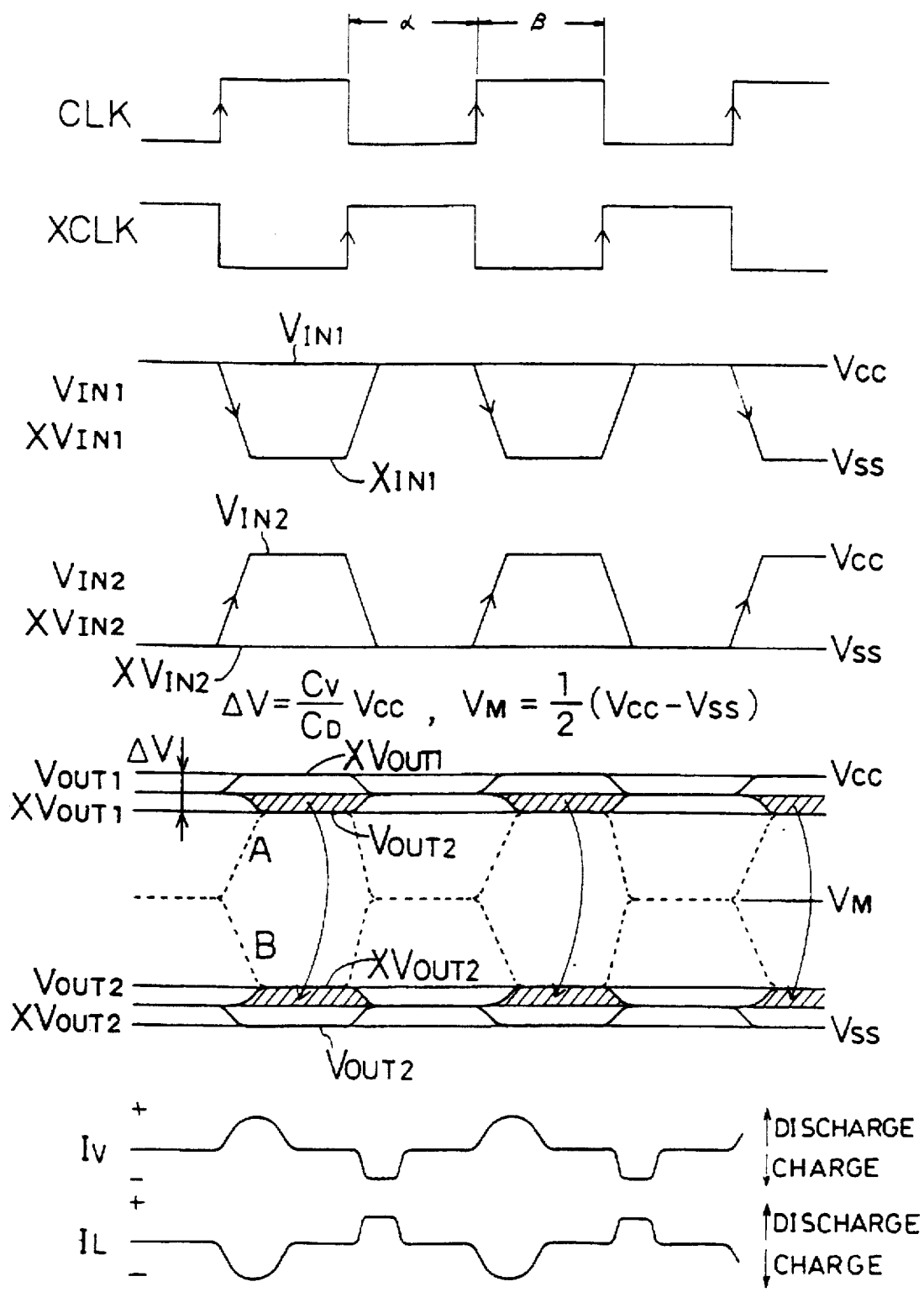
FIG. 8 is a view illustrating the operation of the semiconductor integrated circuit of the third embodiment.

As shown in FIG. 8, a complementary pair of inputs Xin1 to the level-shifter on the upper stage have sufficient potentials to turn ON the input gate PMOSFET 16 and turn OFF the input gate PMOSFET 14 completely, while a complementary pair of inputs Vin2 and XVin2 to the level-shifter on the lower stage have sufficient potentials to turn ON the input gate PMOSFET 13 and turn OFF the input gate PMOSFET 15 completely.

As shown in FIG. 8, during the period α corresponding to the former half of one cycle of the clock signal, i.e., during the period during which the complementary pairs of inputs have equal values, a complementary pair of output nodes Vout1 and XVout1 of the level-shifter on the upper stage and a complementary pair of output nodes Vout2 and XVout2 of the level-shifter on the lower stage are equalized by turning ON the PMOSFET 17 and by turning ON of the PMOSFET 18, respectively. During the period α, furthermore, the turning ON of the two NMOSFETs 20a and 20b causes the capacitors 1a and 1b to be precharged to the intermediate potential by means of the power-source line VM of the intermediate potential.

Subsequently, during the period β corresponding to the latter half of one cycle of the clock signal, i.e., during the period during which a potential difference is produced between each complementary pair of inputs so that the input XVin1, e.g., is reduced to the lower potential Vss and the input Vin2 is increased to the higher potential Vcc, the power-source line Vcc of the higher potential in the level-shifter on the upper stage is connected to the output node XVout1 via the PMOSFET 16 controlled by the above input XVin1 so that the output node XVout is increased to the higher potential, while the output node Vout1 is connected to the capacitor 1a via the PMOSFET 14 controlled by the above input XVin1 so that an current Iu is allowed to flow from the output node Vout1 to the capacitor 1a.

During the above period β, on the other hand, the power-source line Vss of the lower potential in the level-shifter on the lower stage is connected to the output node Vout2 via the NMOSFET 13 controlled by the above input Vin2 so that the output node Vout2 is reduced to the lower potential Vss. The output node XVout2 is connected to the capacitor 1b via the NMOSFET 15 controlled by the above input Vin2 so that a current IL is allowed to flow from the capacitor 1b to the output node XVout2. As a result, the potential of the output node XVut2 is raised to a value higher than the precharged potential during the period α.

The charge accumulated by the current Iu flowing from the output node Vout1 of the level-shifter on the upper stage is resultingly accumulated in the output node XVout2 by the current IL flowing from the capacitor 1b of the level-shifter on the lower stage, thereby reusing the charge.

Thus, in the present embodiment, the charge can be reused by the two level-shifters so that a further reduction in power consumption can be achieved.

The capacitance value CV of each of the capacitors 1a and 1b is set so that the ratio of the capacitance value CV to the parasitic capacitance value CD of the output nodes becomes equal to the ratio of a desired output amplitude value at the output nodes to the difference between the charged potential VM of each of the capacitors 1a and 1b to the precharged potential at the output nodes (i.e., about Vcc/2). For example, if the desired output amplitude value at the output nodes is Vcc/10, CV: CD becomes equal to 2:10.

(Variation of Third Embodiment)

Figure 9:
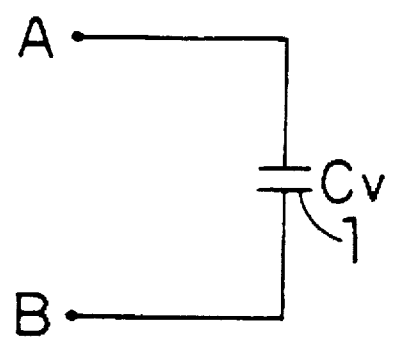
FIG. 9 is a view showing a variation of the semiconductor integrated circuit of the third embodiment, in which a capacitor is used in common.

FIG. 9 shows a variation of the third embodiment, which is different from the above semiconductor integrated circuit of FIG. 7 in that, instead of providing the two capacitors 1a and 1b for storing the higher potential and the lower potential, respectively, attention is given to the plate electrodes connected to the ground. As a result, the output node which shifts to the lower potential in the level-shifter on the upper stage and the output node which shifts to the higher potential in the level-shifter on the lower stage are connected to the pair of plate electrodes of the single capacitor 1, so that the respective potentials are stored. Consequently, the number of capacitors can be reduced from two to one, so that the effect of halving the layout area occupied by the capacitor can be achieved.

(Fourth Embodiment)

Figure 10:
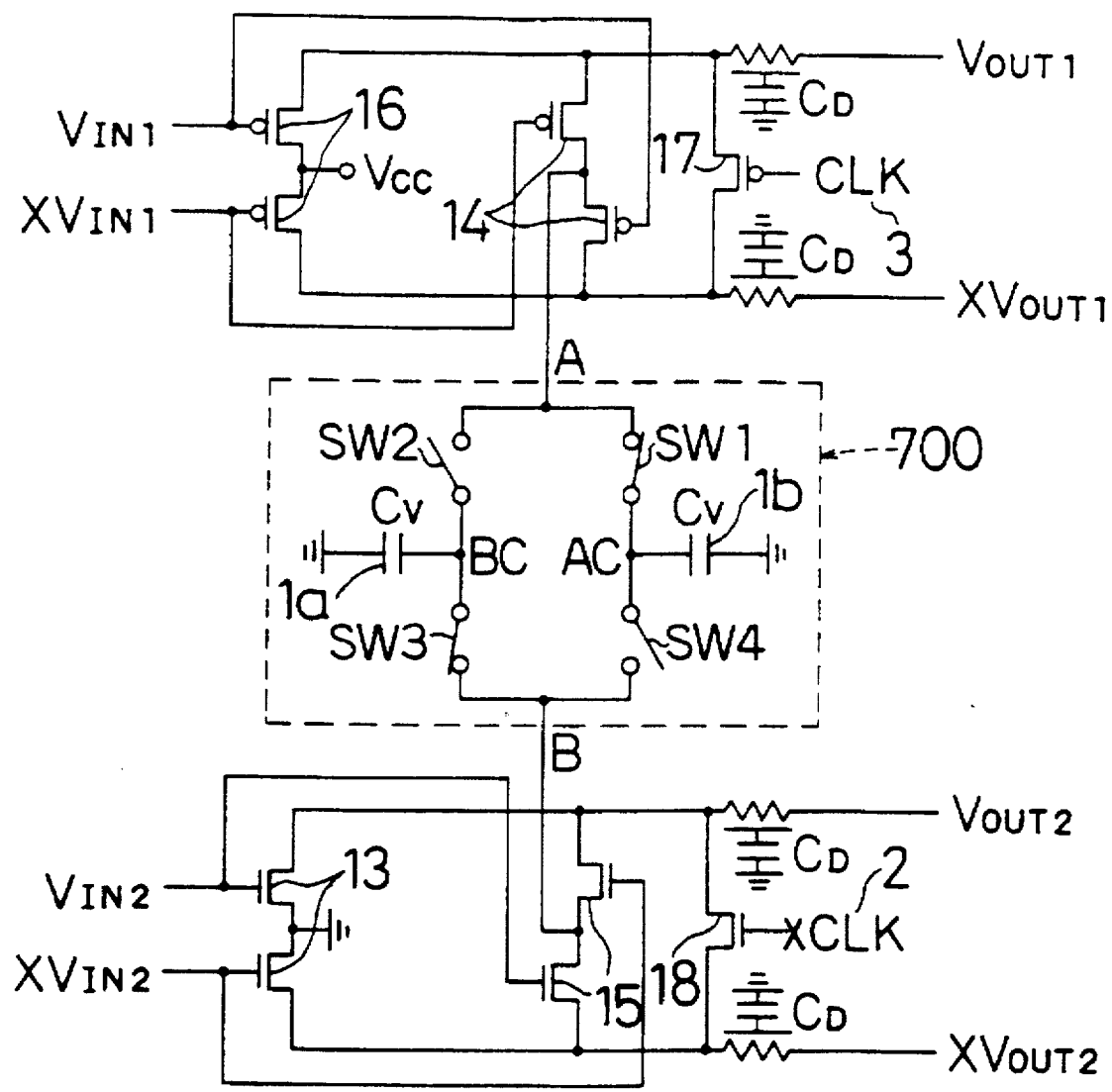
FIG. 10 is a view showing a semiconductor integrated circuit of a fourth embodiment.

FIG. 10 shows a fourth embodiment of the present invention. In the above embodiment shown in FIG. 7, the ratio of the capacitance value CV of each of the capacitors 1a and 1b to the parasitic capacitance value CD of the output node is set to 2:10. The present embodiment is constituted so that the capacitance value CV of each of the capacitors 1a and 1b is reduced by setting the ratio at 1:10, thereby reducing the layout area occupied by each of the capacitors 1a and 1b. Specifically, it is arranged that the potential difference between each of the capacitors 1a and 1b and the output nodes prior to a short circuit is doubled from about Vcc/2 to about Vcc.

Figure 11:
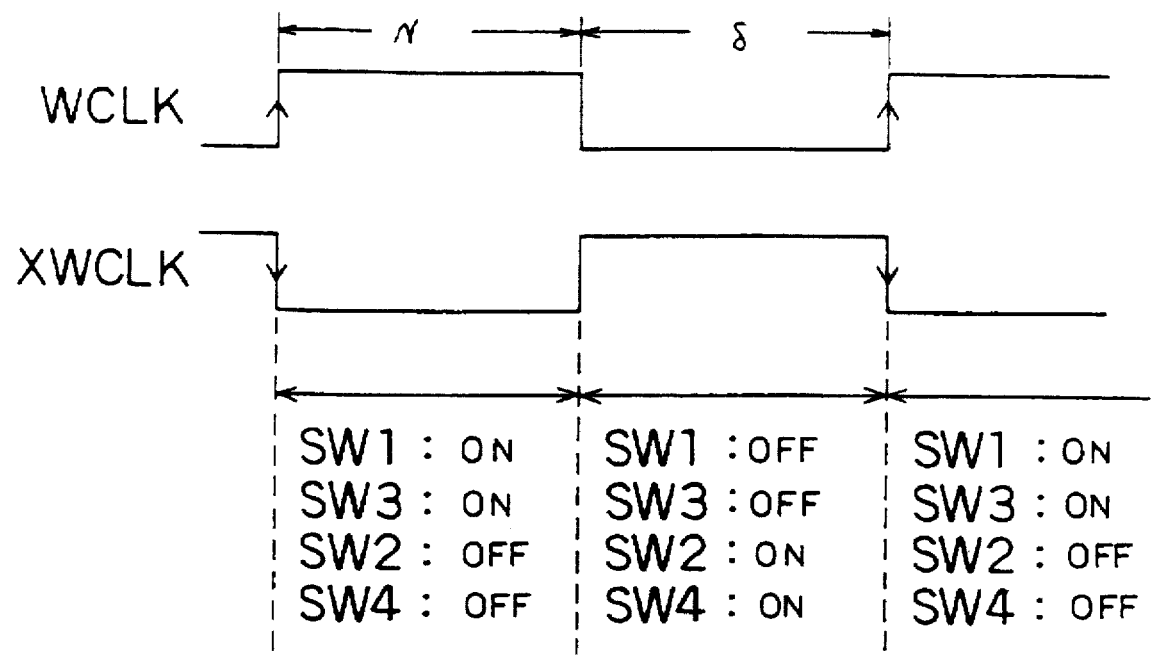
FIG. 11 is a view showing the controlling of switches in the semiconductor integrated circuit of the fourth embodiment.
Figure 12:
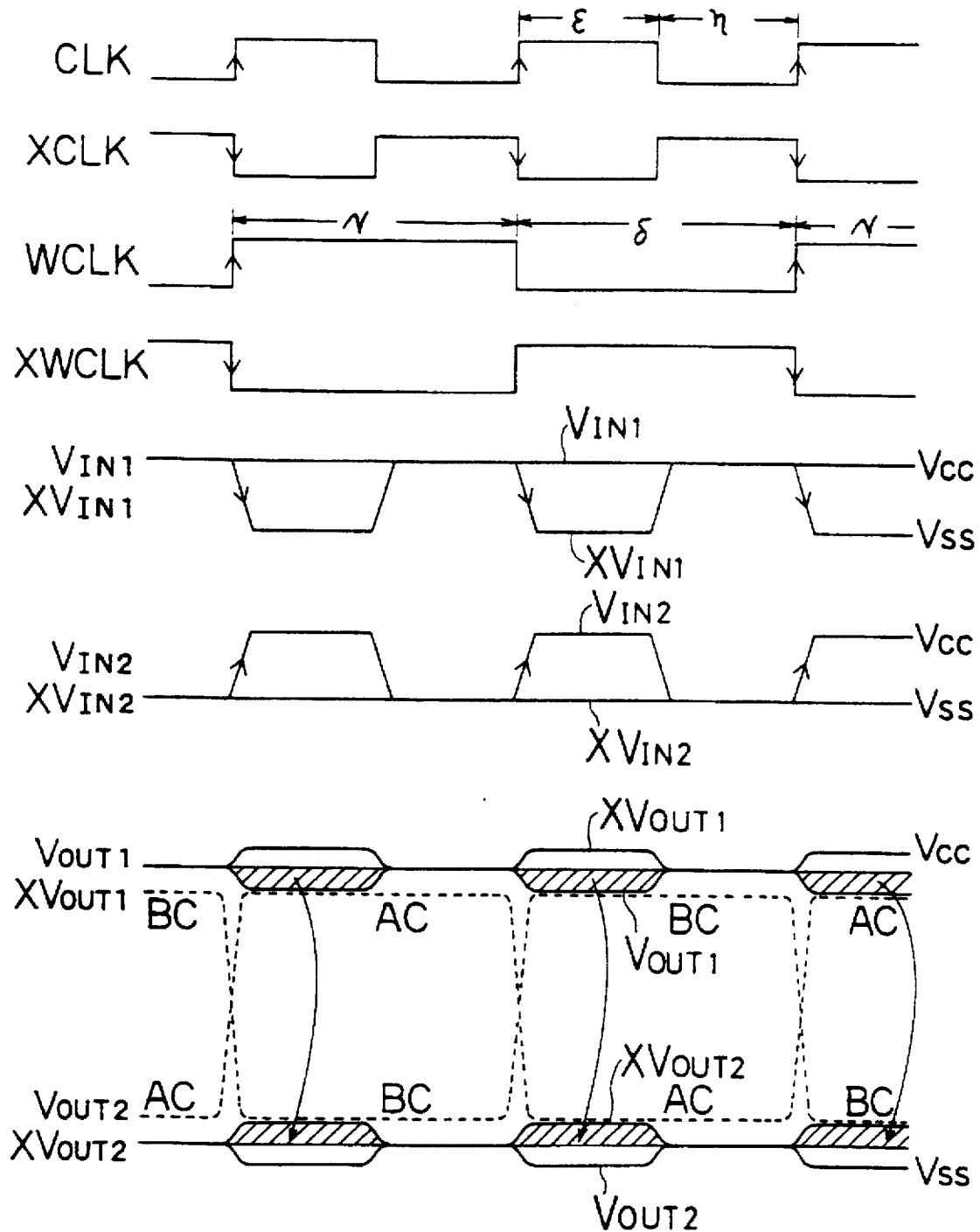
FIG. 12 is a view illustrating the operation of the semiconductor integrated circuit of the fourth embodiment.

That is, in FIG. 10, a charge supplying means 700 enclosed in the rectangle of broken lines has the two capacitors 1a and 1b and four switches SW1 to SW4. As shown in FIGS. 11 and 12, the above four switches SW1 to SW4 are controlled by a complementary pair of signals WCLK and XWCLK which change in every cycle of the complementary pair of clock signals CLK and XCLK. During a period T shown in FIG. 11, the two switches SW1 and SW3 are turned ON, while the other two switches SW2 and SW4 are turned OFF. Conversely, during the subsequent period δ, the switches SW1 and SW3 are turned OFF, while the switches SW2 and SW4 are turned ON.

Consequently, during a period ε corresponding to a half of one cycle of the clock signal shown in FIG. 12, the output node Vout1 (which drops in potential) is connected to the capacitor 1a by turning ON the PMOSFET 14 controlled by, e.g., the input XVin1 of the level-shifter on the upper stage, so that the potential in the capacitor 1a is increased to the vicinity of the higher potential of the power-source line Vcc on the higher potential side. On the other hand, the output node XVout2 (which rises in potential) is connected to the capacitor 1b by turning ON the NMOSFET 15 controlled by, e.g., the input Vin2 of the level-shifter on the lower stage, so that the potential in the capacitor 1b is lowered to the vicinity of the lower potential of the power-source line Vss on the lower potential side. The state is maintained during a period η corresponding to the other half of one cycle of the clock signal.

Subsequently, the capacitor 1b is connected to the output node Vout1 or XVout1 which drops in potential in the level-shifter on the upper stage by switching the four switches SW1 to SW4, so that the potential in the capacitor 1b is raised to the vicinity of the higher potential of the power-source line Vcc on the higher potential side. On the other hand, the capacitor 1a is connected to the output node Vout2 or XVout2 which rises in potential in the level-shifter on the lower stage, so that the potential in the capacitor 1a is lowered to the vicinity of the lower potential of the power-source line Vss on the lower potential side.

Accordingly, the potential difference between each of the capacitors 1a and 1b and the output nodes connected thereto prior to a short circuit can be set to about Vcc. As a result, the ratio of the capacitance value CV of each of the capacitors 1a and 1b to the parasitic capacitance value CD of the output node can be reduced to 1:10, so that the layout area occupied by each of the capacitors 1a and 1b can be reduced.

(Variation of Fourth Embodiment)

Figure 13:
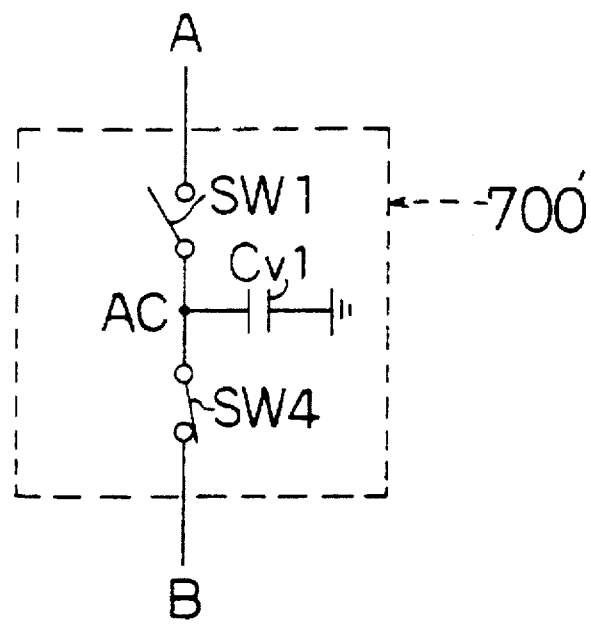
FIG. 13 is a view showing a variation of the semiconductor integrated circuit of the fourth embodiment.
Figure 14:
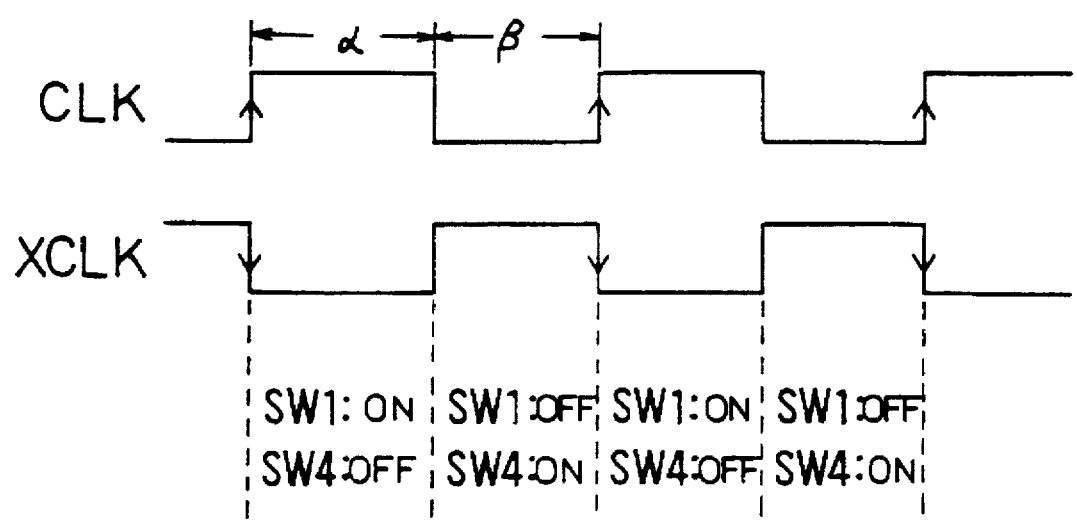
FIG. 14 is a view showing the controlling of switches in the variation of the semiconductor integrated circuit of the fourth embodiment.

FIG. 13 shows a variation of the above fourth embodiment, which uses a variation of the charge supplying means 700 of FIG. 10. A charge supplying means 701 of FIG. 13 has a single capacitor 1 and two switches SW1 and SW4 for connecting the capacitor 1 to the level-shifter on the upper stage and to the level-shifter on the lower stage. As shown in FIG. 14, during the period α corresponding to a half of one cycle of the complementary pair of clock signals CLK and XCLK, the switch SW1 is turned ON, while the switch SW4 is turned OFF. Conversely, during the period β corresponding to the other half of one cycle, the switch SW1 is turned OFF, while the switch SW4 is turned ON.

Figure 15:
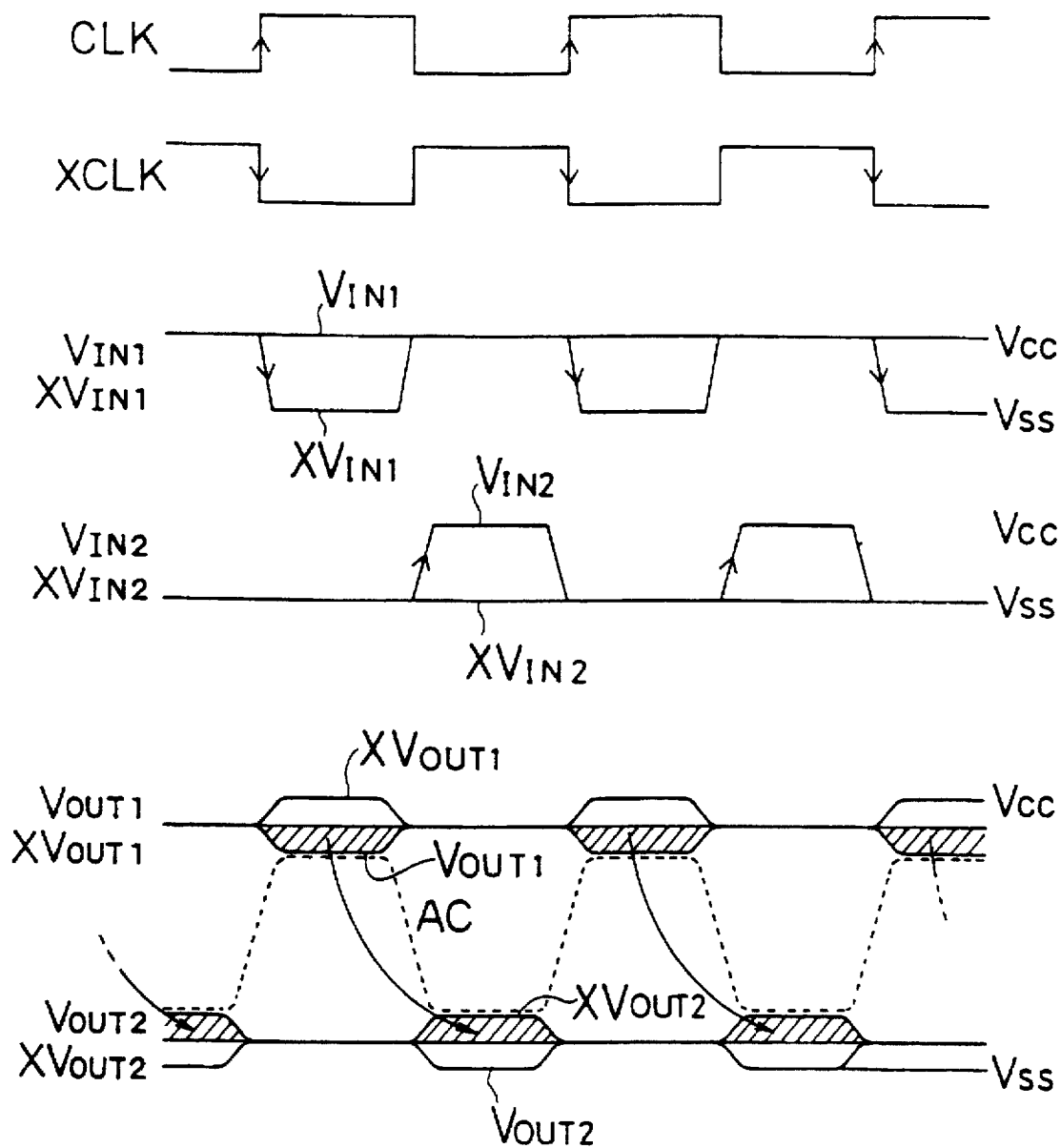
FIG. 15 is a view illustrating the operation of the variation of the semiconductor integrated circuit of the fourth embodiment.

As shown in FIG. 15, the complementary pair of inputs Vin2 and XVin2 to the level-shifter on the lower stage are modulated to have waveforms which are phase shifted by half a cycle from those of the complementary pair of inputs Vin1 and XVin1 to the level-shifter on the upper stage.

Consequently, as shown in FIG. 15, when the switch SW1 is turned ON during the period α corresponding to a half of one cycle of the clock signal, the capacitor 1 is connected to that one of the complementary pair of output nodes Vout1 and XVout1 (Vout1 in the drawing) which drops in potential in the level-shifter on the upper stage, so that the capacitor 1 is charged to the vicinity of the higher potential of the power-source line Vcc. Subsequently, when the switch SW4 is turned ON during the period β corresponding to the other half of one cycle of the clock signal, the capacitor 1 is connected to that one of the complementary pair of output nodes Vout2 and XVout2 (XVout2 in the drawing) which rises in potential in the level-shifter on the lower stage. As a result, the charge in the capacitor 1 is released to the output node XVout2, so that the potential in the capacitor 1 is lowered to the vicinity of the lower potential of the power-source line Vss.

Thus, in the present variation, the single capacitor 1 is alternately connected to the output node of a potential in the vicinity of the higher potential Vcc and to the output node of a potential in the vicinity of the lower potential Vss in every half cycle of the clock signal. Consequently, the ratio of the capacitance value CV of the capacitor 1 to the parasitic capacitance value CD of the output node can be reduced to 1:10, so that the layout area occupied by the capacitor can be reduced.

(Fifth Embodiment)

Next, a semiconductor integrated circuit according to a fifth embodiment of the present invention will be described with reference to FIG. 16.

Figure 16:
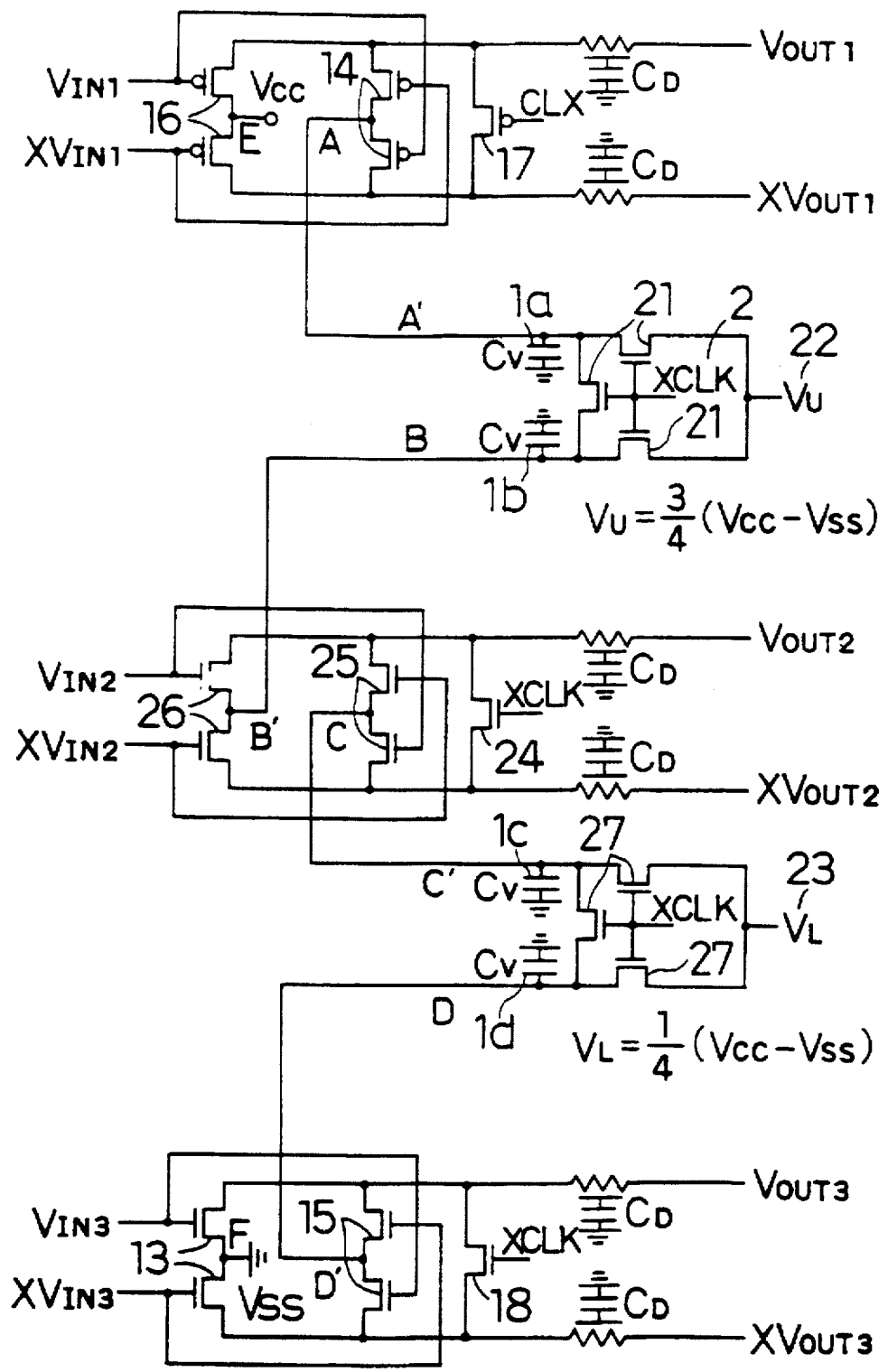
FIG. 16 is a view showing a semiconductor integrated circuit of a fifth embodiment.

In the semiconductor integrated circuit of FIG. 16, three different complementary-type level-shifters are connected in series between the power source Vcc and the ground line Vss.

The level-shifter on the middle stage is shown in FIG. 3. The level-shifter on the upper stage is shown in FIG. 6(a). The level-shifter on the lower stage is shown in FIG. 6(b). However, all the MOSFETs of the level-shifter on the middle stage are composed of NMOSFETs 24, 25, and 26.

All the MOSFETs of the level-shifter on the upper stage are composed of PMOSFETs 14, 16, and 17. All the MOSFETs of the level-shifter on the lower stage are composed of NMOSFETs 13, 15, and 18.

The capacitor 1a of the level-shifter on the upper stage and the capacitor 1b, which is one of the two capacitors 1b and 1c of the level-shifter on the middle stage, are connected to a power-source line 22 of a higher potential VU via three NMOSFETs 21. The other capacitor 1c of the level-shifter on the middle stage and the capacitor 1d of the level-shifter on the lower stage are connected to a power-source line 23 of a lower potential VL via three NMOSFETs 27.

The higher potential VU on the above power-source line 22 is set to 3(Vcc-Vss)/4, while the lower potential VL of the power-source line 23 is set to (Vcc-Vss)/4.

Each of the PMOSFET 17 of the above level-shifter on the upper stage, the NMOSFET 24 of the above level-shifter on the middle stage, and the NMOSFET 18 of the above level-shifter on the lower stage functions as a precharging means for short-circuiting the two corresponding output nodes and precharging them to equal potentials. The four capacitors 1a to 1d constitute a charge accumulating means. Each of the power-source lines VU and VL of an intermediate potential functions as a charging means for charging each of the above capacitors 1a to 1d to the intermediate potentials VU and VL (potentials different from the above precharged potentials at the output nodes). These precharging means, charge accumulating means, and charging means constitute a charge variation equalizing means.

On the other hand, the PMOSFET 14 of the level-shifter on the upper stage, the NMOSFET 25 of the level-shifter on the middle stage, and the NMOSFET 15 of the level-shifter on the lower stage constitute a charge redistributing means for connecting the capacitors 1a to 1d to the corresponding output nodes Vout1, XVout1, Vout2, XVout2, Vout3, and XVout3, respectively, and redistributing the charge accumulated in the capacitors 1a to 1d to the output nodes.

Figure 18:
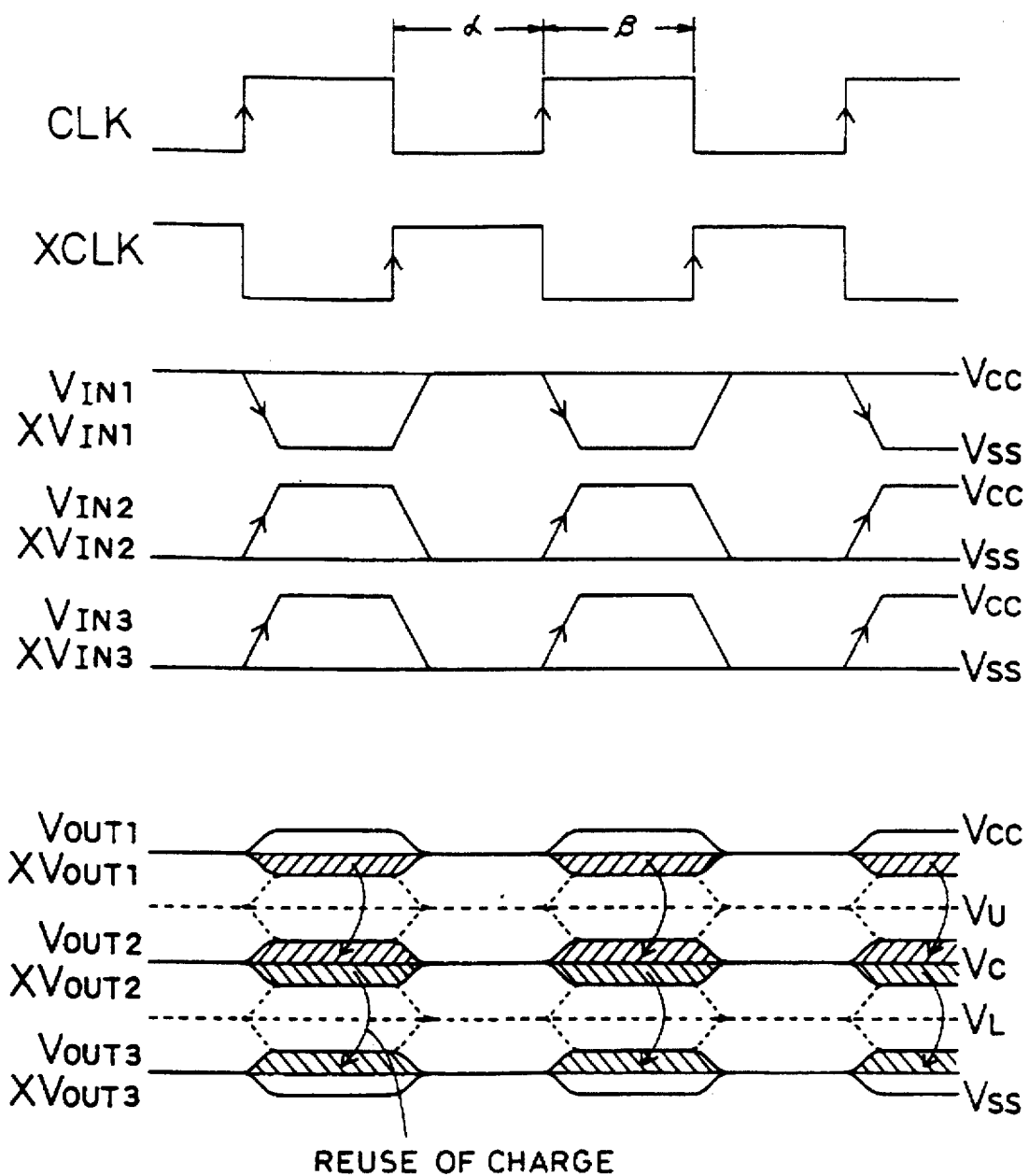
FIG. 18 is a view illustrating the operation of the semiconductor integrated circuit of the fifth embodiment.

Next, a description will be given to a control method of the semiconductor integrated circuit of the present embodiment. As shown in FIG. 18, the level-shifter on the middle stage is operated in synchronization with the complementary pair of clock signals CLK and XCLK. During the period α corresponding to a half of one cycle of the clock signals, the NMOSFET 24 is turned ON so as to short-circuit the complementary pair of outputs VOUT2 and XVOUT2, thereby precharging each of the outputs to an approximately intermediate potential (½ Vcc=Vc) between the power-source line 23 at the lower potential and the power-source line 22 at the higher potential. Meanwhile, each of the capacitors 1b and 1c is charged to the higher potential of the power-source line 22 and to the lower potential of the power-source line 23, respectively. During the subsequent period β corresponding to the other half of one cycle, the nodes of the above capacitors 1b and 1c are connected to the complementary pair of outputs Vout2 and XVout2 via the NMOSFEs 25 and 26 which are turned ON by the complementary pair of inputs Vin2 and XVin2, respectively.

Similarly in the level-shifter on the upper stage, during the period α corresponding to a half of one cycle of the clock signals, the complementary pair of outputs Vout1 and XVout1 are precharged to the intermediate potentials of the respective potentials obtained when they are complementarily outputted, while the capacitor 1a is charged to the potential VU of the power-source line 22 of the higher potential. Subsequently, during the period β corresponding to the other half of one cycle, the node A of the above capacitor 1a and the power-source line Vcc of the higher potential are connected to the above complementary pair of outputs Vout1 and XVout1 via the PMOSFETs 16 and 14 which have been turned ON by the above complementary pair of inputs Vin1 and XVin1.

Similarly in the level-shifter on the lower stage, during the period α corresponding to a half of one cycle of the clock signals, the complementary pair of outputs Vout3 and XVout3 are precharged to the intermediate potentials of the respective potentials obtained when they are complementarily outputted, while the capacitor 1d is charged to the potential VL of the power-source line 23 of the lower potential. Subsequently, during the period β corresponding to the other half of one cycle, the node D of the above capacitor 1d and the power-source line Vss of the lower potential are connected to the above complementary pair of outputs Vout3 and XVout3 via the NMOSFETs 13 and 15 which have been turned ON by the above complementary pair of inputs Vin3 and XVin3.

Figure 17:
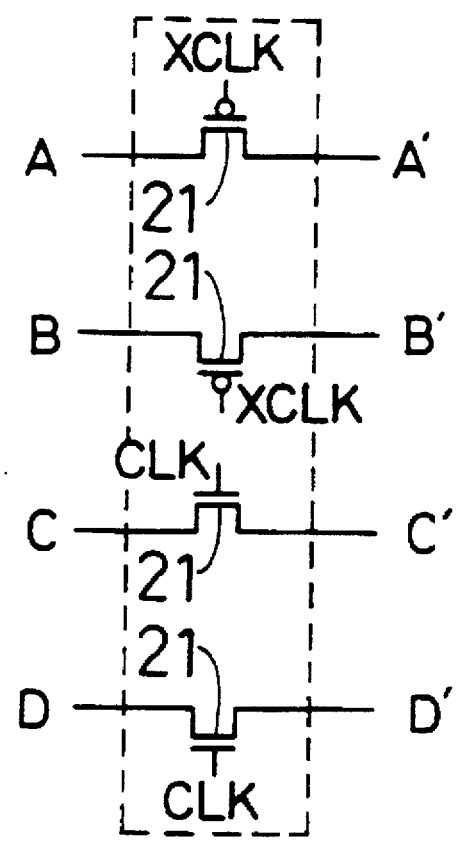
FIG. 17 is a view showing a circuit to be added to the semiconductor integrated circuit of the fifth embodiment.

As shown in FIG. 17, the above complementary pair of inputs Vin2 and XVin2 of the level-shifter on the middle stage and the above complementary pair of inputs Vin3 and XVin3 of the level-shifter on the lower stage are set on standby on the level of the ground potential Vss so that, after the inputs are determined, either one of the inputs shifts to the higher potential Vcc. On the other hand, the complementary pair of inputs Vin1 and XVin1 of the level-shifter on the upper stage are set on standby on the level of the higher potential Vcc so that, after the inputs are determined, either one of the inputs shifts to the ground potential Vss. With the settings, the power-source line Vcc of the higher potential, the power-source lines VU and VL of the two intermediate potentials, and the power-source line Vss of the lower potential constitute a through-current preventing means for preventing the flow of a through current resulting from a short circuit.

Alternatively, the above through-current preventing means can also be constituted as shown in FIG. 17, so that MOSFETs 21, e.g., are interposed between the points A and A', the points B and B', the points C and C', and the points D and D', which are shown in FIG. 16. In this case, the complementary pair of clock signals CLK and XCLK (signals different from the complementary pairs of inputs Vin1 and XVin1, Vin2 and XVin2, and Vin3 and XVin3) control the through-current preventing means so that it is not turned ON until either one of each complementary pair of inputs shifts to a potential lower than the threshold voltage of the corresponding input NMOSFET.

Thus, in the present embodiment, during the period β corresponding to the other half of one cycle of the clock signal, the charge abandoned by the output node Vout1 or XVout1 which drops in potential in the level-shifter on the upper stage is used to raise the potential at the output node Vout2 or XVout2 which rises in potential in the level-shifter on the middle stage, as shown in FIG. 18. On the other hand, the charge released by the output node Vout2 or XVout2 which drops in potential in the level-shifter on the middle stage is used to raise the potential at the output node Vout3 or XVout3 which rises in potential in the level-shifter on the lower stage. Consequently, only the level-shifter on the upper stage should be supplied with the charge from the outside, while the other two level-shifters do not require the supply of additional charge, which enables a reduction in power consumption.

Below, a description will be given to the case where n level-shifters are assumedly operated in each of the present and conventional embodiments so as to compare the degree of reduction in power consumption attained by the present embodiment with that attained by the conventional embodiments.

In the case where the voltage level is lowered by means of the internal power-source circuit as in the first conventional embodiment (Japanese Laid-Open Patent Publication No. 4-211515), if the power-source voltage, the output current, and the voltage after the voltage drop are represented by Vcc, IH, and VH, respectively, power consumption in the internal power-source circuit becomes n·IH·(Vcc−VH), while power consumption in the n circuits becomes n·IH·VH, so that the total power consumption amounts to Ptotal=n·IH·Vcc.

In the case where the voltage level is reduced by operating the additional n circuits in series as in the second conventional embodiment (Japanese Laid-Open Patent Publication No. 4-302463), the voltage applied to each of the circuits becomes VCC/n, so that the total power consumption Ptotal becomes Ptotal=(VCC/n·IH)·n+α=IH·Vcc+α. Here, the power consumption α accounts for the through current allowed to flow when the voltage (Vcc−Vss) is divided with resistors. Since the through current IH always flows uselessly in series from the power source to the ground terminal, it can be represented by IH·Vcc. Therefore, the total power consumption Ptotal becomes Ptotal=2·IH·Vcc.

Figure 19:
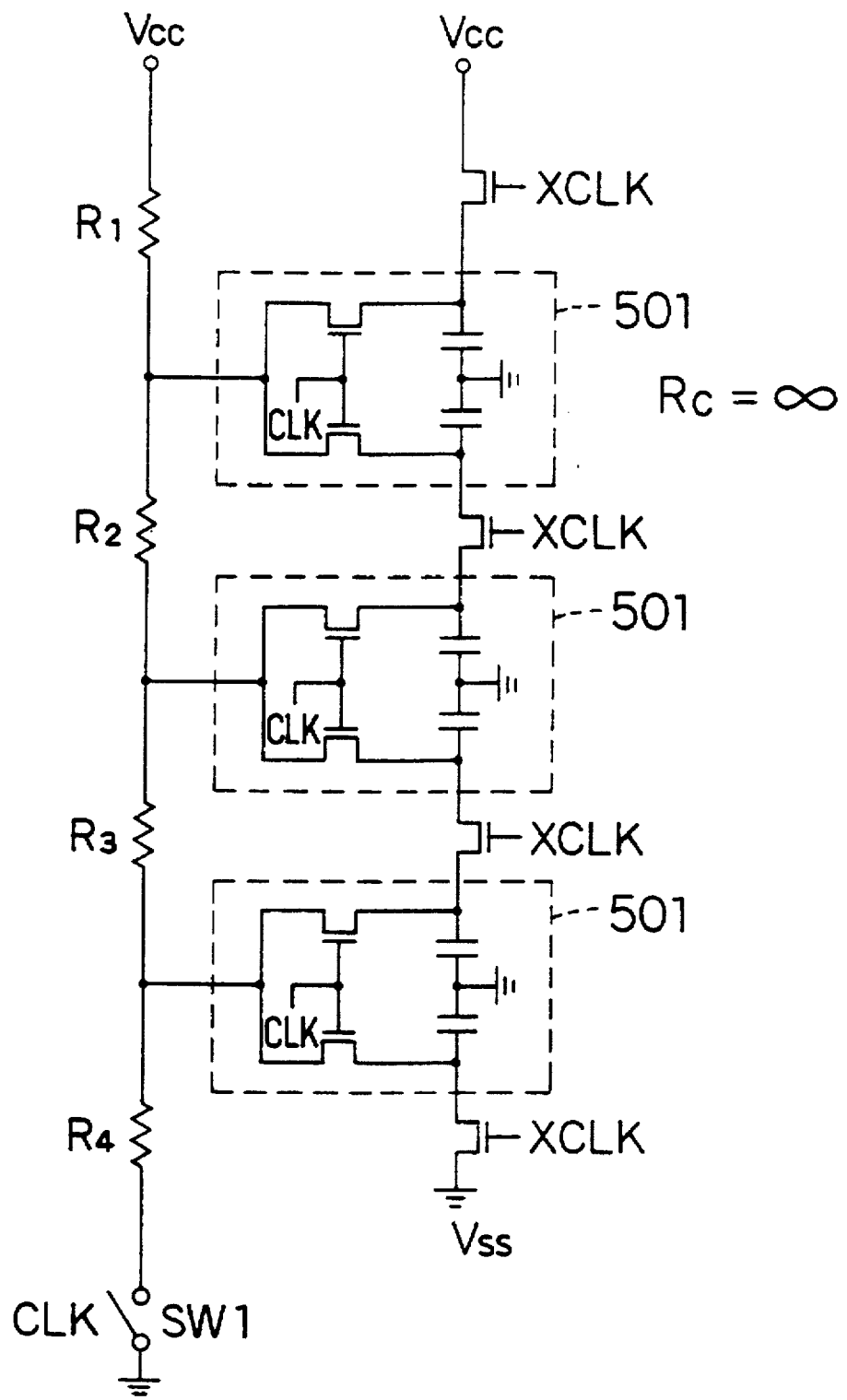
FIG. 19 is a view showing an equivalent circuit to the semiconductor integrated circuit of the fifth embodiment.

In contrast, as shown in the equivalent circuit of FIG. 19, the present invention uses the n (in the drawing, n=3) level-shifters 501 in and from which equal charges are accumulated and released, i.e., in which the capacitors varying in potential have equal capacitances. These level-shifters 501 are connected to each other only when the outputs therefrom have high impedance, so that if the capacitor of the level-shifter placed on the uppermost stage is solely charged, the other level-shifters are operated by reusing the charge from their respective one-stage upper level-shifters, so that the total power consumption Ptotal becomes Ptotal=IH·Vcc.

Figure 20:
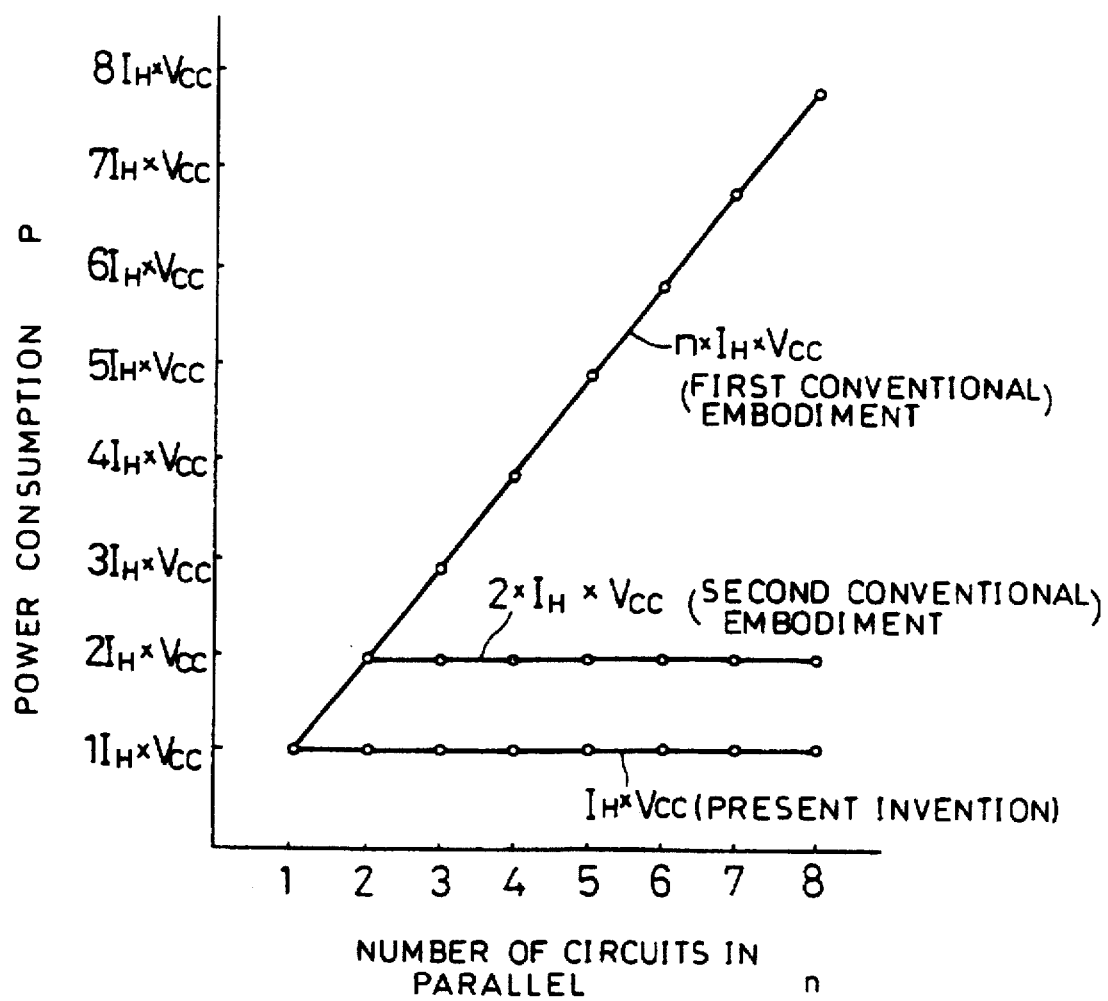
FIG. 20 is a view showing the effect of the fifth embodiment.

Thus, as shown in FIG. 20, the power consumption in the present invention becomes half the power consumption in the case where the three level-shifters operate in series, as in the second conventional embodiment, accompanied by the through current. In the present invention, there can also be achieved a reduction in power consumption to 1/n, compared with the power consumption in the case where the voltage is reduced by means of the internal power-source circuit as in the first conventional embodiment.

Although the present embodiment has used the three different complementary-type level-shifters in combination, if a few more level-shifters of the type disposed on the middle stage of FIG. 16 are connected in series, it is possible to dispose four or more stages in series. In this case, the level-shifter which outputs a potential higher than the intermediate value ((Vcc+Vss)/2) between the higher potential on the external power-source line Vcc and the lower potential on the external power-source line Vss from the output node consists of PMOSFETs, while the level-shifter which outputs a potential lower than the intermediate value consists of NMOSFETs. With the structures, the gate/source voltages in the MOSFETs become sufficiently large, so that stable operation can be performed.

Next, a circuit for generating the intermediate potentials VU and VL mentioned above is shown in FIG. 21. The intermediate potential generator of FIG. 21 consists of current-mirror-type comparators 28, 29, and 30 which use the potential obtained through the resistive division by the four resistors R1, R2, R3, and R4 as the reference potential and output MOSFETs 31 to 33 controlled by the outputs from the comparators 28 to 30.

Figure 21:
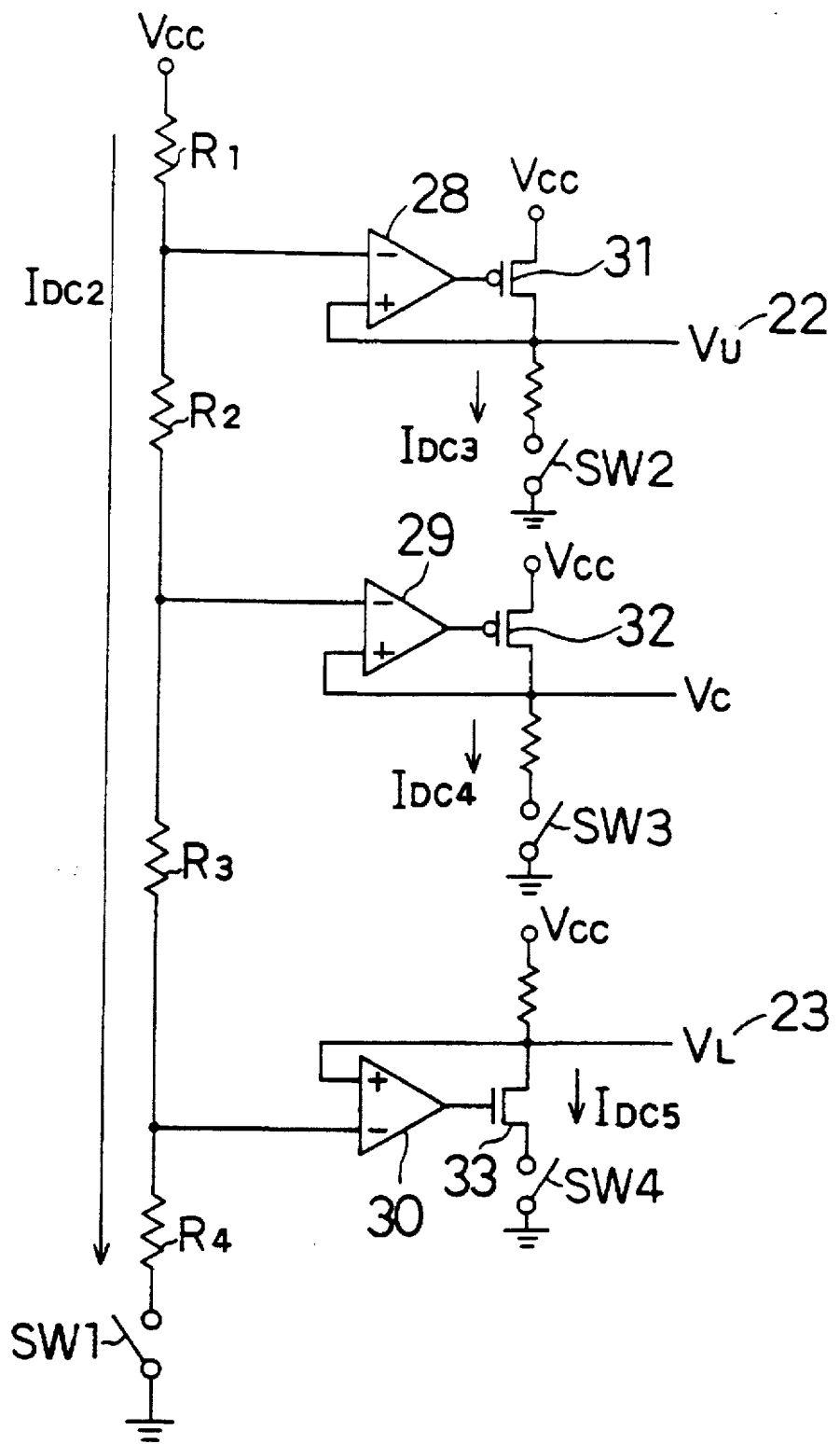
FIG. 21 is a view showing the structure of an internal power-source circuit in the fifth embodiment.
Figure 28:
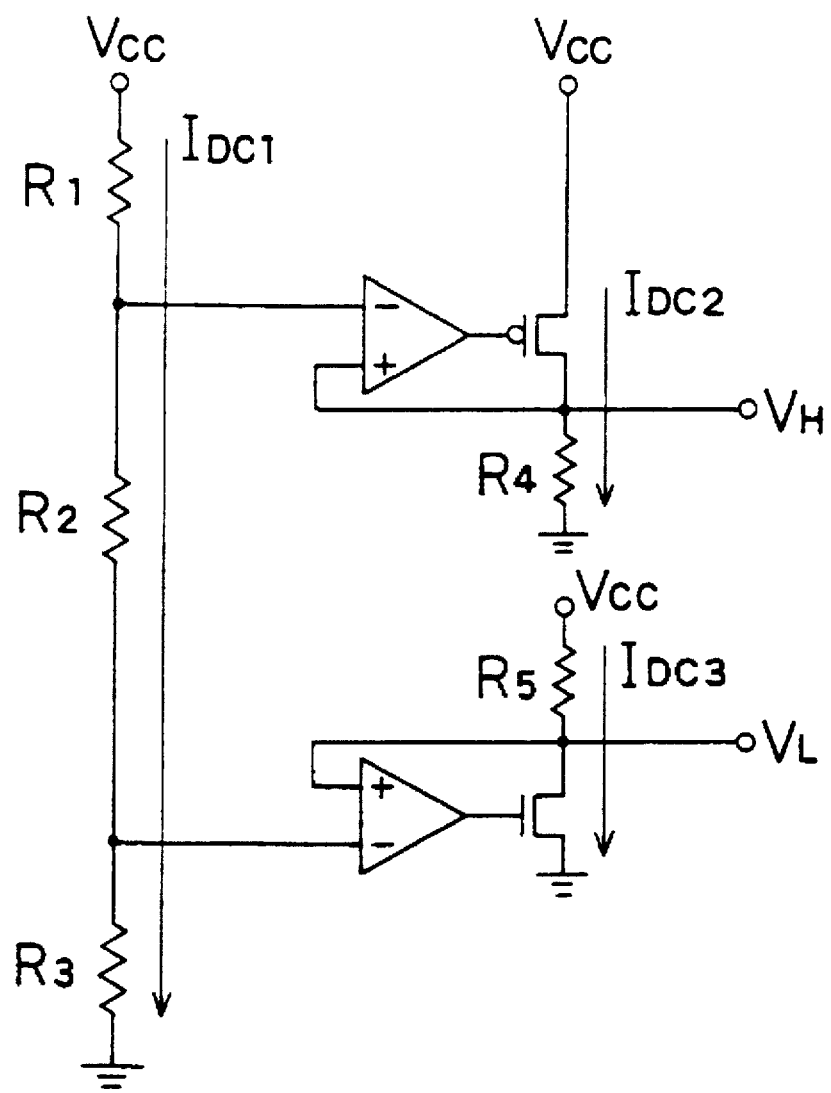
FIG. 28 is a view showing the structure of a conventional internal power-source circuit.
Figure 29A:
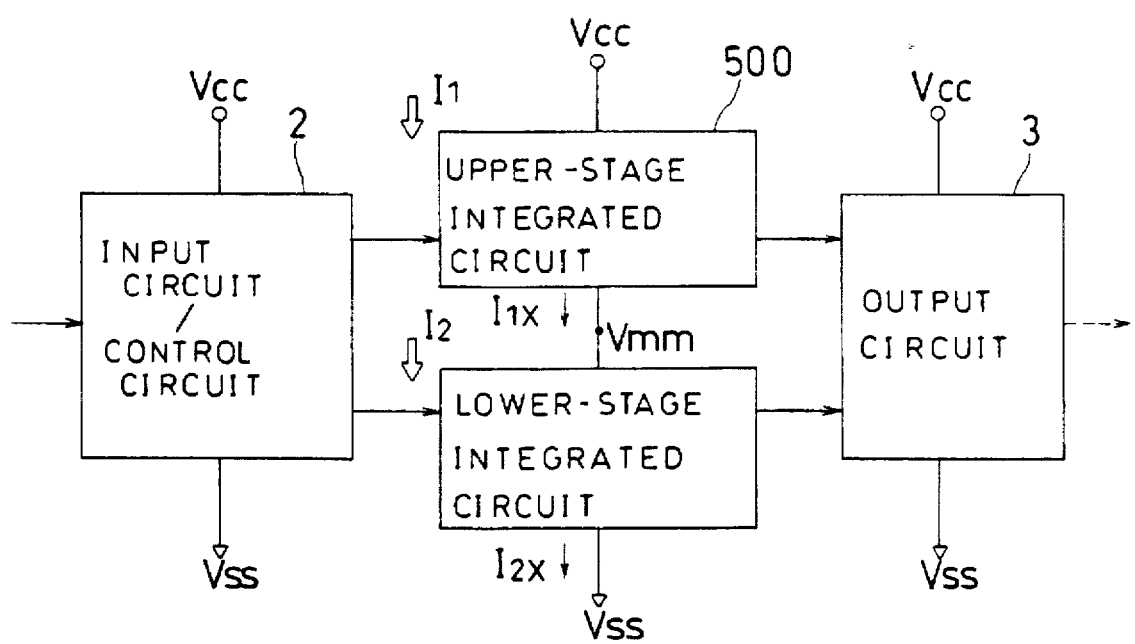
FIG. 29(a) is a view showing the structure of a second conventional level-shifter.
Figure 29B:
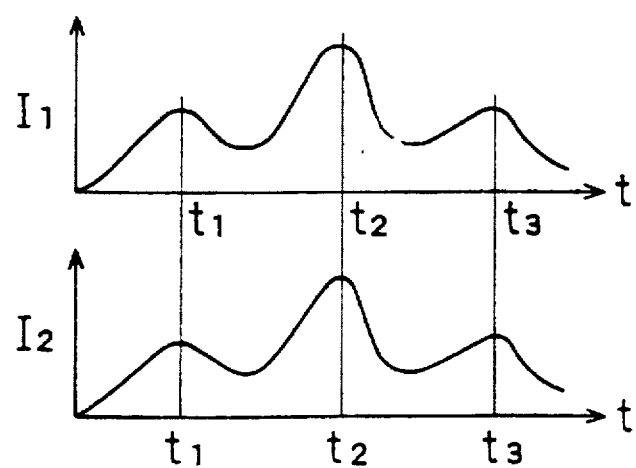
FIG. 29(b) is a view illustrating the operation of the second conventional level-shifter.
Figure 30:
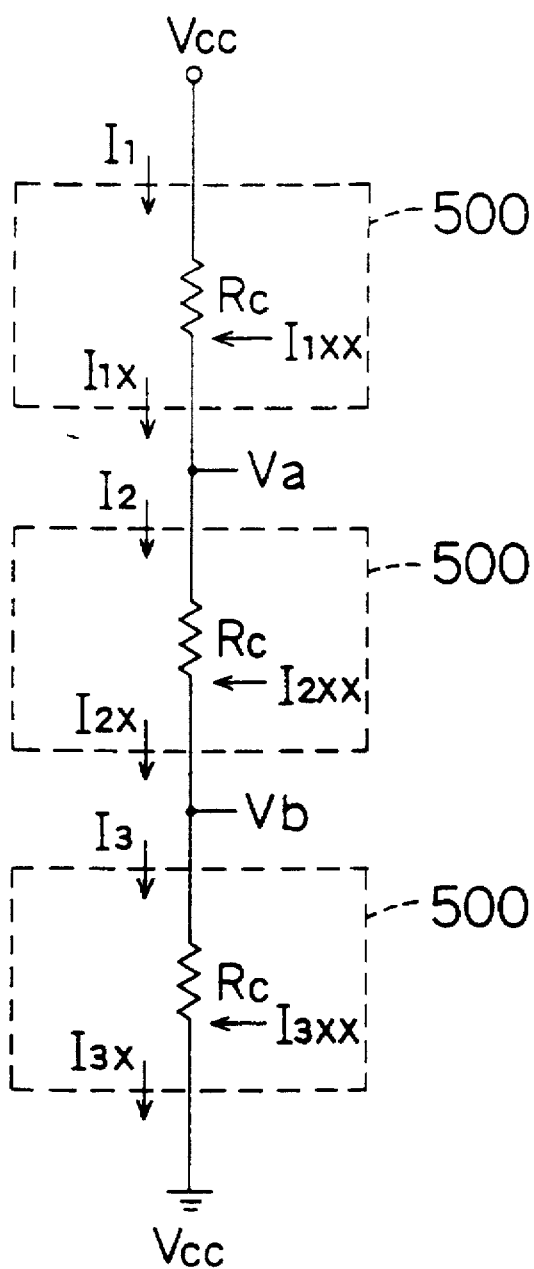
FIG. 30 is a view showing an equivalent circuit to the second conventional level-shifter.

The above intermediate potential generator is basically the same as the power-source circuit of FIG. 28 shown in the conventional embodiment, except that it has a charge supplying ability greatly different from that of the conventional embodiment and that the supply of a new charge is no more necessary since the charge is reused in the above level-shifters on the intermediate and lower stages. Briefly, it is not necessary to provide the intermediate potential generator shown in FIG. 21 so that it performs a charge supplying function. The intermediate potential generator is needed only when the first operating point is determined on turning ON the power source. As a result, it is no more necessary for the output to have a low resistance as in the conventional embodiment. It is possible to reduce in size the device constituting the intermediate potential generator of FIG. 21, so that the sum of the through currents IDC2, IDC3, IDC4, and IDC5 shown in the drawing can be reduced to the order of microamperes or less. It is also possible, as shown in FIG. 21, to further suppress the above through current by operating the intermediate potential generator only on turning ON the power source or only during the period corresponding to a half of one cycle of the clock signal CLK during which the clock signal CLK is Low, for example, and by halting its operation at all other times.

(Sixth Embodiment)

Next, a semiconductor integrated circuit according to a sixth embodiment of the present invention will be described with reference to FIG. 22.

In the present embodiment, an additional charge supplying means as described above is not provided. Instead, the parasitic capacitance of the output node of a level-shifter is used as a charge supplying means so that the charge accumulated at the output node is reused by another level-shifter.

Figure 22:
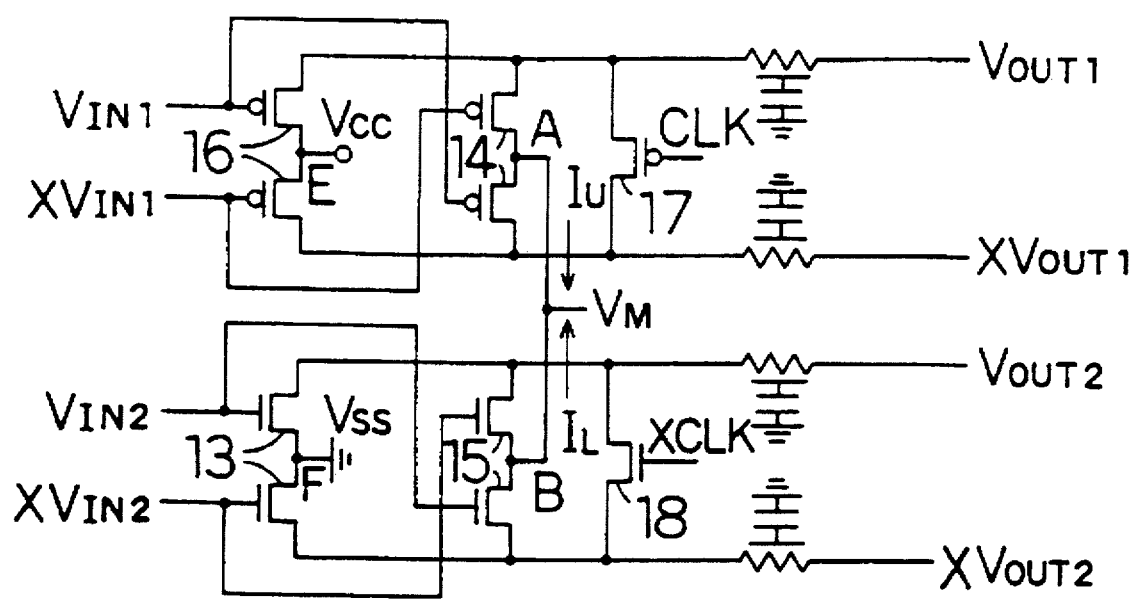
FIG. 22 is a view showing a semiconductor integrated circuit of a sixth embodiment.

That is, as shown in FIG. 22, the complementary-type level-shifter on the upper stage has the same structure as that of the level-shifter shown in FIG. 6(a) and the complementary-type level-shifter on the lower stage has the same structure as that of the level-shifter shown in FIG. 6(b). All the MOSFETs of the level-shifter on the upper stage are composed of PMOSFETs 16, 14, and 17, while all the MOSFETs of the level-shifter on the lower stage are composed of NMOSFETs 13, 15, and 18.

The midpoint (point A in the drawing) between the two PMOSFETs 14 of the above level-shifter on the upper stage and the midpoint (point B in the drawing) between the two NMOSFETs 15 of the above level-shifter on the lower stage are connected to the power-source line VM of the intermediate potential. The intermediate potential VM on the above power-source line VM is set at (Vcc−Vss)/2.

The PMOSFETs 14 of the above level-shifter on the upper stage and the NMOSFETs 15 of the above level-shifter on the lower stage constitute the charge redistributing means for connecting and short-circuiting the output node Vout1 or XVout1 (Vout2 or XVout2) which shifts to the lower potential in one of the level-shifters to the output node Vout2 or XVout2 (Vout1 or XVout1) which shifts to the higher potential in the other level-shifter and thereby redistributing the charge released by the output node which shifts to the lower potential to the output node which shifts to the above higher potential. As for the other structure, it is the same as that of FIG. 7, so that the description thereof will be omitted.

Figure 24:
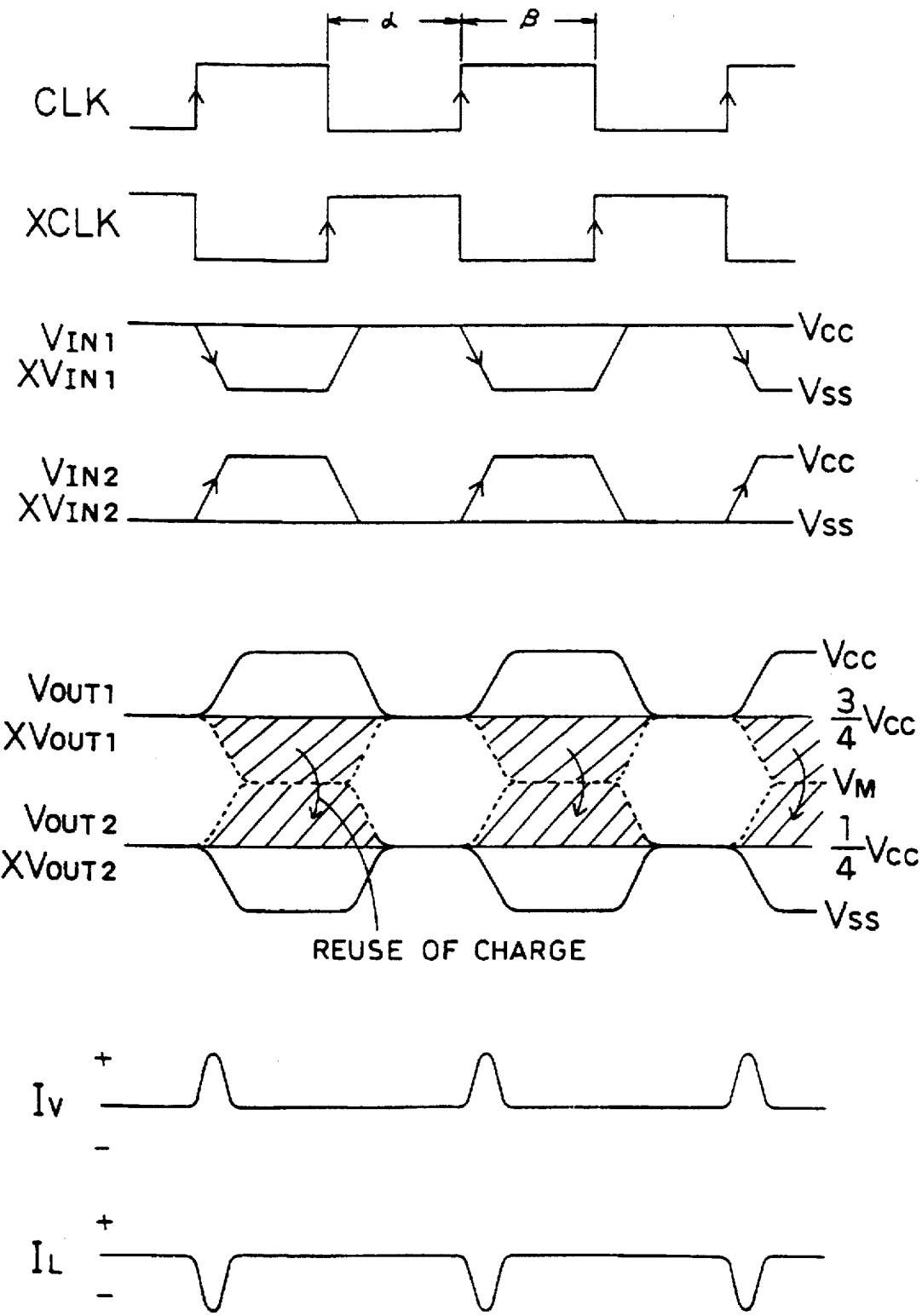
FIG. 24 is a view illustrating the operation of the semiconductor integrated circuit of the sixth embodiment.

Next, a description will be given to a control method of the semiconductor integrated circuit of the present embodiment. As shown in FIG. 24, during the period α corresponding to a half of one cycle of the clock signal CLK, the turning ON of the PMOSFET 17 and NMOSFET 18 precharges the complementary pair of output nodes Vout1 and XVout1 and the complementary pair of output nodes Vout2 and XVout2 of the respective level-shifters to the respective intermediate potentials, i.e., to the potentials of ¾ Vcc and ¼ Vcc.

Subsequently, during the period β corresponding to the other half of one cycle of the clock signal CLK, that one of the outputs nodes Vout1 and XVout1 which drops in potential in the level-shifter on the upper stage having high impedance as a result of turning OFF the PMOSFET 17 and that one of the outputs nodes Vout2 and XVout2 which rises in potential in the level-shifter on the lower stage are short-circuited via the PMOSFET 14 which has been turned ON by either of the complementary pair of inputs Vin1 and XVin1 and via the NMOSFET 15 which has been turned ON by either of the complementary pair of inputs Vin2 and XVin2, respectively, and set at the intermediate potential of the power-source line Vc. On the other hand, the other output node Vout1 or XVout1 of the above level-shifter on the upper stage is connected to the power-source line Vcc of the higher potential, while the other output node Vout2 or XVout2 of the level-shifter on the lower stage is connected to the power-source line Vss of the lower potential.

As shown in FIG. 24, the above complementary pair of inputs Vin1 and XVin1 to the level-shifter on the upper stage are set on standby on the level of the ground potential Vss so that, after the inputs are determined, either one of the inputs solely shifts to the lower potential Vss. On the other hand, the complementary pair of inputs Vin2 and XVin2 to the level-shifter on the lower stage are set on standby on the level of the lower potential Vss so that, after the inputs are determined, either one of the inputs solely shifts to the higher potential Vcc. With the settings, the flow of a through current resulting from a short circuit between the power-source line Vcc of the higher potential and the power-source line Vss of the lower potential is prevented.

Figure 23:
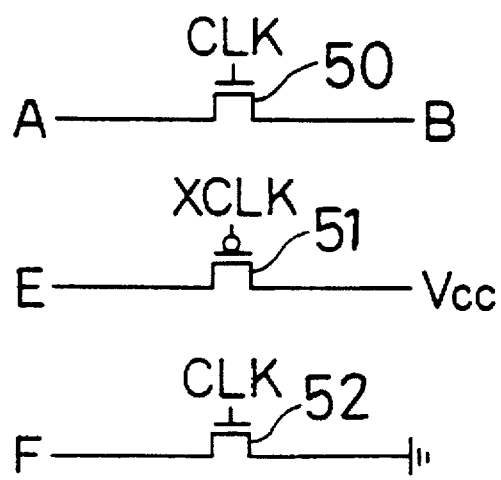
FIG. 23 is a view showing a circuit to be added to the semiconductor integrated circuit of the sixth embodiment.

Alternatively, the above semiconductor integrated circuit can also be constituted as shown in FIG. 23, so that MOSFETs 50, 51, and 52, e.g., are provided between the nodes A and B, between the node E and the power-source line Vcc, and between the node F and the ground power source Vss, which are shown in FIG. 22. With the constitution, the semiconductor integrated circuit of the present embodiment is turned ON only when either one of each complementary pair of inputs shifts to the threshold voltage of the input MOSFET.

Thus, as can be seen from FIG. 24, the charge released by that one of the output nodes Vout1 and XVout1 which drops in potential in the level-shifter on the upper stage can be reused by that one of the output nodes Vout2 and XVout2 which rises in potential in the level-shifter on the lower stage, so that power consumption can be reduced in the present embodiment.

(Seventh Embodiment)

Next, a seventh embodiment of the present invention will be described with reference to FIG. 25.

The present embodiment was obtained by developing the above sixth embodiment, in which two level-shifters of the type shown in FIG. 22 are provided on the upper stage and two level-shifters of the type shown in FIG. 22 are provided on the lower stage. The four level-shifters in total constitute the semiconductor integrated circuit.

Between the level-shifter on the first stage and the level-shifter on the second stage is disposed a power-source line 55 of the first intermediate potential VU (VU=3(Vc−Vss)/4). Between the level-shifter on the second stage and the level-shifter on the third stage is disposed a power-source line 56 of the second intermediate potential Vc (Vc=2(Vc−Vss)/4). Between the level-shifter on the third stage and the level-shifter on the fourth stage is disposed the power-source line 57 of the third intermediate potential VL (VL=(Vc−Vss)/4).

As for the other structure, it is the same as that of FIG. 22, so that the description thereof will be omitted.

Figure 26:
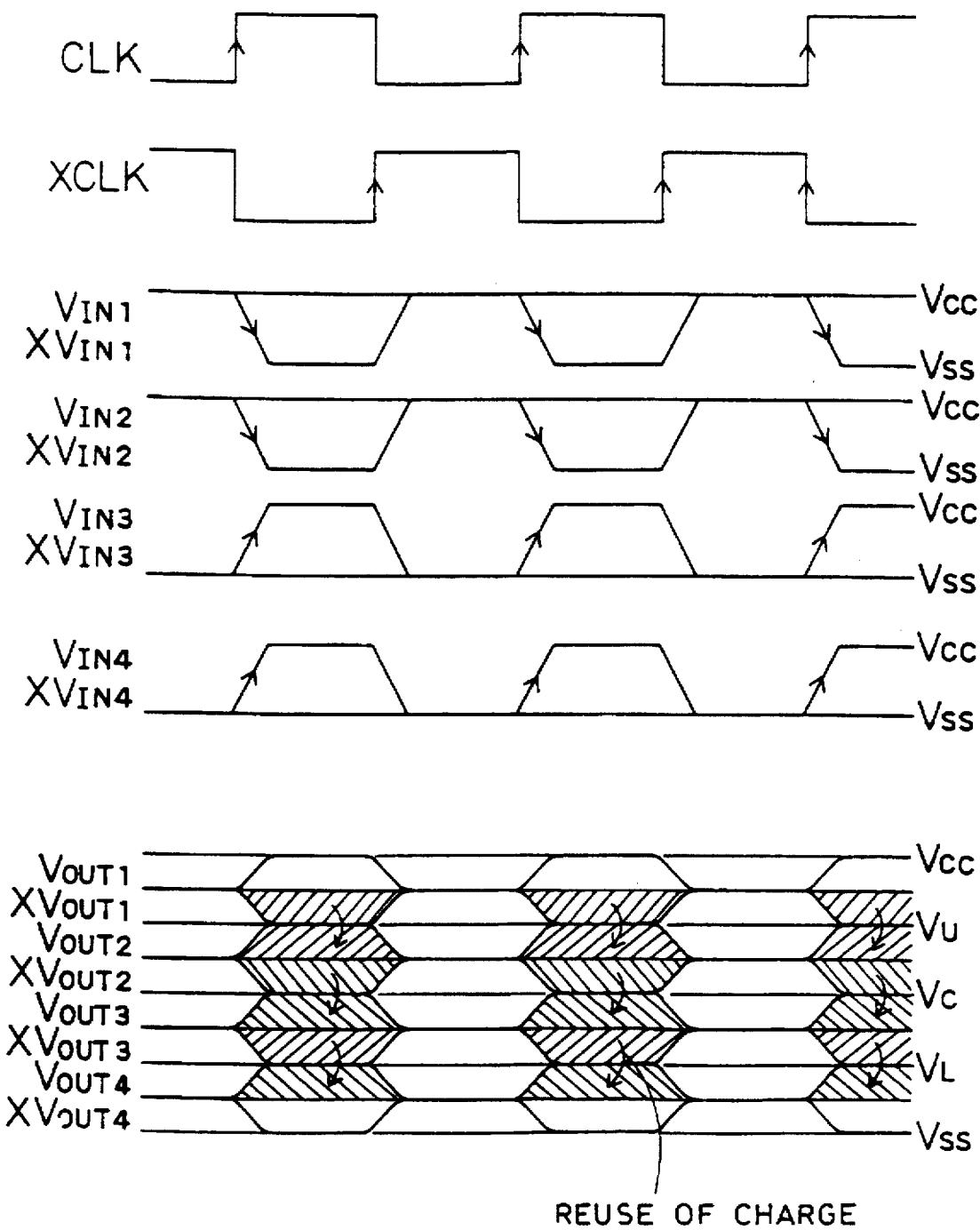
FIG. 26 is a view illustrating the operation of the semiconductor integrated circuit of the seventh embodiment.
Figure 27:
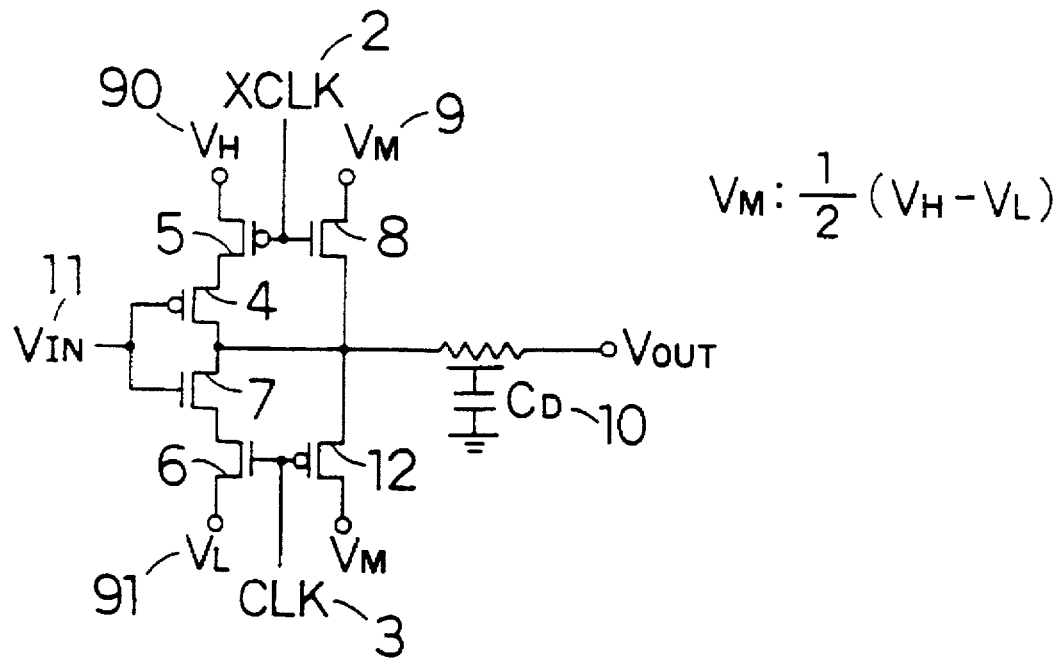
FIG. 27(a) is a view showing the structure of a first conventional level-shifter.
FIG. 27(b) is a view illustrating the operation of the first conventional level-shifter.
Figure 27:
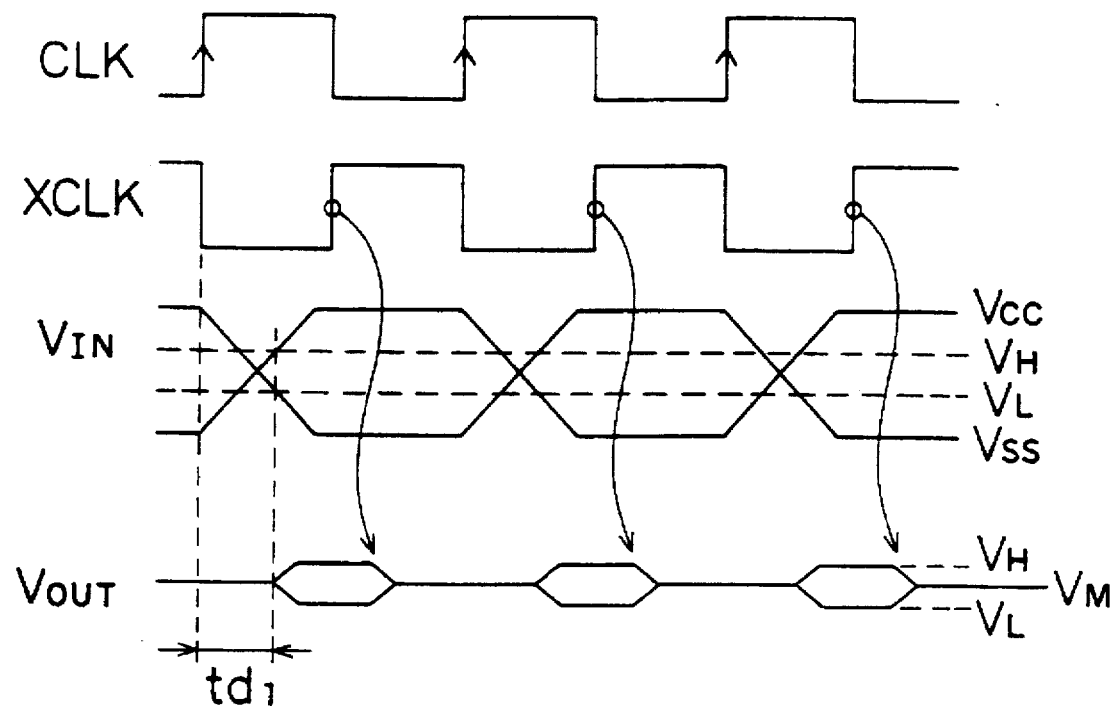

In the present embodiment, as shown in FIG. 26, the four pairs of output lines having the amplitude of Vcc/4 are operated by mutually reusing a charge. Consequently, of the four level-shifters, only the level-shifter on the uppermost stage connected closest to the power source is supplied with a charge required for a potential shift of Vcc/8 from the external power-source line Vcc, while the other three level-shifters operate with the reused charge.

The above sixth and seventh embodiments can be made the best use of in a circuit in which the output nodes (output lines) have equal parasitic capacitances and a potential for turning ON either one of the transistors to which a complementary pair of inputs are connected can be provided comparatively easily. For example, in a memory circuit operable with the synchronous signal, if a data transfer system circuit originally operating with 16, 32, 64, or 128 bits is substituted by a data transfer circuit operating with 4 or 8 bits, power consumption in the memory can be reduced.

(Eighth Embodiment)

Figure 31:
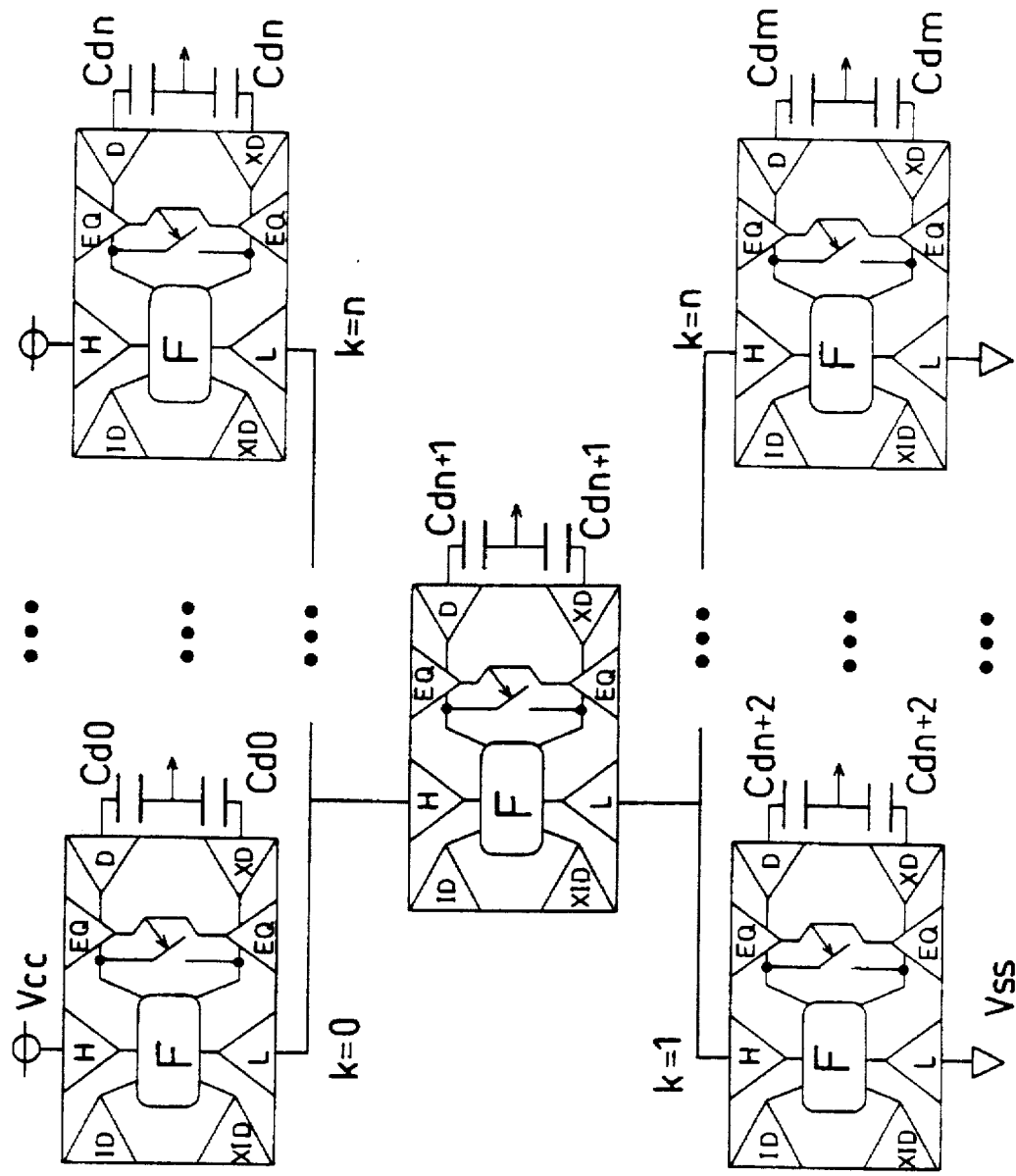
FIG. 31 is a circuit diagram showing an eighth embodiment.
Figure 32:
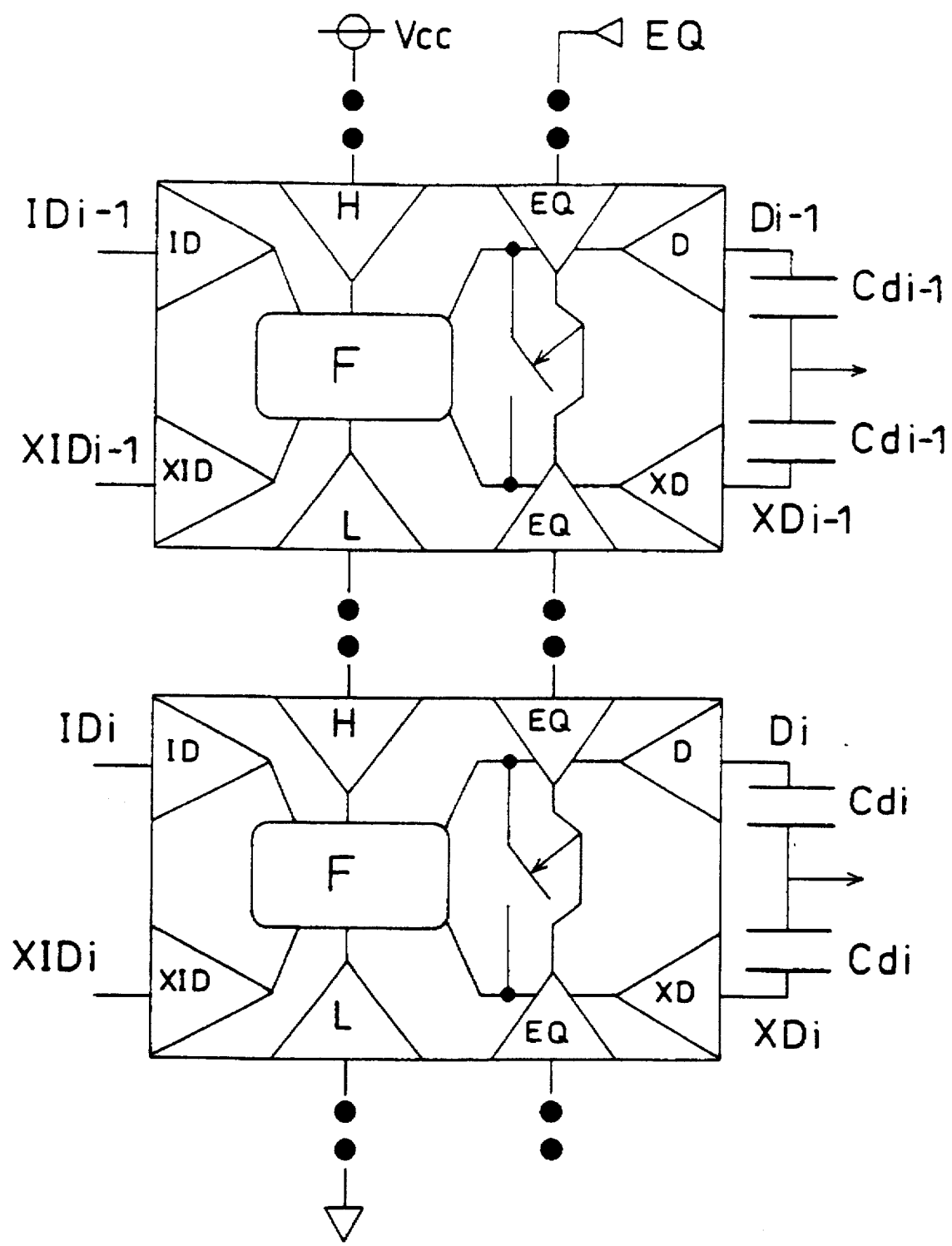
FIG. 32 is a block diagram showing a principal portion of a level-shifter.
Figure 33:
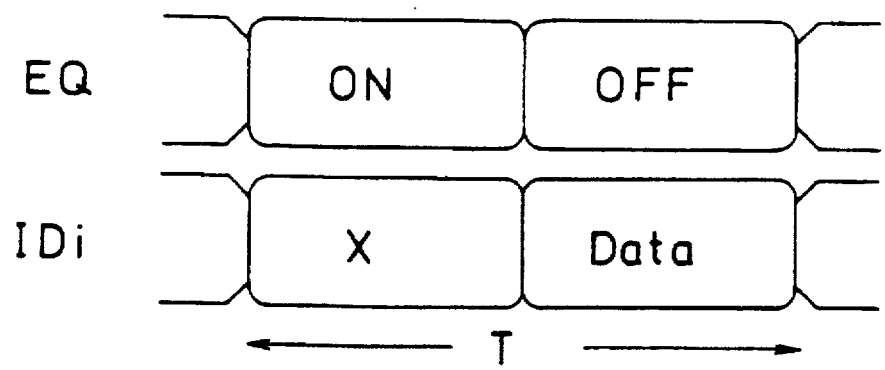
FIG. 33 is a view illustrating the operation of the level-shifter of FIG. 32.

FIG. 31 shows an eighth embodiment of the present invention. The semiconductor integrated circuit shown in the drawing comprises a plurality of level-shifters each including, e.g., the above discharge circuit 9' and precharging means 11' of FIG. 4, the principal portions of which are shown in blocks. As shown in FIG. 32, each block has a pair of output elements IDi and XIDi, a pair of output elements Di and XDi, and level setting elements H and L for each pair of outputs. In the drawings, F represents a functional circuit, which is specifically a switch composed of a transistor. Here, by way of example, let attention be given to the output D. If the output element Di is higher in level than the output element XDi in the same pair, the functional circuit F performs the function of connecting the output D to the level setting element H. If the output element Di is lower in level than the output element XDi, on the other hand, the functional circuit F connects the output D to the level setting element L. In the drawings, EQ represents a signal for equalizing a pair of output lines. FIG. 33 shows the operating tables of the respective blocks.

Figure 25:
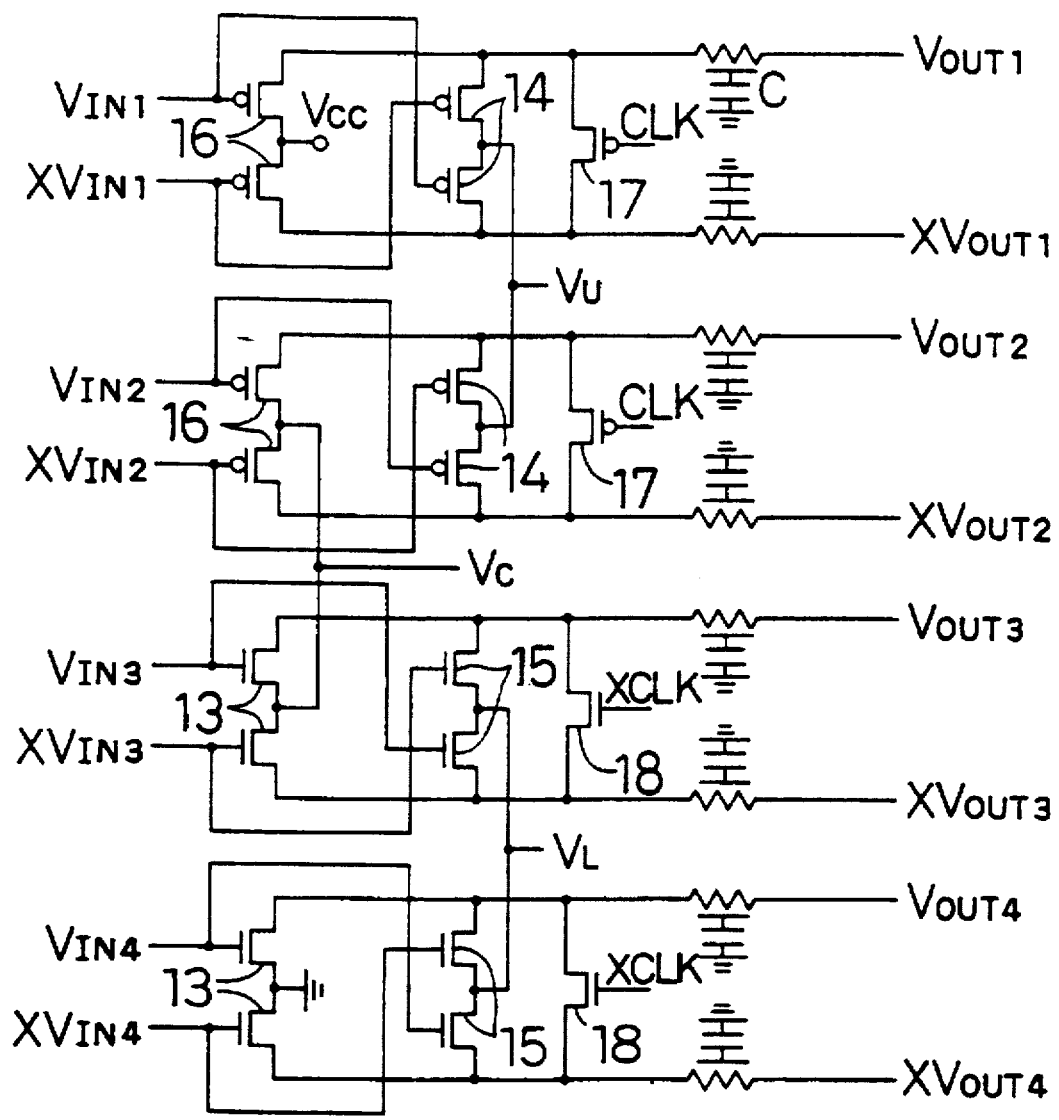
FIG. 25 is a view showing a semiconductor integrated circuit of a seventh embodiment.

The above pair of input elements IDi and XIDi in each block correspond to the complementary pair of inputs Vin and XVin of FIG. 25. The pair of output elements Di and XDi correspond to the complementary pair of output nodes Vout and XVout of FIG. 25. The level setting elements H and L correspond to the intermediate potentials VU, VC, and VL of FIG. 25. The functional circuit F corresponds to the MOSFETs 14 and 15 of FIG. 25.

Figure 34:
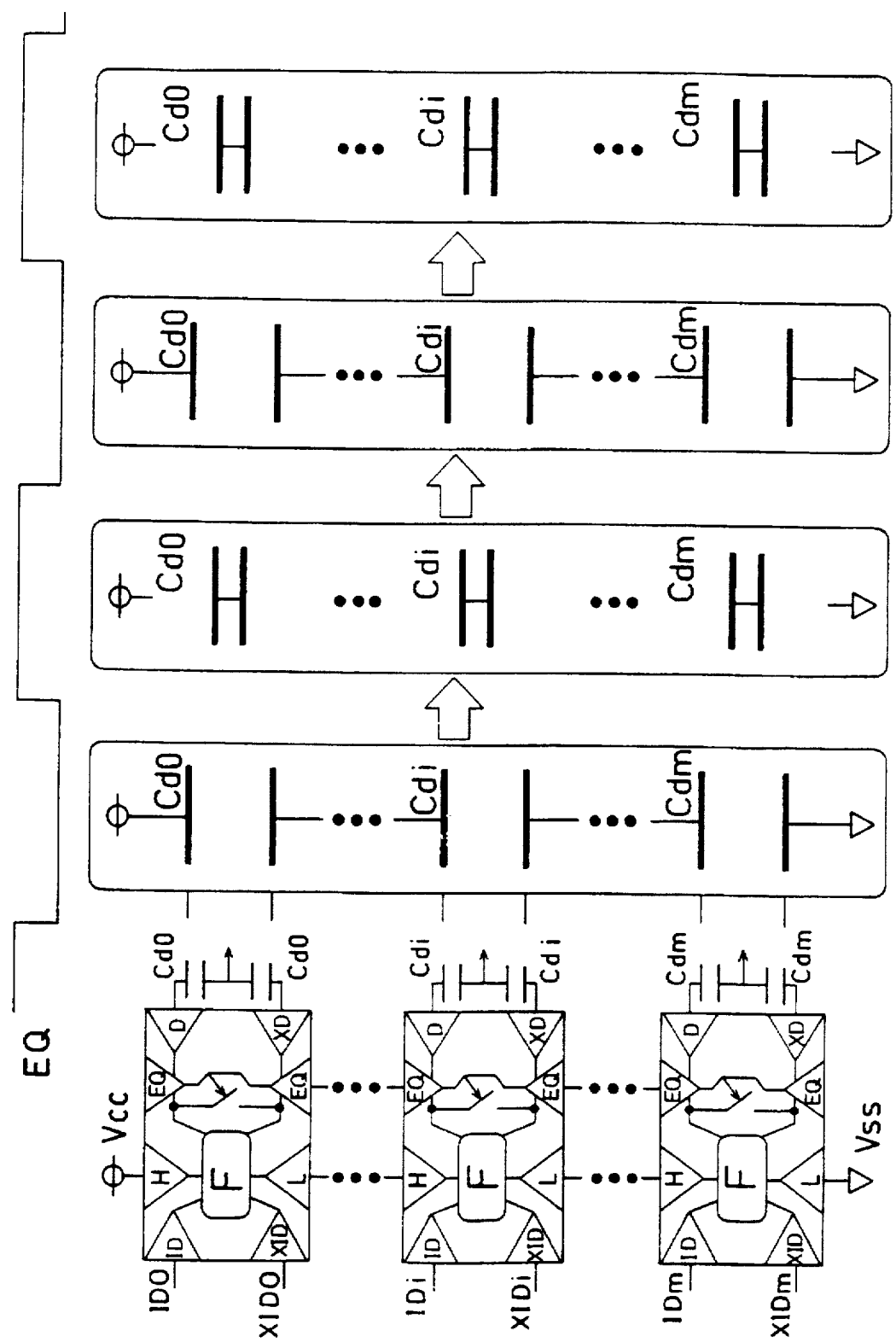
FIG. 34 is a view illustrating the case wherein the level-shifter are connected in series.

In the above seventh embodiment of FIG. 25, the plurality of level-shifters are connected between the power source Vcc and the ground line Vss, as diagrammatically shown in FIG. 34. During the first period of one cycle of the system clock, one of the pair of output lines of a level-shifter and one of the pair of output lines of an adjacent level-shifter are short-circuited and, during the subsequent second period, the other output lines of the respective level-shifters are short-circuited, so that the above operation in one cycle is repeatedly performed. In the present embodiment, in contrast, a plurality of groups each consisting of the respective blocks connected in series are provided (two groups in FIGS. 31 and 35), as shown in FIG. 35, so that these groups and a single level-shifter are connected between the power source Vcc and the ground line Vss.

Figure 35:
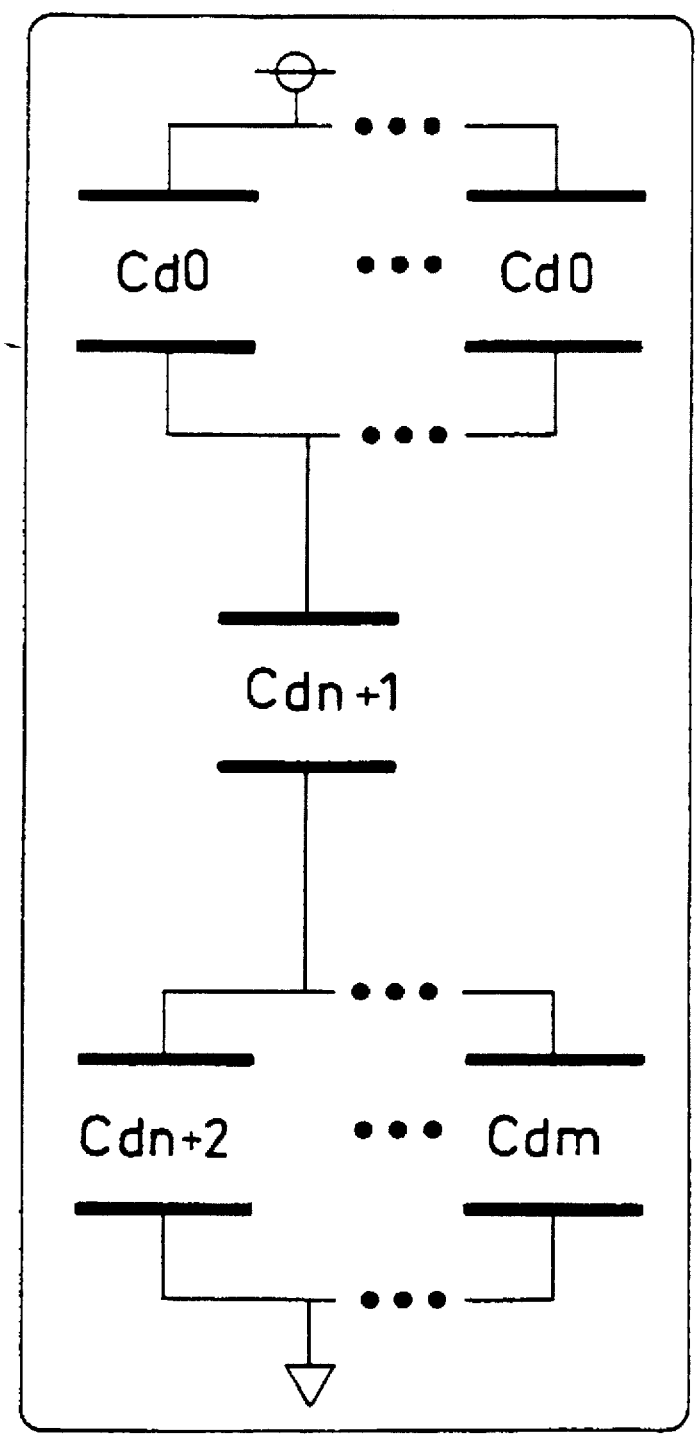
FIG. 35 is a view showing an equivalent circuit to the circuit of FIG. 31.
Figure 36A:
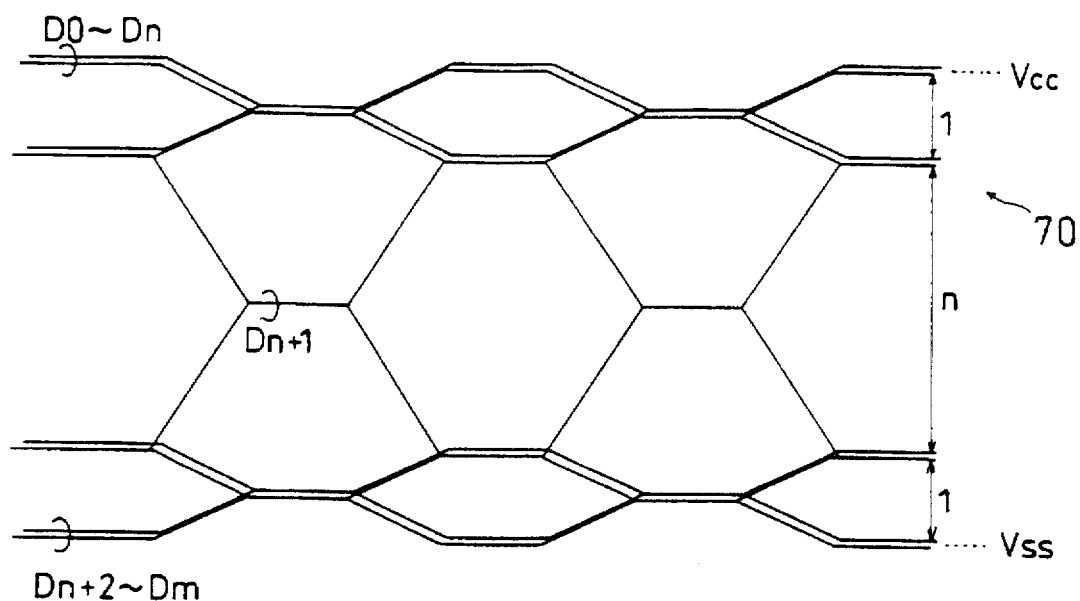
FIG. 36(a) is a view showing a first operating waveform of the eighth embodiment and a variation thereof.
Figure 36B:
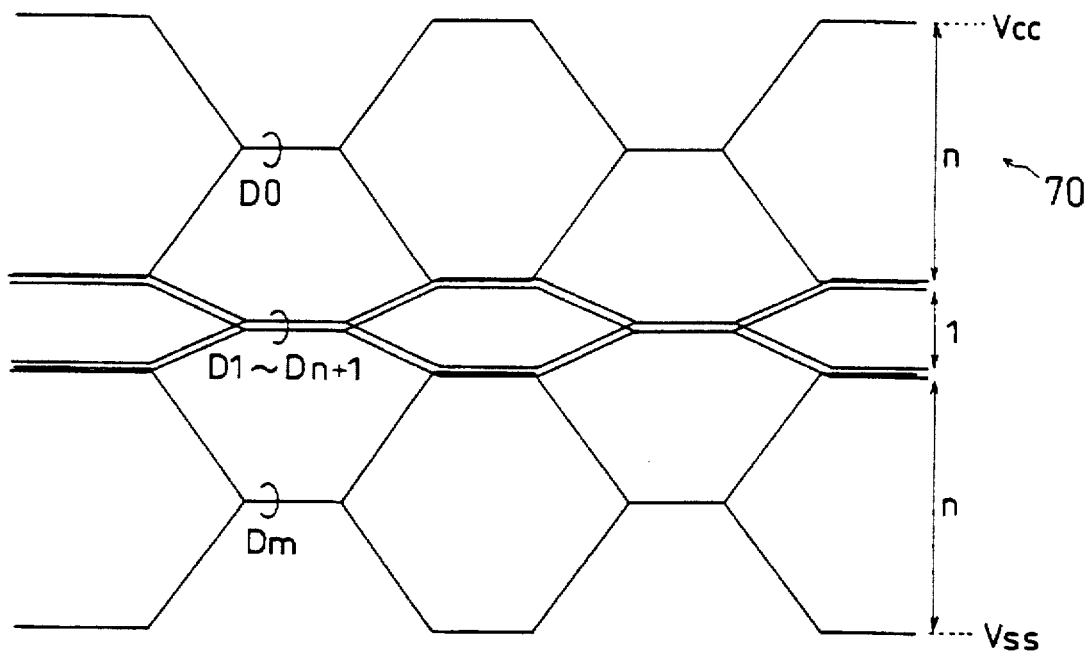
FIG. 36(b) is a view showing a second operating waveform of the eighth embodiment and a variation thereof.

In the structure of the present embodiment, since the plurality of blocks are connected in parallel, the total capacitance of the capacitances Cd0 to Cdn of the pairs of the output lines in the respective blocks becomes nxCdn, as shown in the equivalent circuit of FIG. 35. On the other hand, the total Capacitance of the group with no parallel connection becomes 1xCdn. Accordingly, in the structure of FIG. 31, the potential of the pair of outputs of each block is determined by the capacitance ratio among the groups and, as shown in FIGS. 36(a) and 36(b), an amplitude 70 of 1:n is obtained. Consequently, the blocks connected in parallel operate with a small amplitude, while the individual blocks which are not connected in parallel operate with a large amplitude.

In the above third embodiment shown in FIGS. 7 and 8, it was necessary to additionally provide a capacitance smaller than that of the pair of output lines through layout or process. In the present embodiment, however, it is sufficient to increase the number of blocks connected in series in order to produce a small capacitance. Conversely, in order to produce a large capacitance, it is sufficient to increase the number of blocks connected in parallel. Briefly, it is possible to control the amplitude distribution of the outputs by electrically controlling the effective capacitance.

(Variation of Eighth Embodiment)

Figure 37:
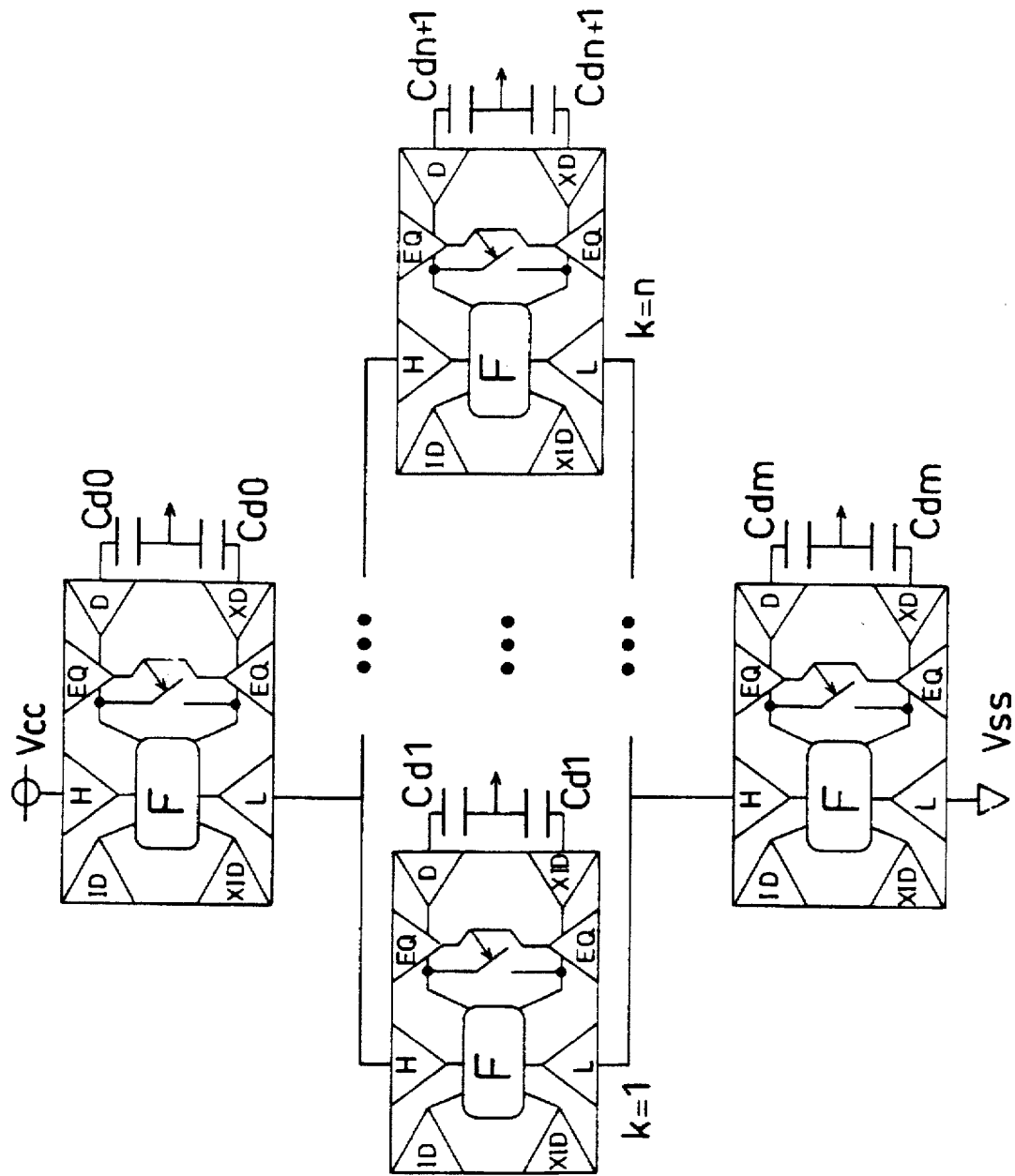
FIG. 37 is a circuit diagram showing a variation of the eighth embodiment.
Figure 38:
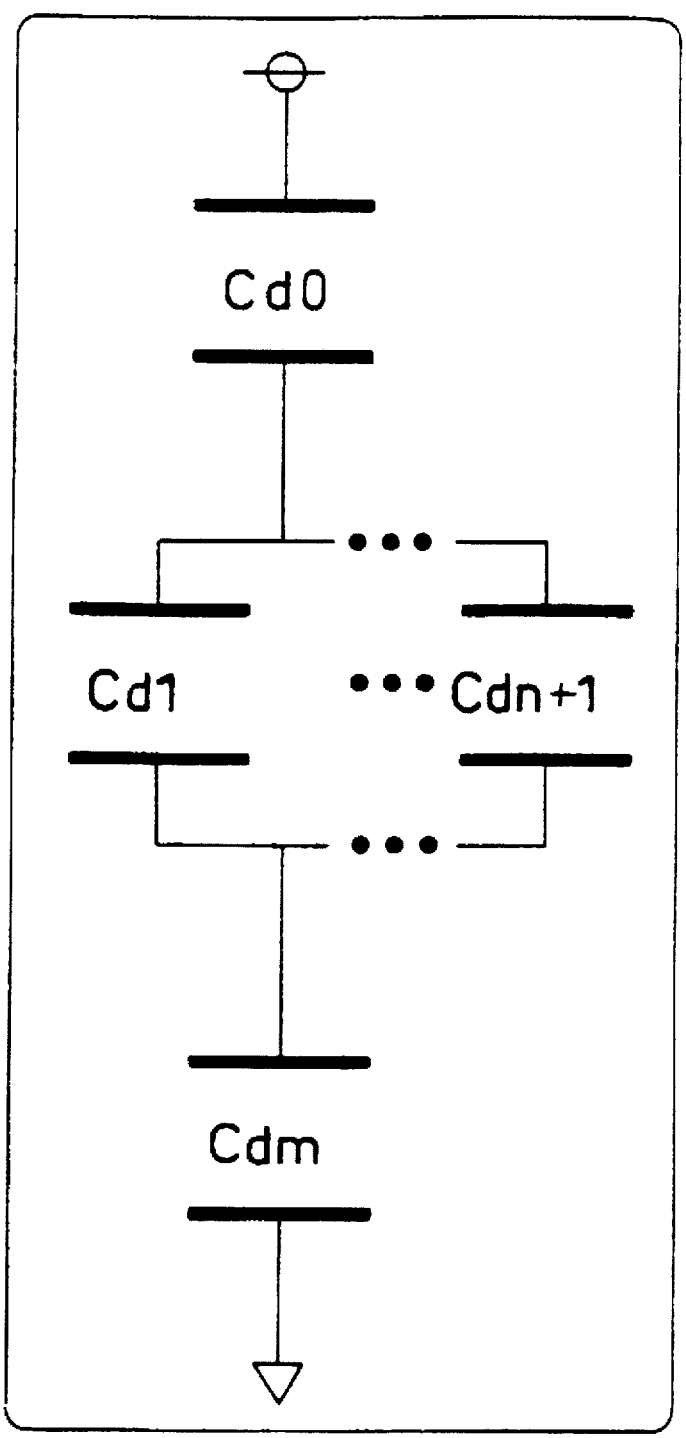
FIG. 38 is a circuit diagram of an equivalent circuit to the circuit of the variation of the eighth embodiment.

FIGS. 37 and 38 show a variation of the eighth embodiment. In the above eighth embodiment, the two groups are disposed in the upper and lower positions with the single block interposed therebetween. Conversely, the present embodiment is constituted so that two independent blocks are disposed in the upper and lower positions with a group interposed therebetween. The waveform of FIG. 6(b) represents the operation of the variation.

(Ninth Embodiment)

Figure 39:
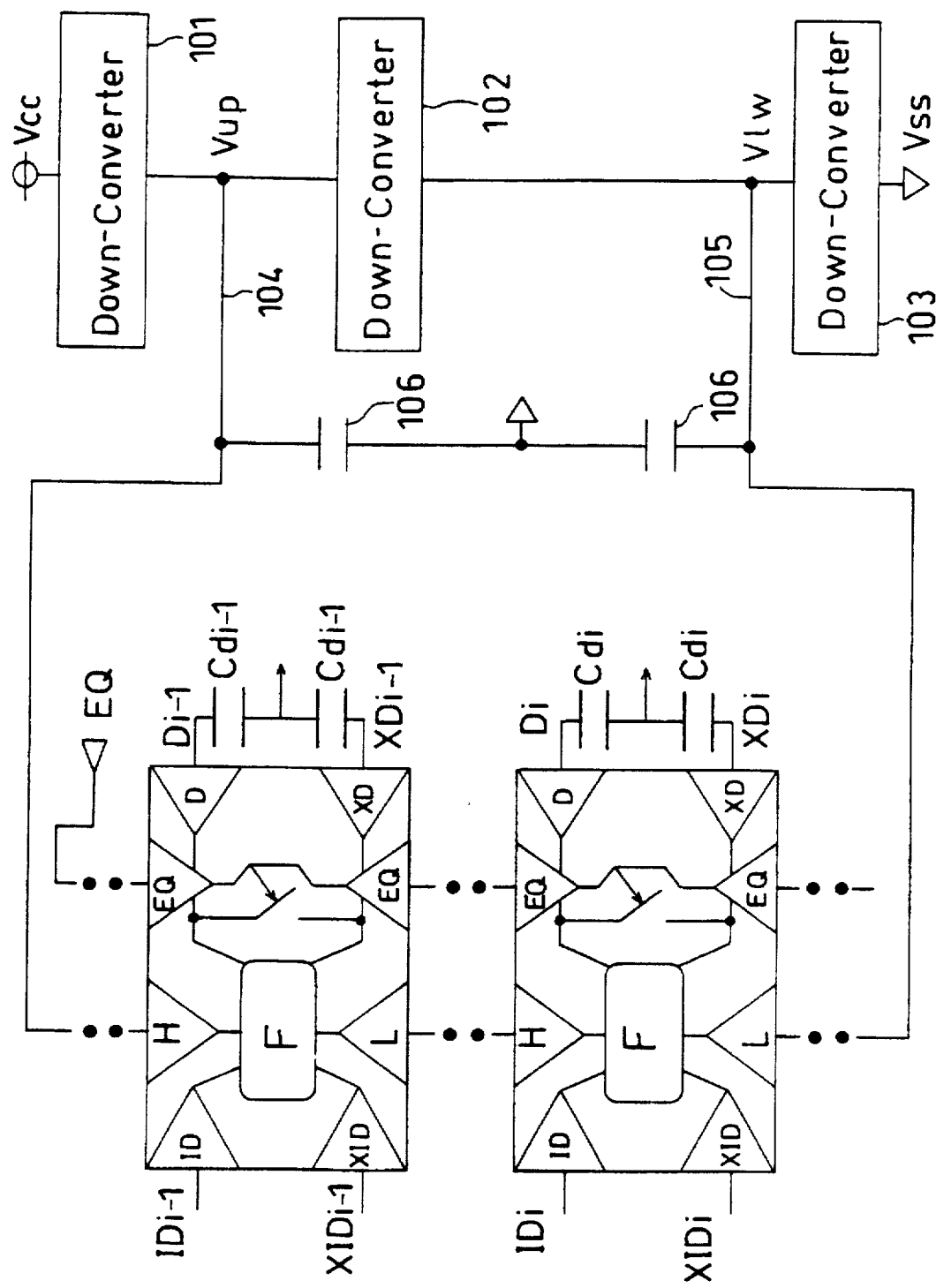
FIG. 39 is a circuit diagram showing a ninth embodiment.
Figure 40:
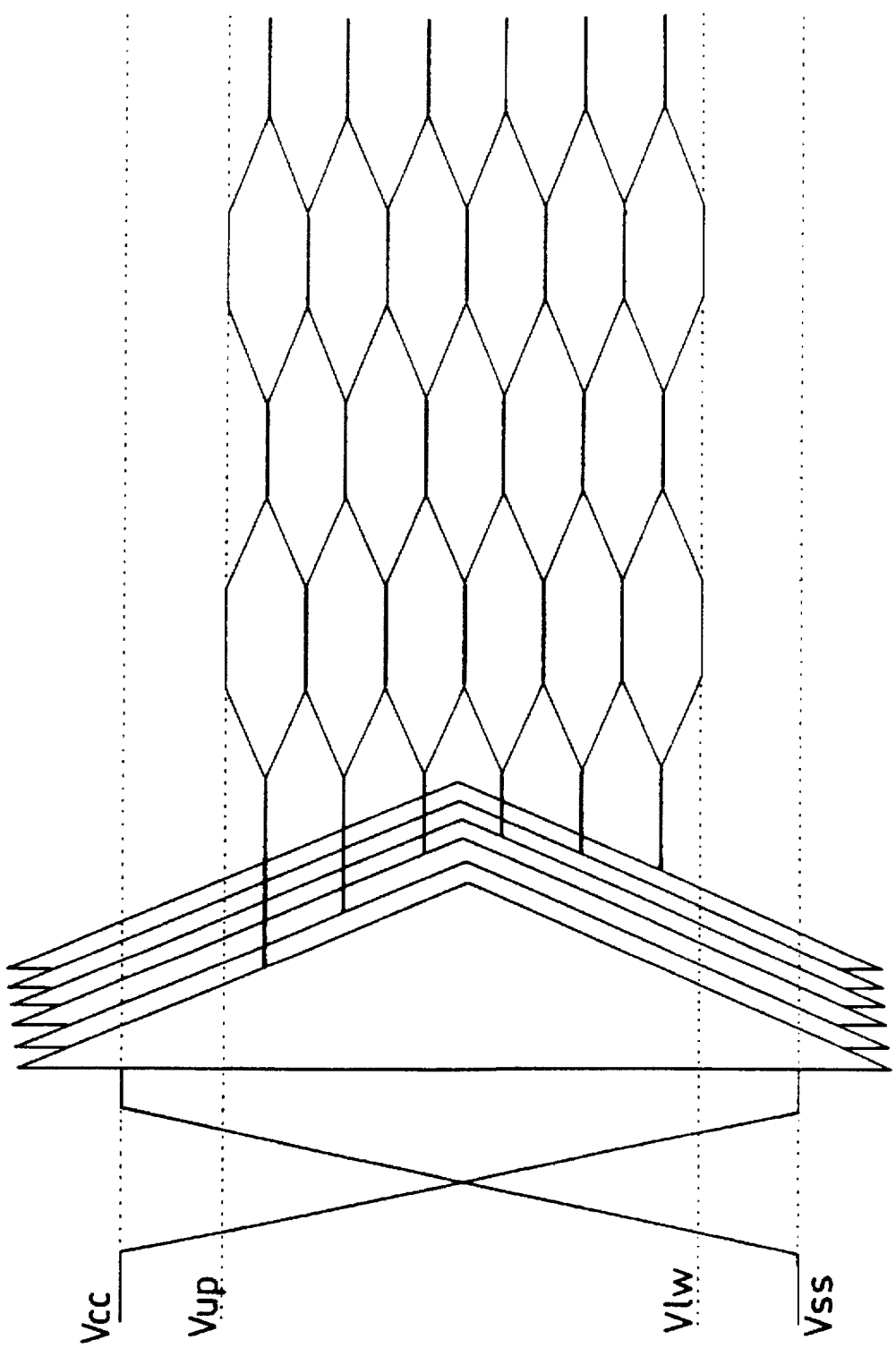
FIG. 40 is a view showing an operating waveform of the circuit of the ninth embodiment.

FIG. 39 shows a ninth embodiment of the present invention. In the drawing, a plurality of blocks are connected in series and first, second, and third down converters 101 to 103 are disposed in the chip between the external power source Vcc and the potential Vss of the ground line. An internal power-source line 104 of the higher potential Vup is withdrawn from between the first and second down converters 101 and 102. An internal power-source line 105 of the lower potential Vlw is withdrawn from between the second and third down converters 102 and 103. Between the internal power-source lines 104 and 105 are disposed two decoupling capacitors 106 each having a comparatively large capacitance. As shown in FIG. 40, however, the input to the circuit has a full amplitude (Vcc-Vss), while the output amplitude has a potential obtained by equally dividing the potential between the higher potential Vup and the lower potential Vlw by a plural number (six in the drawing).

In the present embodiment, the higher potential Vup and lower potential Vlw internally generated by means of the three down converters 101 to 103 are stabilized by the decoupling capacitors 106 each having a large capacitance, so that, compared with the case where the plurality of blocks in series are connected directly between the external power source and the ground line, the problem of bounce of the potential in the external power source and of the potential on the ground line due to noise can be solved more satisfactorily.

Although the present embodiment has used the three down converters 101 to 103 to reduce the external power-source voltage, it will easily be appreciated that the present invention can similarly be applied to the case where the external power-source voltage is raised so that the resulting voltage is used as the internal power-source voltage.

(Variation of Ninth Embodiment)

Figure 56:
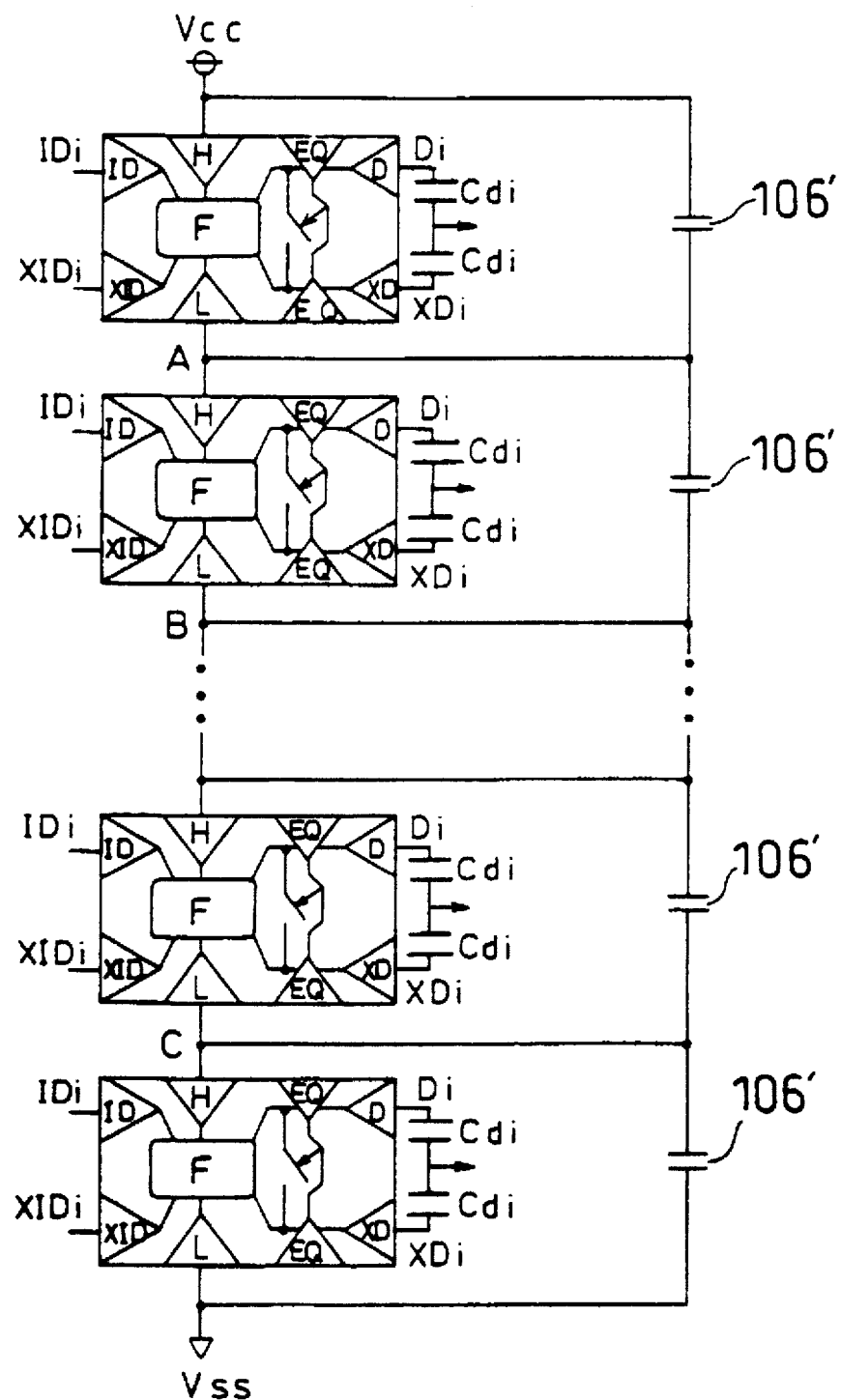
FIG. 56 is a view showing the overall structure of circuit of a first variation of the ninth embodiment.

FIG. 56 shows a fist variation of the ninth embodiment of the present invention. Unlike the above ninth embodiment in which the two decoupling capacitors 106 are interposed between the internal power-source line 104 of the higher potential Vup and the internal power-source line 105 of the lower potential Vlw, the present variation is constituted so that, in the case of connecting the external power-source line and the ground line directly to a plurality of blocks connected in series, decoupling capacitors 106' which are equal in number to the blocks connected in series are connected directly between the above external power-source line and the ground line, thereby connecting the decoupling capacitors 106' to the nodes A, B, . . . C between the respective blocks.

Figure 57:
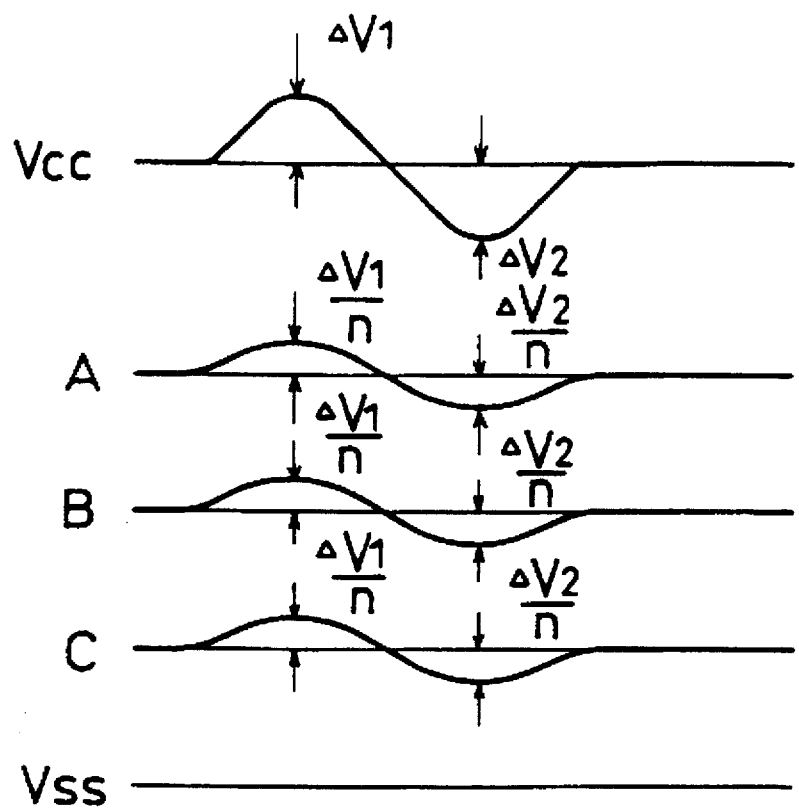
FIG. 57 is a view illustrating the operation of the first variation of the ninth embodiment.

Thus, as shown in FIG. 57, even when noises having values of ΔV1 and ΔV2 occur in the voltage Vcc of the external power source in the present embodiment, the voltages of the noises are divided by the decoupling capacitors 106', so that only noises having lower values of ΔV1/n and ΔV2/n obtained through voltage division by the number of the coupling capacitors 106' . . . affect the respective blocks, so that the problem of bounce of the potential in the external power source and of the potential on the ground line due to noises can be solved more satisfactorily.

(Second Variation of Ninth Embodiment)

Figure 58:
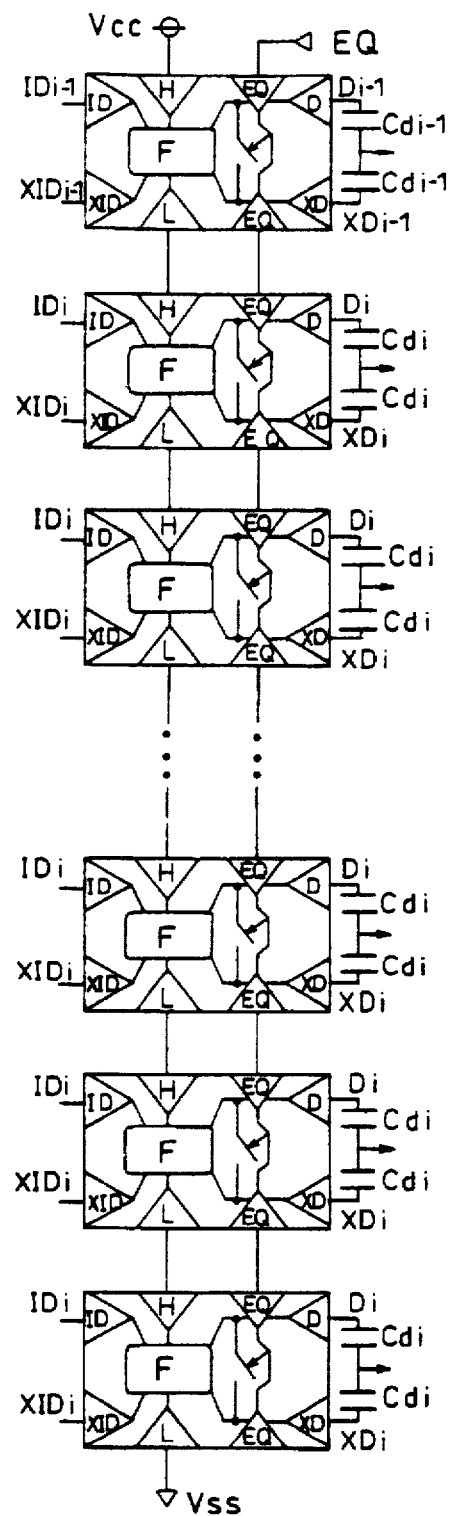
FIG. 58 is a view showing the overall structure of a circuit of a second variation of the ninth embodiment.

FIG. 58 shows a second variation of a ninth embodiment of the present invention. Unlike the above ninth embodiment in which the influence of a noise in the external power source is suppressed by the decoupling capacitors 106, the present variation is constituted so that a plurality of blocks in series are connected directly to the external power source and to the ground line, but the outputs from the blocks affected by noises in the external power source and on the ground line are not used as signals.

That is, in FIG. 58, the number of the blocks connected in series is set to 10, which is larger than the number (e.g., 8 bits) of required sets of parallel data by 2. Of the ten blocks, the output from the block on the uppermost stage to which the power source Vcc is applied and the output from the block on the lowermost stage connected to the ground line of the voltage Vs(0 V) are not used as the above parallel data.

Figure 59:
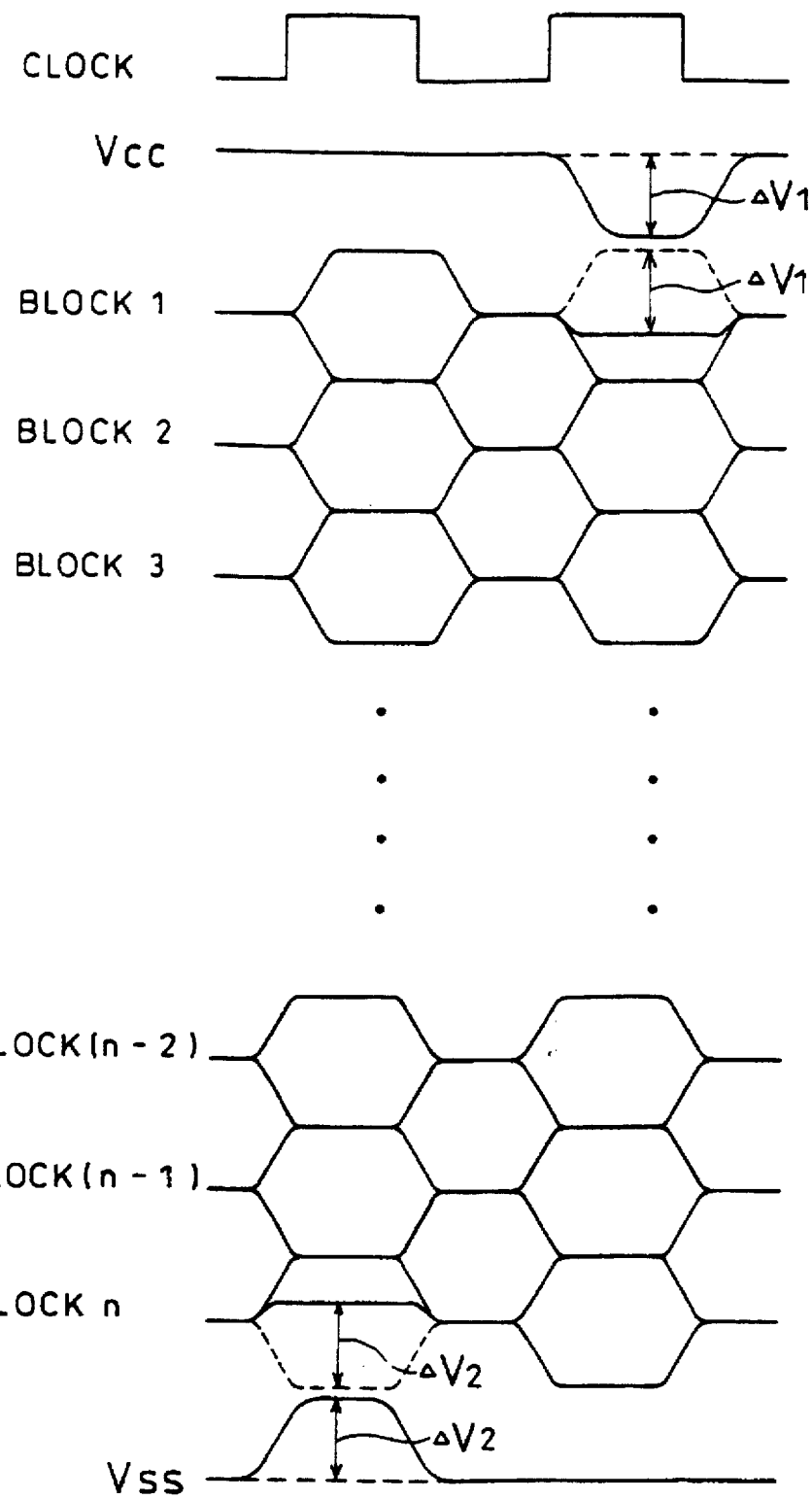
FIG. 59 is a view illustrating the operation of the second variation of the ninth embodiment.

Thus, in the present variation, even when noises occur in the power-source voltage Vcc and in the ground-line voltage Vss as shown in FIG. 59, only the block on the uppermost stage and the block on the lowermost stage are directly influenced, while the outputs from the intermediate blocks are not influenced by the above noises. Consequently, the parallel data can be outputted without being affected by the noises.

(Tenth Embodiment)

Figure 41:
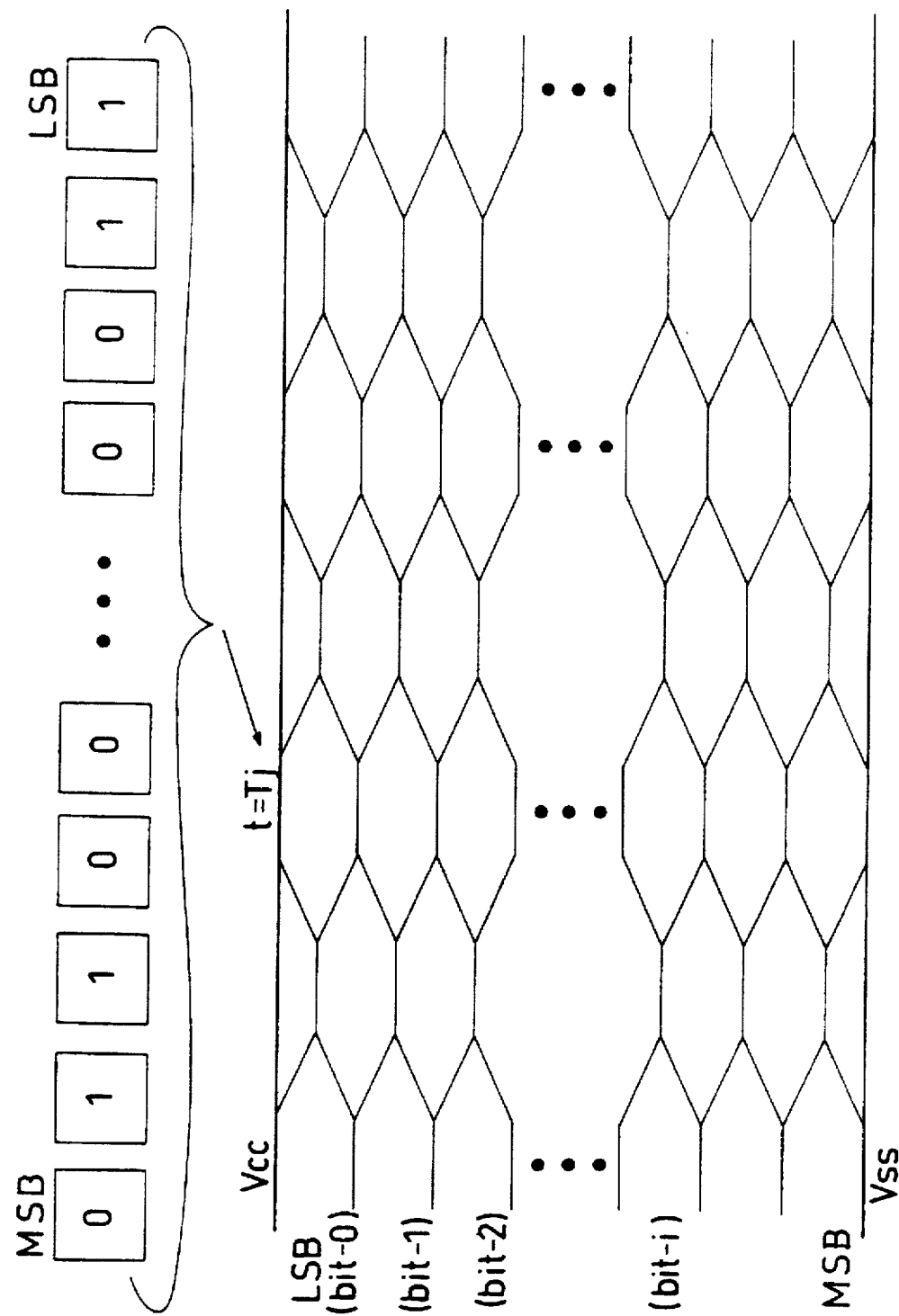
FIG. 41 is a view illustrating a circuit of a tenth embodiment.

FIG. 41 shows a tenth embodiment of the present invention. The tenth embodiment in the drawing is constituted so that, in the case where a 0 bit (the least significant bit (LSB)) to the most significant bit (MSB) are allocated to the plurality of level-shifters connected in series between the power source Vcc and the ground line (first power source and second power source), the least significant bit LSB which varies most frequently is allocated to the level-shifter on the uppermost stage from which the output line is connected directly to the power source line.

Figure 42:
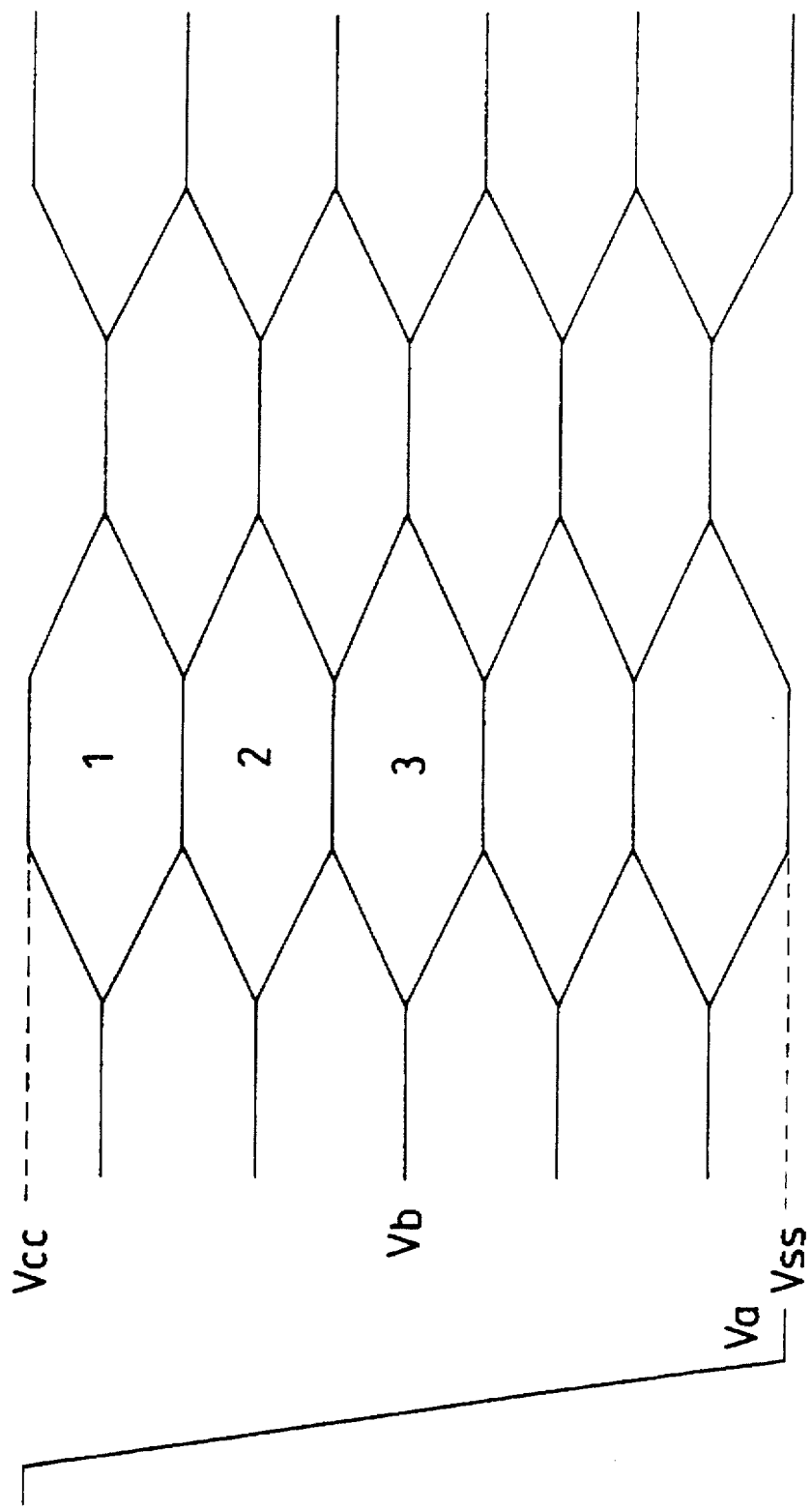
FIG. 42 is a view illustrating the operation of the circuit of the tenth embodiment.
Figure 43A:
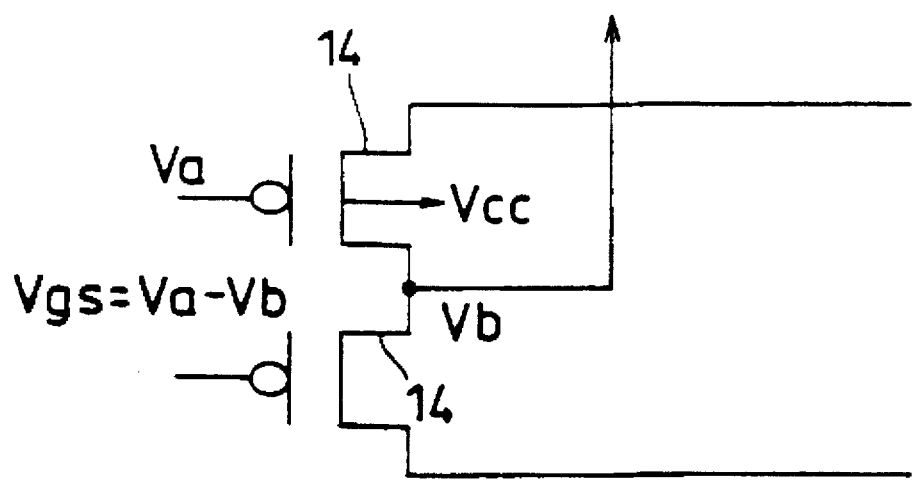
FIG. 43(a) is a circuit diagram showing a charge redistributing means composed of two MOSFETs.

Thus, as shown in FIGS. 42 and 43, the present embodiment is constituted so that, as the level-shifter has its output potential in a position further away from the power source Vcc, the substrate bias voltage Vbs (Vbs=Vcc-Vb) of the two NMOSFETs 14 constituting the charge redistributing means in FIG. 25 becomes larger. Accordingly, the substrate bias voltage becomes larger with respect to the waveform 3 than with respect to the waveform 1, as shown in FIG. 42.

Figure 43B:
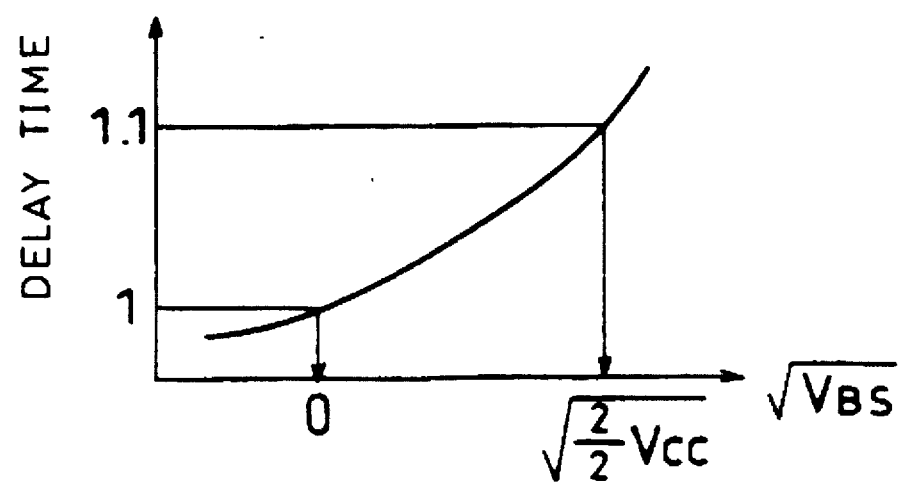
FIG. 43(b) is a view illustrating the characteristic of the operation delay time of the MOSFET.

On the other hand, the level-shifter constituting the least significant bit LSB is connected directly to the power source line in consideration of the increasing operation delay time of the MOSFET 14 as shown in FIG. 43(b), thus minimizing the delay time of the level-shifter on the uppermost stage of all the level-shifters.

Thus, in the present embodiment, in the case of incrementing an address, e.g., the least significant bit varies most frequently, while the upper bits vary less frequently. However, since stable operation of the level-shifter in the least significant bit is ensured, the entire circuit can operate more stably.

(Eleventh Embodiment)

Figure 44:
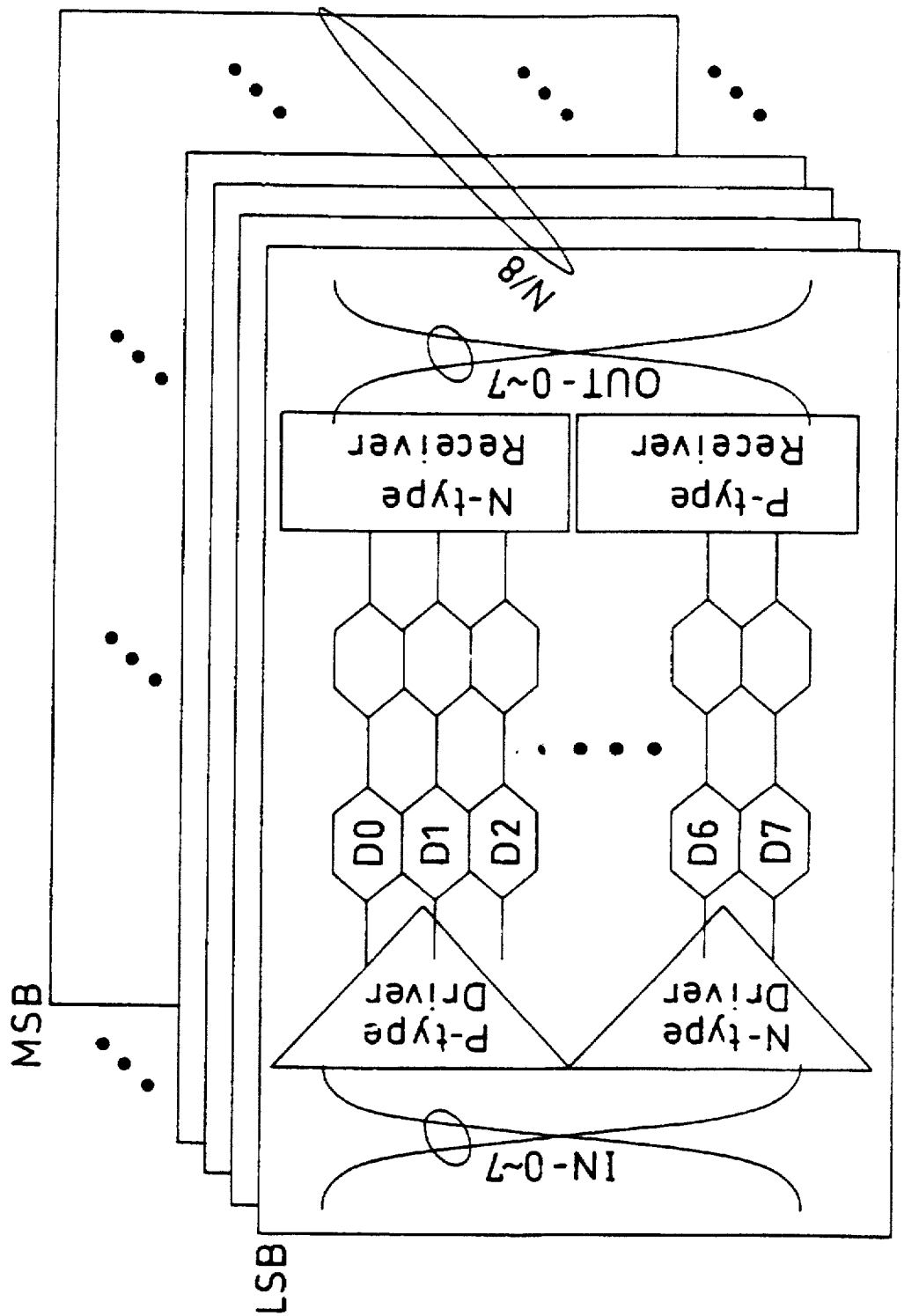
FIG. 44 is a view showing a circuit of an eleventh embodiment.

FIG. 44 shows an eleventh embodiment of the present invention. The structure shown in the drawing is used in the case where the memory is connected to a graphic controller with N bit lines. For example, very many bits of 512 bits are divided into 64 groups of 8 bits. In this case, when one set of data is represented in 8 digits (8 bits), the same digits of four sets of data form one group.

Figure 45:
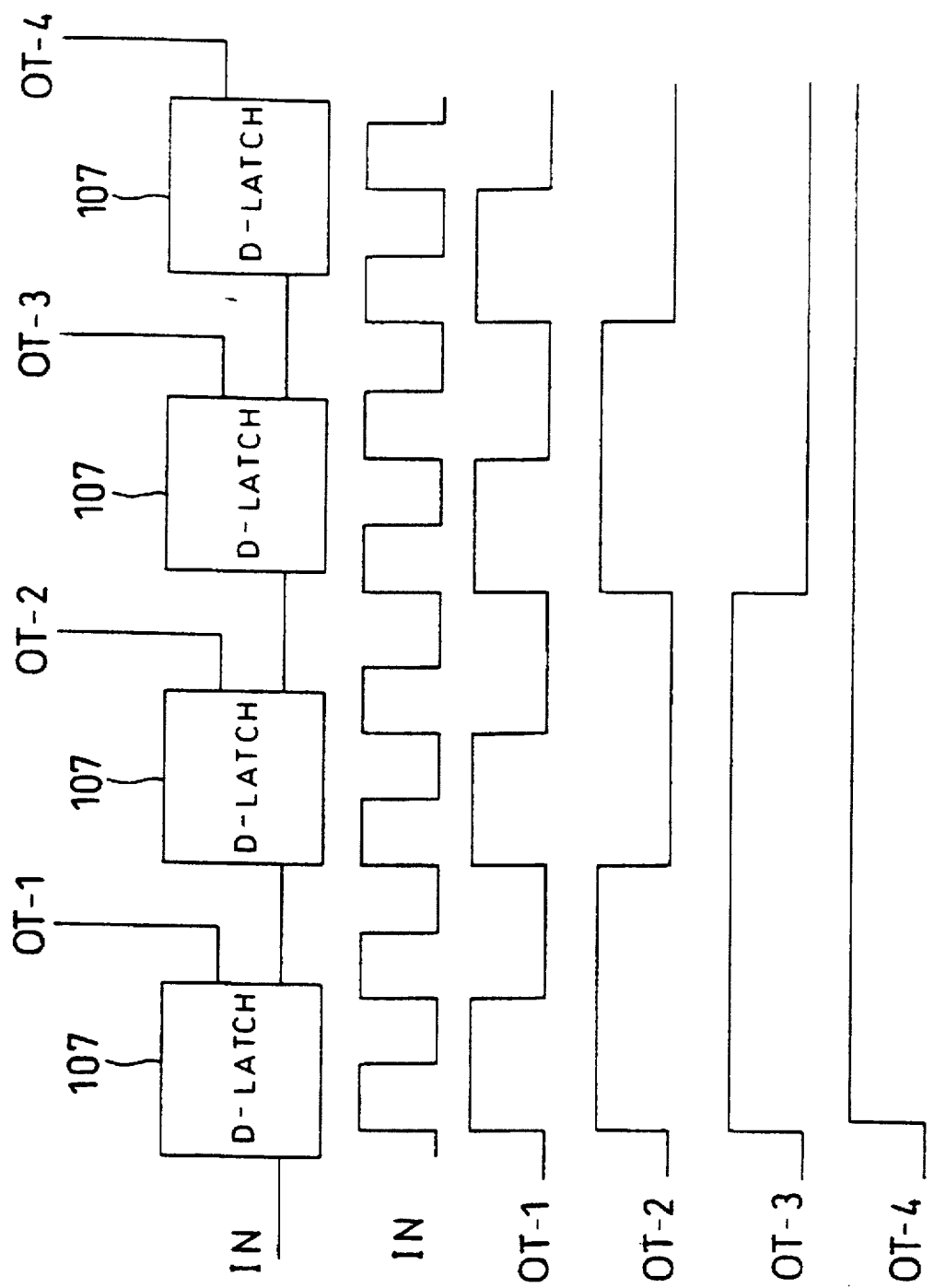
FIG. 45 is a view showing the structure of a frequency divider.
Figure 46:
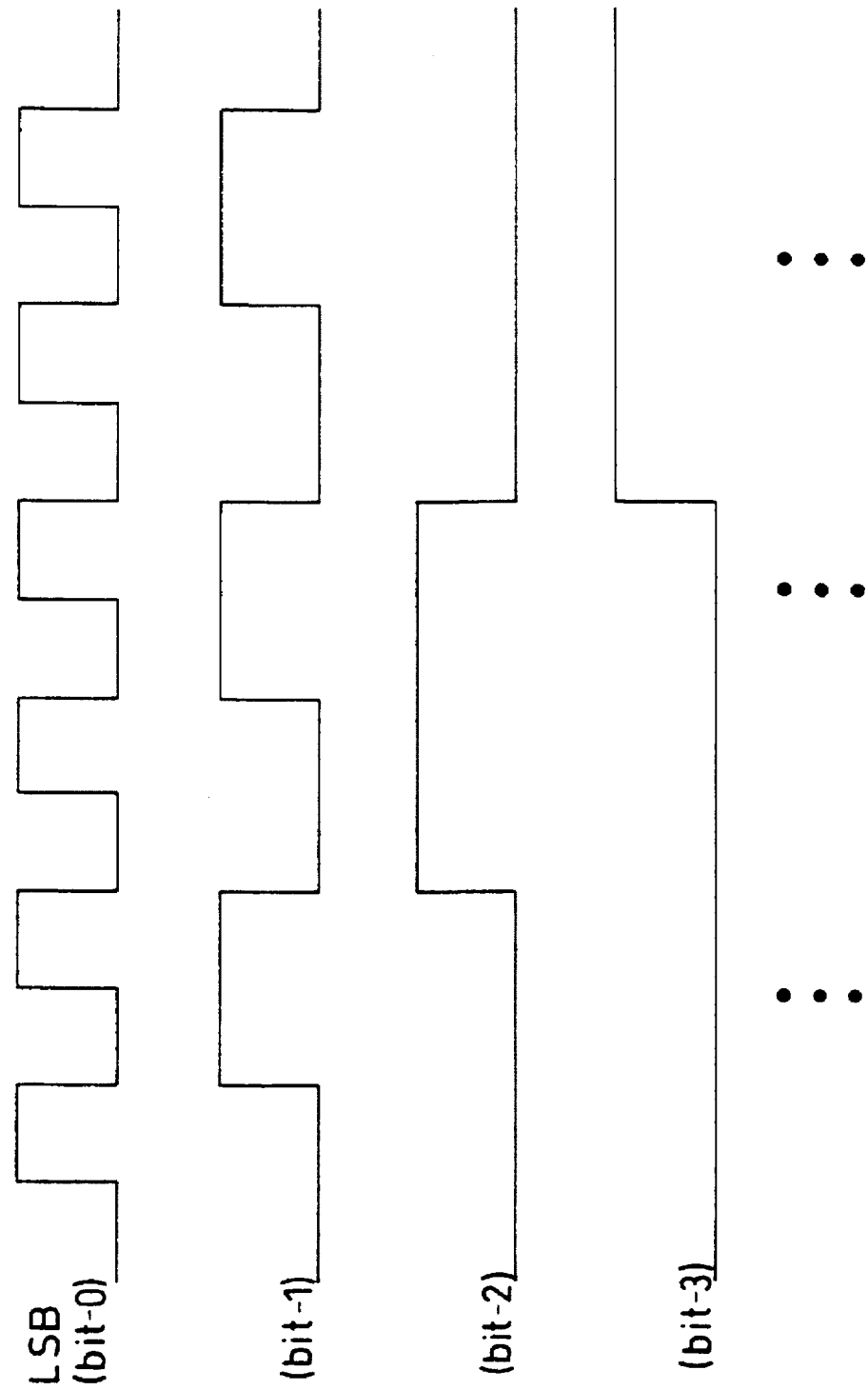
FIG. 46 is a view showing operating frequencies of the individual groups of the eleventh embodiment.
Figure 47:
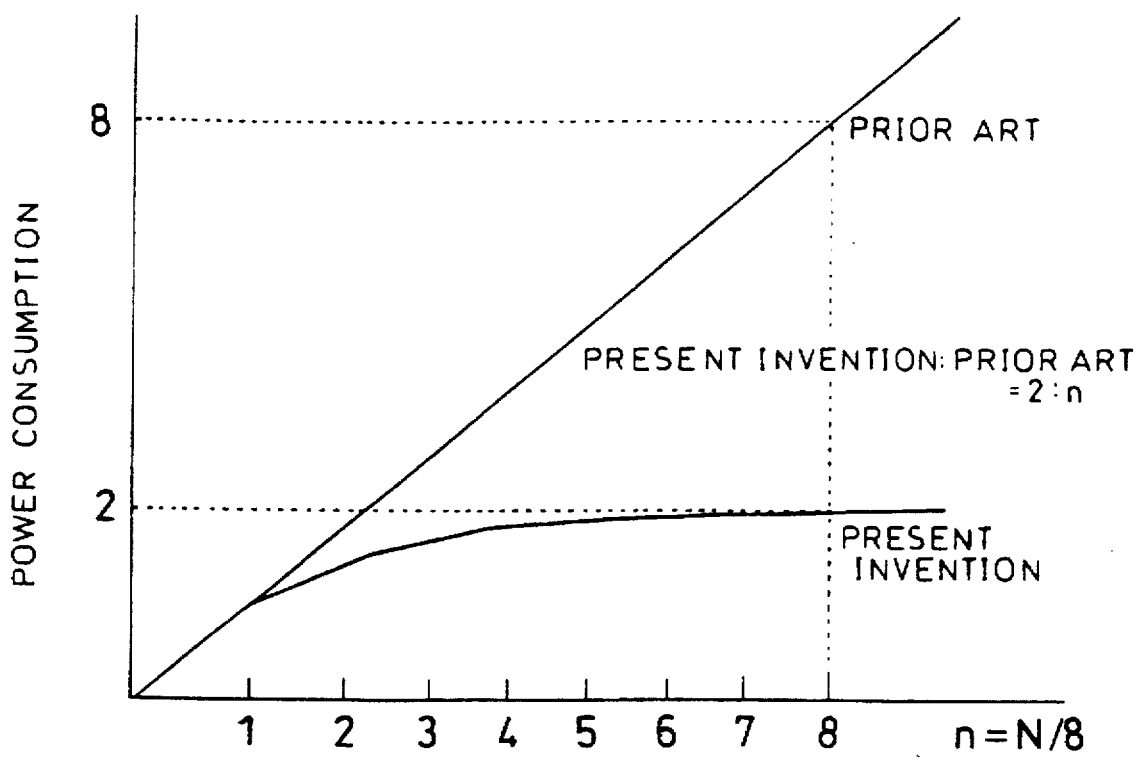
FIG. 47 is a view showing the effect of the eleventh embodiment.

FIG. 45 shows a frequency divider used to drive the above very many bits. The frequency divider of FIG. 45 consists of a plurality of (four in the drawing) D-latch circuits 107 in cascade and produces outputs of OT-1, OT-2, OT-3, and OT-4 which are obtained by multiplying the frequency of the input IN by power-of-2 numbers on the respective stages. The output OT-1 from the above frequency divider is used as an operating signal for the group consisting of eight least significant bits LSB. The output OT-2 is used as an operating signal for the group consisting of eight bits in positions one-bit higher than the least significant bits LSB. Likewise, the output OT-3 is used as an operating signal for the group consisting of eight bits in positions two-bit higher than the least significant bits LSB and the output OT-4 is used as an operating signal for the group consisting of eight bits in positions three-bit higher than the least significant bits LSB.

Thus, in the present embodiment, each group has a different operating frequency. Since the group consisting of the most significant bits operates only with a frequency which is 1/64 the system clock, the ratio of the power consumption of the present embodiment to that of the prior art is increased to n:2 as the number n of groups increases. Consequently, power consumption can be reduced significantly.

Although each of the groups includes the same number of bits in the present embodiment, different groups may include different numbers of bits.

(Twelfth Embodiment)

Figure 48:
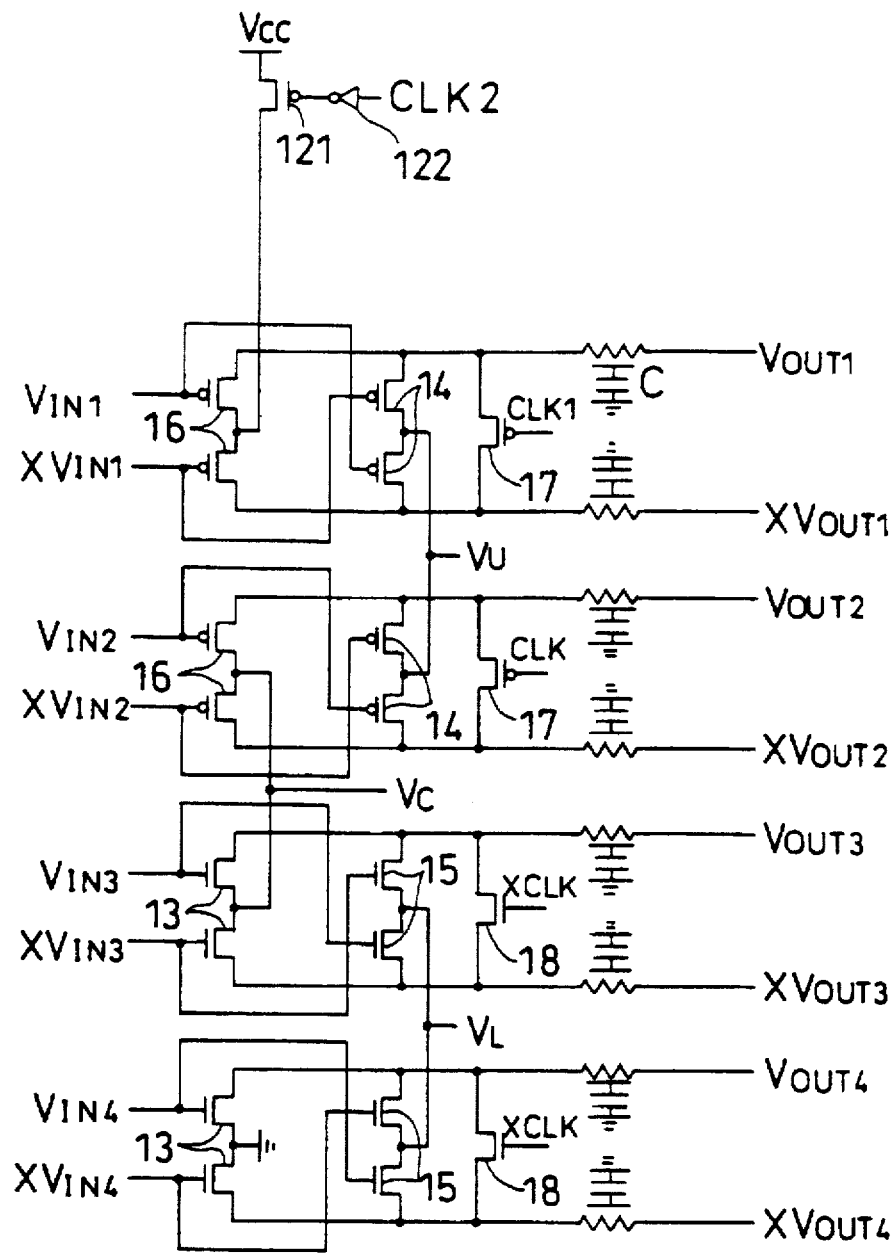
FIG. 48 is a view showing a circuit of a twelfth embodiment.

FIG. 48 shows a twelfth embodiment of the present invention. In the drawing, the above clock CLK of FIG. 25 is used as a first clock CLK1 and a P-type MOSFET 121 is additionally disposed between the P-type MOSFET 16 and the power source Vcc, so that the above MOSFET 121 is controlled by a second clock CLK2 via an inverter 122. As for the other structure, it is the same as that of FIG. 25, so that the description thereof will be omitted by providing like reference numerals to like components.

The above second clock CLK2 has a frequency double the frequency of the above first clock CLK1. As a structure for generating the above second clock CLK2, a frequency divider having the D-latch circuit 107 shown in FIG. 45 is used.

Figure 49:
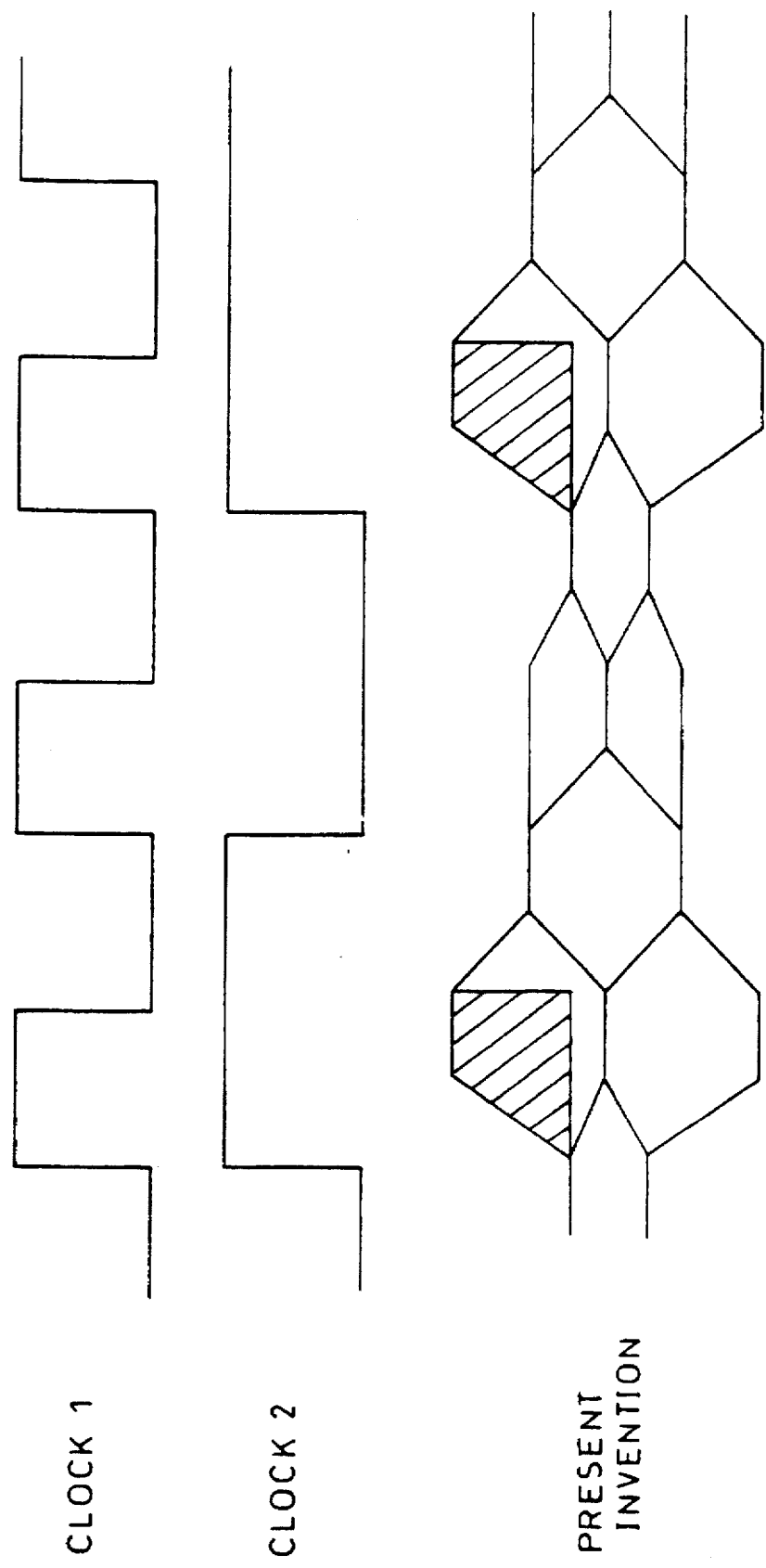
FIG. 49 is a view illustrating the operation of the twelfth embodiment.
Figure 50:
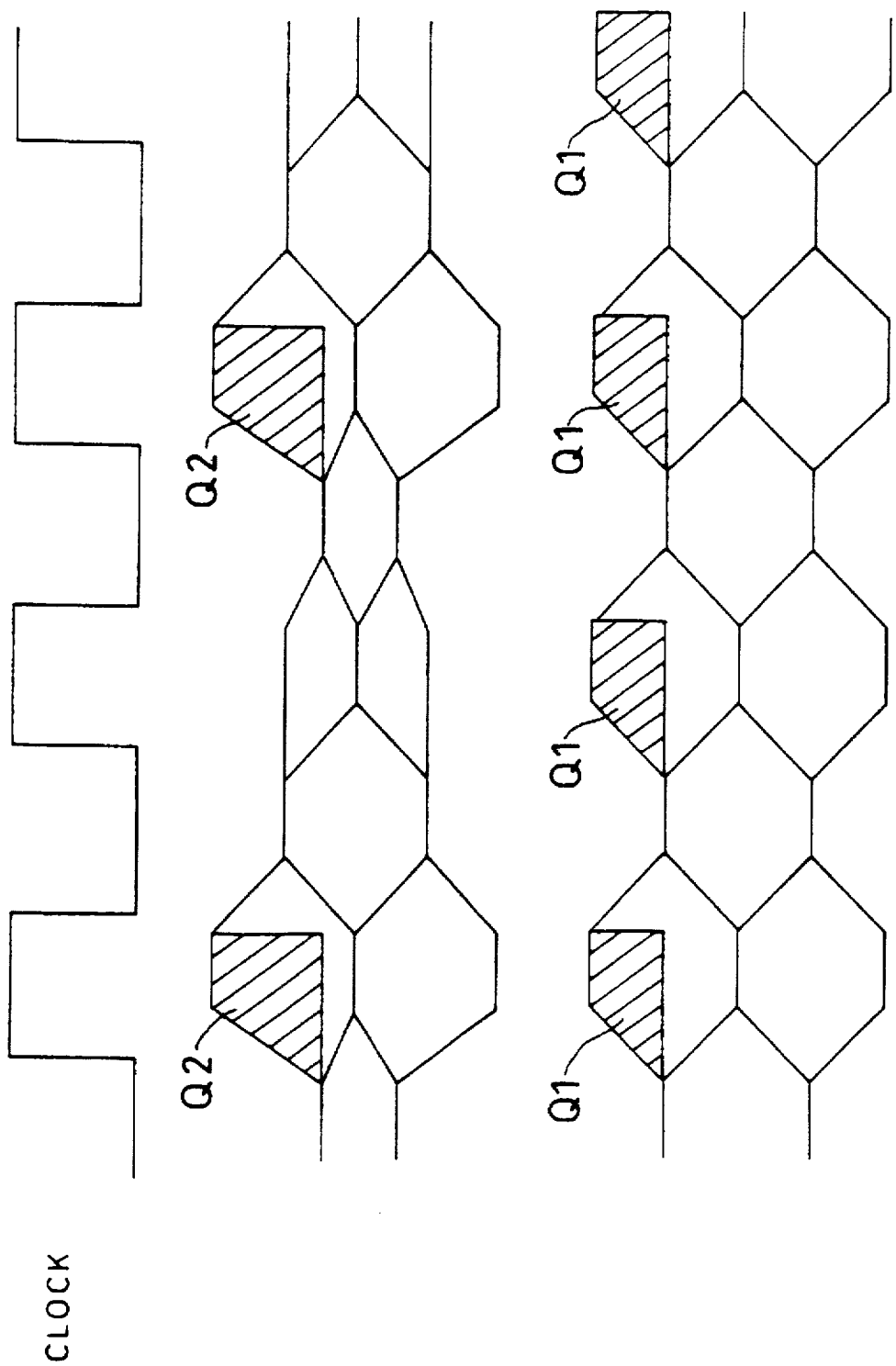
FIG. 50 is a view showing the operation of the twelfth embodiment and the operation of the seventh embodiment for comparison.

Thus, in the present embodiment, a charge Q1 from the power source Vcc is not supplied every cycle to the level-shifter which is connected closest to the power source Vcc as shown in FIG. 50, but a charge Q2 is supplied from the power source every two cycle. The charge Q2 supplied from the power source Vcc is represented by hatched portions in FIGS. 49 and 50. As a result, the level-shifter is connected to the power source Vcc during the period of t=T1, while it is disconnected from the power source Vcc during the subsequent period of t=T2 as shown in FIGS. 49 and 50, so that the total amount of charge during the two periods is represented by the following inequality:

$$(Q1+Q1) > Q2 + ``0"$$

where $Q2 = 1.5 \times Q1$.

As can be seen from the above inequality, a reduction in power consumption can be achieved in the present embodiment. It will easily be appreciated from the operating waveform that the amplitude value is reduced when a charge is not supplied. However, since a pair of differential output lines are used, a high margin can be ensured.

(Thirteenth Embodiment)

Figure 51:
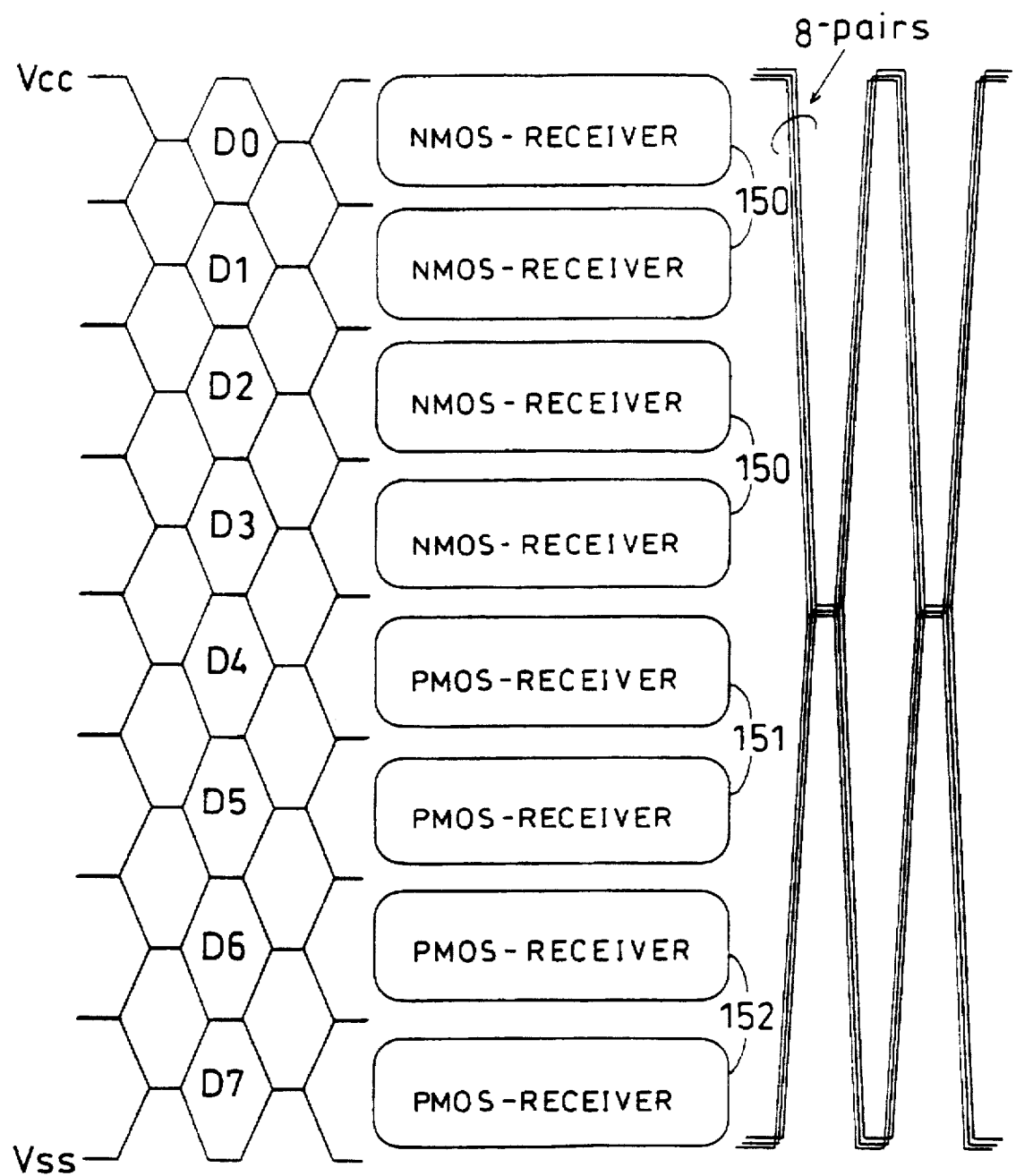
FIG. 51 is a view showing a principal portion of a circuit of a thirteenth embodiment.
Figure 52:
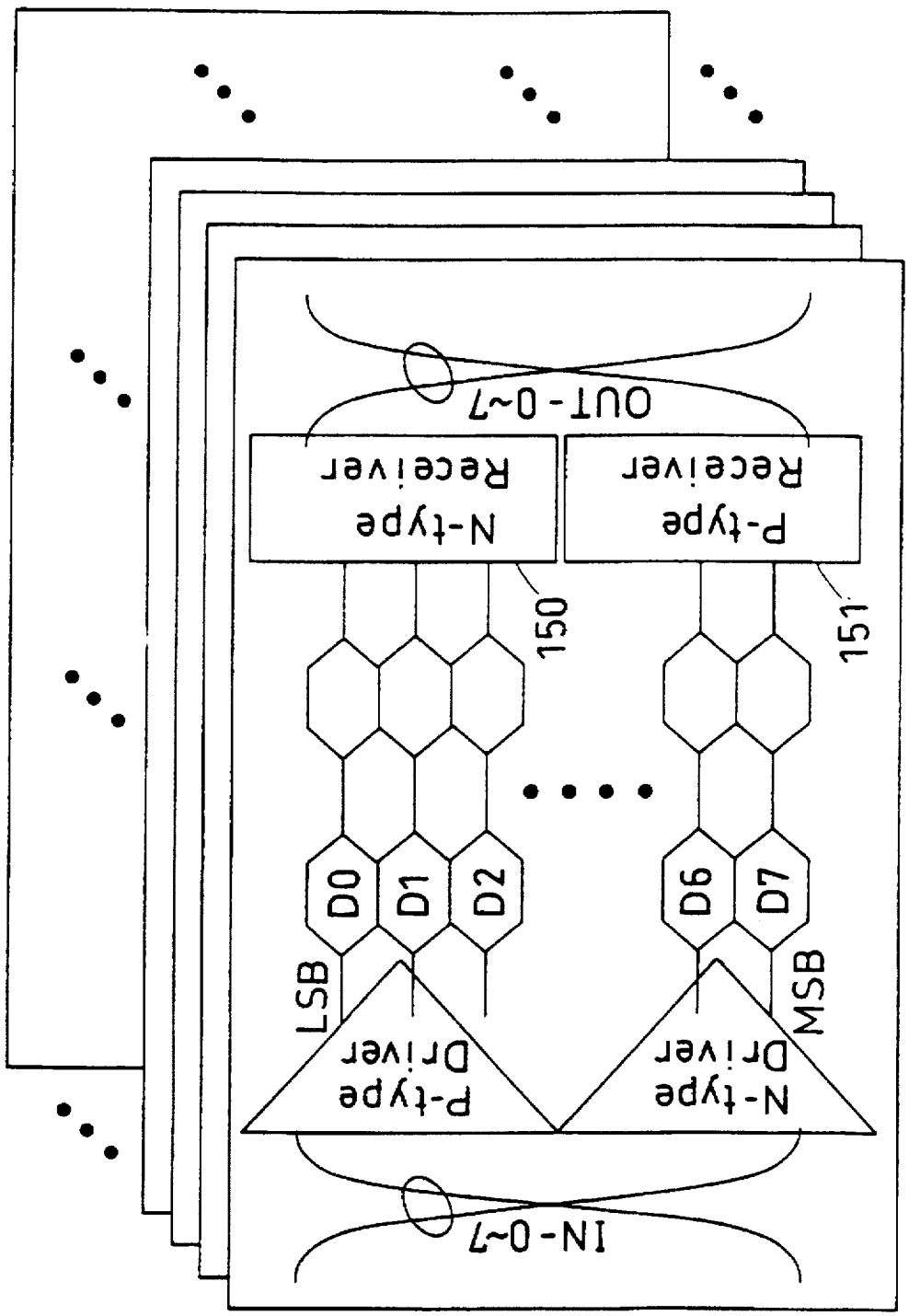
FIG. 52 is a view showing the overall structure of the circuit of the thirteenth embodiment.
Figure 53:
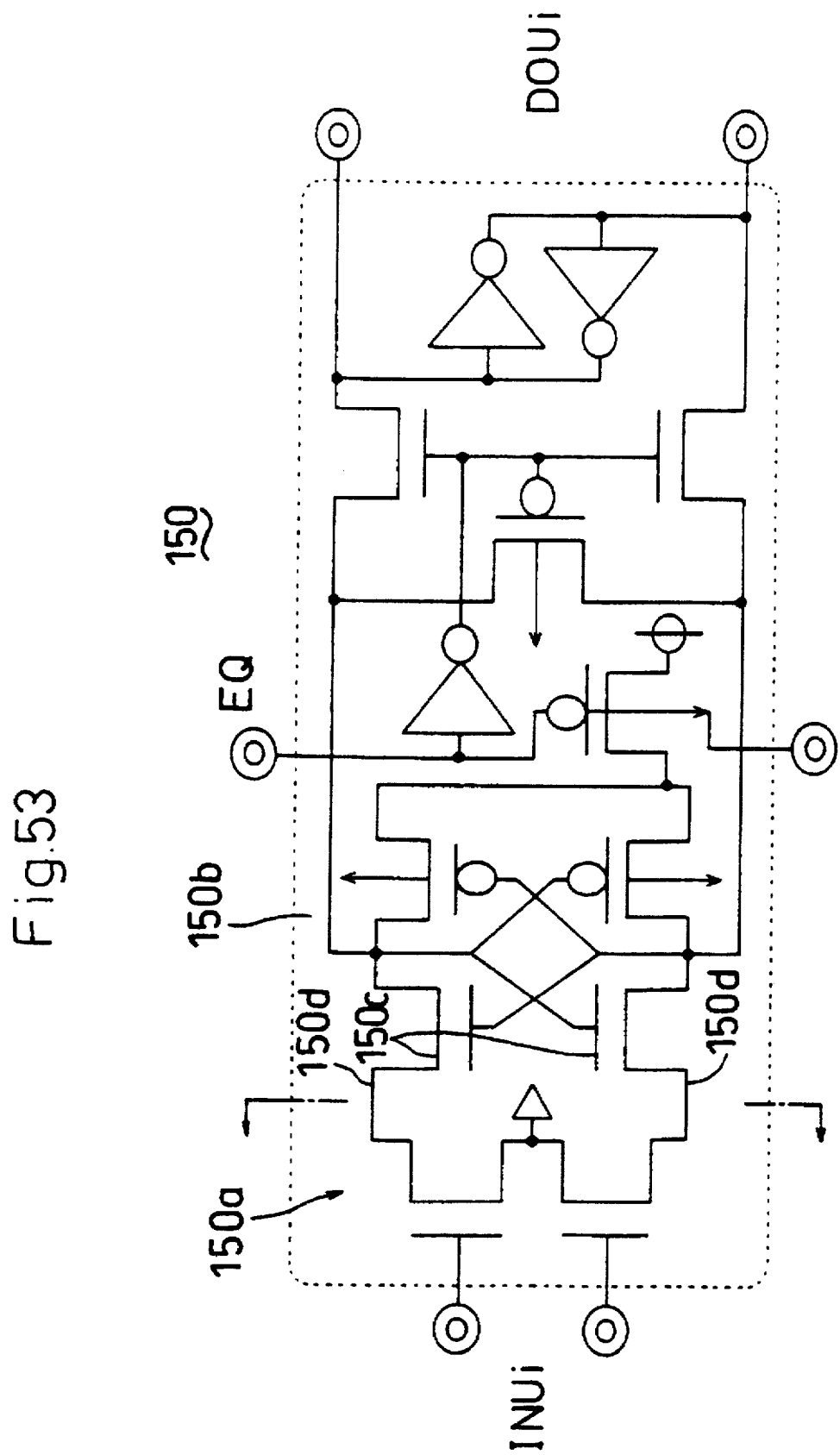
FIG. 53 is a view showing the internal structure of a potential detecting circuit composed of an N-type MOSFET.
Figure 54:
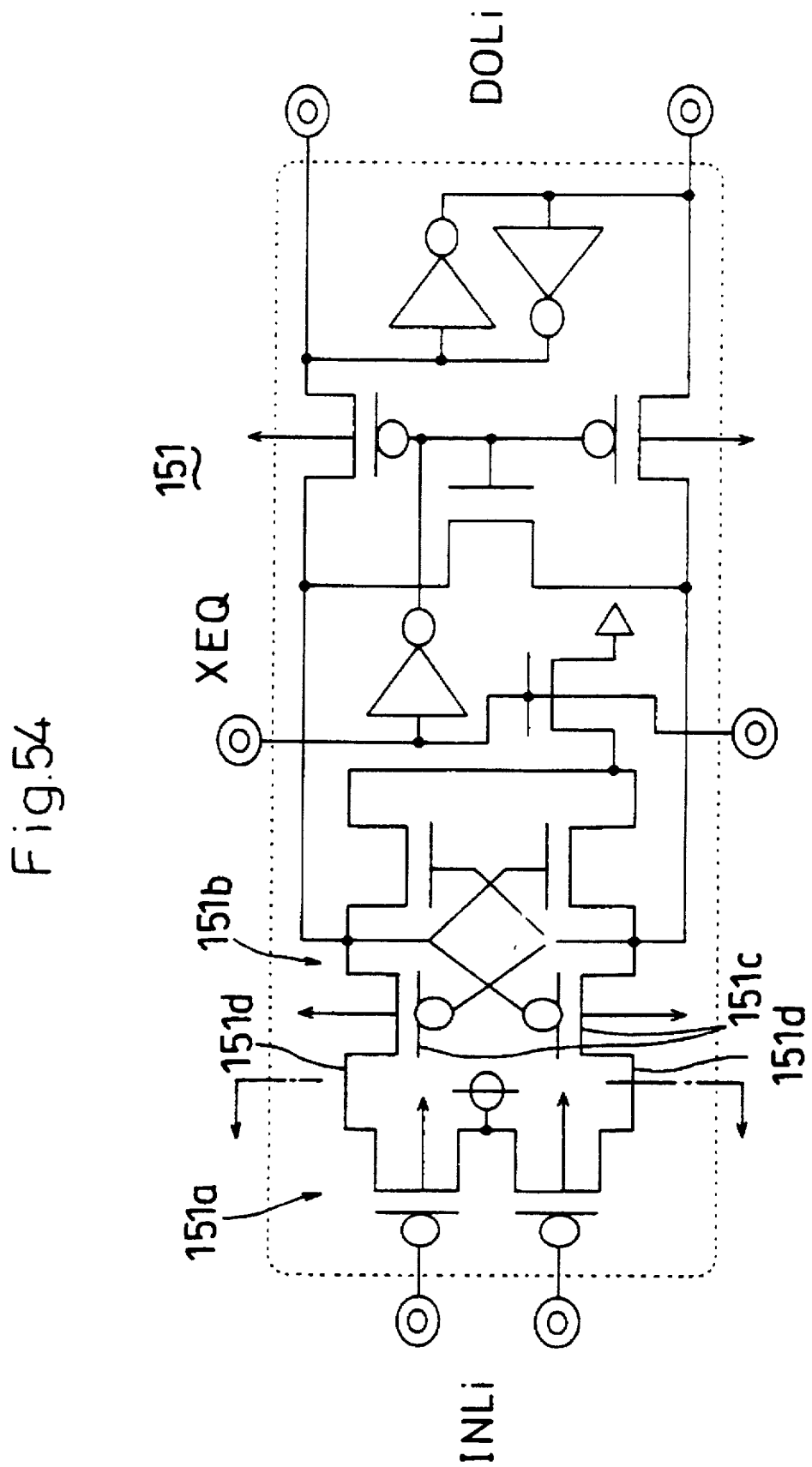
FIG. 54 is a view showing the internal structure of potential detecting circuit composed of a P-type MOSFET.

FIGS. 51 and 52 show a thirteenth embodiment of the present invention. Unlike the above semiconductor integrated circuit of FIG. 25 in which the four level-shifters are disposed in series between the power source and the ground line, eight level-shifters are disposed in series in the semiconductor integrated circuit of the present embodiment, as shown in FIGS. 51 and 52. As described in the above seventh embodiment of FIG. 25, the outputs from the respective level-shifters are different from each other and have eight reference levels in the range from the potential level of the power source to the ground level. In FIG. 52, a reference numeral 150 designates a potential detecting circuit (potential detecting means) composed of an N-type MOSFET to which the pair of output lines of the level-shifter serving as a driver are inputted and a reference numeral 151 designates a potential detecting circuit (potential detecting means) composed of a P-type MOSFET. The above N-type potential detecting circuit 150 has an input gate element 150a composed of an N-type MOSFET, as shown in FIG. 53. The P-type potential detecting circuit 151 has an input gate element 151a composed of an N-type MOSFET, as shown in FIG. 54.

The above potential detecting circuit 150 composed of the N-type MOSFET detects the input level of the precharged potential at the output node of the corresponding level-shifter which ranges from the intermediate potential between the power-source potential Vcc and the ground potential to the power-source potential Vcc. The input level ranging from the above intermediate potential to the ground potential is detected by the potential detecting circuit 151 composed of the P-type MOSFET. The output from the above potential detecting means 150 composed of the N-type MOSFET is connected to the respective source elements 150d of a pair of N-type transistors 150c of a CMOS-type flip-flop 150b. On the other hand, the output from the potential detecting circuit 151 composed of the P-type MOSFET is connected to the respective source elements 151d of a pair of P-type transistors 151c of a CMOS-type flip-flop 151b.

Figure 55:
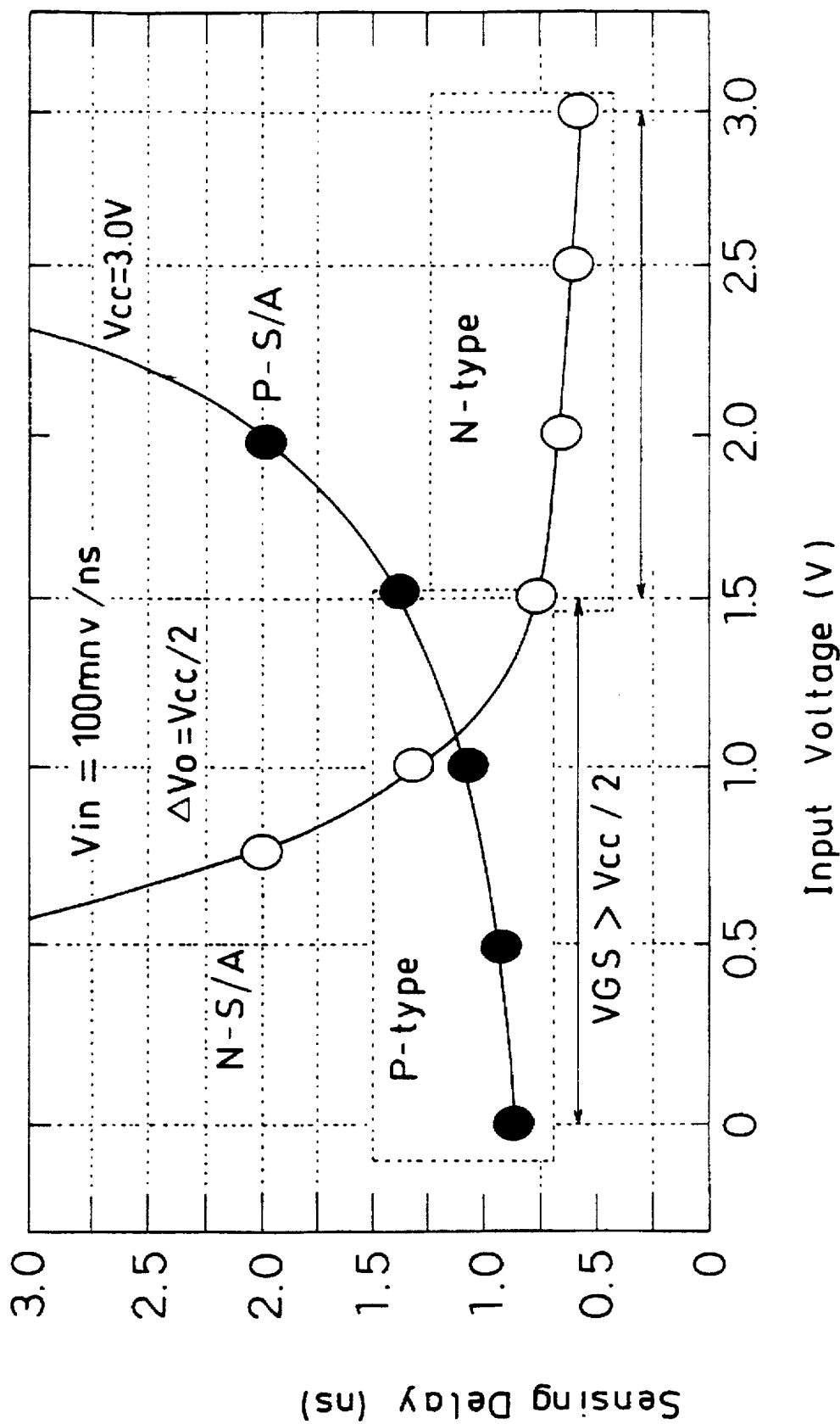
FIG. 55 is a view showing the operation delay characteristics of the N-type MOSFET and P-type MOSFET.

FIG. 55 shows a sensing delay in each of the above potential detecting circuits composed of the N-type MOSFET and the P-type MOSFET with respect to the input voltage. In the potential detecting circuit 150 composed of the N-type MOSFET, the sensing delay does not present a significant change with the input voltage ranging from the power-source voltage Vcc to ½ Vcc. With the input voltage lower than ½ Vcc, however, the sensing delay increases abruptly, since the difference between the input voltage and the threshold voltage of the N-type MOSFET of the input element is reduced and hence the potential detecting circuit 150 composed of the N-type MOSFET is turned ON only incompletely. Conversely, the potential detecting circuit 151 composed of the P-type MOSFET is completely turned ON with the input voltage in the range of ½ Vcc to Vss.

Thus, the present embodiment can provide a potential detecting circuit which exhibits an excellent sensitivity around the output potential (reference level) of the corresponding level-shifter (driver) if used in the range with a reduced sensing delay.

As can be seen from FIGS. 51 and 52, the level-shifter composed of the N-type MOSFET is used with the input potential in the range of Vss to ½ Vcc and the level-shifter composed of the P-type MOSFEt is used with the input potential in the range of ½ Vcc to Vcc, while the potential detecting circuit composed of the N-type MOSFET is used with the input potential in the range of ½ Vcc to Vcc and the potential detecting circuit composed of the P-type MOSFET is used with the input potential in the range of Vss to ½ Vcc, so that a complementary relationship is established therebetween.

We claim:

1. A level-shifter which receives an input signal switching between two different values and shifts the amplitude value of the input signal to another amplitude value so that the resulting signal is outputted from a single output node, the level-shifter comprising:

a first charge supplying means to be precharged to a first potential;

a second charge supplying means to be precharged to a second potential which is different from the first potential; and a discharging means for selecting either one of the first and second charge supplying means in accordance with the input signal and releasing the charge accumulated in the selected charge supplying means to the output node.

2. A complementary-type level-shifter which receives an input signal switching between two different values and shifts the amplitude value of the input signal to another amplitude value so that the resulting signal is outputted from a pair of output nodes, the level-shifter comprising:

a first charge supplying means to be precharged to a first potential;

a second charge supplying means to be precharged to a second potential which is different from the first potential; and a discharging means for releasing the charge accumulated in the first charge supplying means to either one of the pair of output nodes, while releasing the charge accumulated in the second charge supplying means to the other output node, in accordance with the input signal.

3. A complementary-type level-shifter according to claim 2, further comprising:

a precharge circuit for precharging the pair of output nodes to a third potential intermediate between the first potential of the first charge supplying means and the second potential of the second charge supplying means.

4. A control method of a level-shifter according to claim 3, comprising the step of:

precharging, during a first period of one cycle, the pair of output nodes to the third potential by means of the precharge circuit;

precharging, during a second period of the one cycle, the first charge supplying means and the second charge supplying means to the first potential and to the second potential, respectively; and releasing, during a third period after the first and second periods of the one cycle, the charge accumulated in the first and second charge supplying means to the pair of output node by means of the discharging means.

5. A semiconductor integrated circuit, comprising:

a plurality of complementary-type driver circuits each of which receives an input signal switching between two different values and each of which has a pair of complementary output nodes;

two first charge variation equalizing means for respectively equalizing the pair of complementary output nodes in each of two complementary-type driver circuits out of the plural driver circuits; and a second charge variation equalizing means for equalizing an output node which is one of the pair of output nodes of one of the two complementary-type driver circuits and is increased in potential to an output node which is one of the pair of output nodes of the other one of the two complementary-type driver circuits and is decreased in potential.

6. A semiconductor integrated circuit according to claim 5, wherein the plural complementary-type driver circuits are disposed in series between a first power source and a second power source having a potential different from the potential of the first power source.

7. A control method of a semiconductor integrated circuit having at least two complementary-type driver circuits each of which includes a pair of complementary output nodes, and at least two charge accumulating means, comprising the steps of:

during a first period of one cycle, precharging the pair of output nodes in each of the two driver circuits to respective set potentials;

during a second period of the one cycle, charging the two charge accumulating means to a set potential between the precharged potentials of the respective two driver circuits; and during a third period after the first and second periods of the one cycle, connecting one of the charge accumulating means to an output node which shifts to a higher potential in one of the two driver circuits, while connecting the other charge accumulating means to an output node which shifts to a lower potential in the other driver circuits.

8. A control method of a semiconductor integrated circuit according to claim 7, wherein the first period and the second period are coincident with each other.

9. A control method of a semiconductor integrated circuit having a plurality of complementary-type driver circuits each of which includes a pair of complementary output nodes, comprising the steps of:

during a specified period, precharging the pair of output nodes in each of two driver circuits out of the plural driver circuits to set potentials, respectively; and during a period after the specified period, connecting an output node which shifts to a higher potential in one of the two driver circuits to an output node which shifts to a lower potential in the other driver circuit of the two driver circuits.

10. A control method of a semiconductor integrated circuit according to claim 9, wherein outputs from the respective pair of output nodes of the plural complementary-type driver circuits are transferred to the outside as two or more sets of parallel data, and the two or more sets of parallel data are transferred to the outside using their respective voltage ranges obtained by preliminarily dividing a finite potential difference between a first power source and a second power source by a plural number.

11. A semiconductor integrated circuit comprising at least two complementary-type circuits each of which receives a signal and comprises first and second output nodes whose outputs are complementary to each other, wherein each of the two circuits has a high potential side connecting terminal and a low potential side connecting terminal, the high potential side connecting terminal of one of the circuits being connected to the low potential side connecting terminal of the other circuit, each of the circuits is provided with a functional circuit for switching, in accordance with the signal input to the corresponding circuit, between a first state in which the first output node and the second output node are connected to the high potential side connecting terminal and the low potential side connecting terminal, respectively, and a second state in which the first output node and the second output node are connected to the low potential side connecting terminal and the high potential side connecting terminal, respectively.

12. A semiconductor integrated circuit according to claim 11, wherein each of the two circuits comprises a complementary-type level-shifter which shifts an amplitude value of the received signal to obtain a complementary signal of another amplitude value so that the complementary signal is output to the first and second output nodes of each of the two circuits.

13. A semiconductor integrated circuit according to claims 11 or 12, wherein the function circuit corresponding to one of the two circuits connects, when one of the first and second output nodes of one of the two circuits shifts to a higher potential in accordance with the input signal of the corresponding circuit, the one output node shifted to the higher potential to the high potential side connecting terminal, and the function circuit corresponding to the other circuit connects, when one of the first and second output nodes of the other of the two circuits shifts to a lower potential in accordance with the input signal of the corresponding circuit, the one output node shifted to the lower potential to the low potential side connecting terminal.

14. A semiconductor integrated circuit according to claims 11 or 12, wherein the low potential side connecting terminal of one of the two circuits is connected to the high potential side connecting terminal of a different complementary-type circuit other than the two circuits, and the high potential side connecting terminal of the other circuit of the two circuits is connected to the low potential side connecting terminal of a further different complementary-type circuit other than the two circuit and the different circuit.

15. A semiconductor integrated circuit according to claims 11 or 12, wherein the low potential side connecting terminal of one of the two circuits is connected to a low voltage source, and the high potential side connecting terminal of the other one of the two circuits is connected to a high voltage source.

16. A semiconductor integrated circuit according to claims 11 or 12, wherein each circuit is provided with an equalizing circuit which receives an equalization signal and equalizes the first and second output nodes of the corresponding circuit when the equalization signal is received.

17. A control method of a semiconductor integrated circuit having at least two complementary-type circuits which receives a signal and comprises first and second output nodes whose outputs are complementary to each other, comprising the steps of:

inputting a signal to each of the two complementary-type circuits, and switching, in accordance with the signals input to the two circuits, between a first state in which the first and second output nodes of one of the two complementary-type circuits are connected to the first and second output nodes, respectively, of the other complementary-type circuit, and a second state in which the first and second output nodes of one of the two complementary-type circuits are connected to the second and first output nodes, respectively, of the other complementary-type circuit.

18. A control method of a semiconductor integrated circuit according to claim 17, wherein each of the two circuits comprises a complementary-type level-shifter which shift an amplitude value of the received signal to obtain a complementary signal of another amplitude value so that the complementary signal is output from the first and second output nodes of each of the two circuits.

19. A control method of a semiconductor integrated circuit according to claims 17 or 18, wherein in the connection switching step, when a potential of one of the first and second output nodes of one of the circuits is controlled to a higher potential and a potential of one of the first and second output nodes of the other circuit is controlled to a lower potential in accordance with the signals input to the two circuits, the output node which shifts to the higher potential in the one circuit is connected to the output node which shifts to the lower potential in the other circuit.

20. A control method of a semiconductor integrated circuit according to claim 19, wherein in the connection switching step, when a potential of the other one of the first and second output nodes of the one of the circuits is controlled to the lower potential and a potential of the other one of the first and second output nodes of the other circuit is controlled to the higher potential in accordance with the signals input to the two circuits, the output node which shifts to the lower potential in the one circuit is connected to the output node which shifts to the higher potential in a first complementary-type circuit other than the two circuits while the output node which shifts to the higher potential in the other circuit is connected to the output node which shifts to the lower potential in a second complementary-type circuit.

21. A control method of a semiconductor integrated circuit according to claim 19, wherein in the connection switching step, when a potential of the other one of the first and second output nodes of one of the circuits is controlled to the lower potential and a potential of the other one of the first and second output nodes of the other circuit is controlled to the higher potential in accordance with the signals input to the two circuits, the output node of the one circuit which shifts to the lower potential is connected to a low voltage source while the output node of the other circuit which shifts to the higher potential is connected to a high voltage source.

22. A control method of a semiconductor integrated circuit according to claims 17 or 18, further comprising the step of equalizing the first and second output nodes of each of the circuits upon equalization request other than that for controlling the respective potentials of the first and second output nodes of each circuit in accordance with the input signal.

* * * * *